United States Patent
Song et al.

(10) Patent No.: US 10,411,083 B2
(45) Date of Patent: Sep. 10, 2019

(54) DISPLAY DEVICE

(71) Applicant: SAMSUNG DISPLAY CO., LTD., Yongin-si, Gyeonggi-do (KR)

(72) Inventors: Hee Rim Song, Yongin-si (KR); Kyung Hoon Kim, Yongin-si (KR); Mee Hye Jung, Yongin-si (KR); Min Jae Jeong, Yongin-si (KR); Seon Young Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/111,908

(22) Filed: Aug. 24, 2018

(65) Prior Publication Data

US 2019/0103455 A1    Apr. 4, 2019

(30) Foreign Application Priority Data

Sep. 29, 2017    (KR) ........................ 10-2017-0127882

(51) Int. Cl.
     *H01L 27/32*      (2006.01)
     *G09G 3/3225*      (2016.01)
     (Continued)

(52) U.S. Cl.
     CPC ....... *H01L 27/3276* (2013.01); *G09G 3/3225* (2013.01); *H01L 27/124* (2013.01);
     (Continued)

(58) Field of Classification Search
     CPC ............. H01L 27/3276; H01L 27/3265; H01L 27/323; H01L 27/3262; H01L 27/3279;
     (Continued)

(56) References Cited

U.S. PATENT DOCUMENTS

| 7,205,572 B2 | 4/2007 | Suh |
| 2003/0085405 A1 | 5/2003 | Park |
| (Continued) | | |

FOREIGN PATENT DOCUMENTS

| EP | 3144768 A1 | 8/2016 |
| JP | 201588275 A | 5/2015 |
| (Continued) | | |

OTHER PUBLICATIONS

Partial European Search Report for Application No. 18197484.1 dated Feb. 8, 2019.

(Continued)

*Primary Examiner* — Anthony Ho
(74) *Attorney, Agent, or Firm* — Cantor Colburn LLP

(57) ABSTRACT

A display device includes a substrate including a first display region, a second display region having an area smaller than that of the first display region, a third display region having an area smaller than that of the first display region, and a non-display region, a plurality of pixels provided in the first to third display regions, a power line which is connected to each of the plurality of pixels and applies a first power voltage to the plurality of pixels, and a fan-out line provided in the non-display region, the fan-out line applying a data signal to the plurality of pixels, where the power line includes an additional power line, a first power line, and disposed on the additional power line, and a second power line disposed on the first power line.

35 Claims, 30 Drawing Sheets

(51) Int. Cl.
*H01L 27/12* (2006.01)
*G09G 3/3266* (2016.01)
*G09G 3/3275* (2016.01)

(52) U.S. Cl.
CPC ........ *H01L 27/323* (2013.01); *H01L 27/3262* (2013.01); *H01L 27/3265* (2013.01); *H01L 27/3279* (2013.01); *G09G 3/3266* (2013.01); *G09G 3/3275* (2013.01); *G09G 2300/0426* (2013.01); *G09G 2300/0809* (2013.01); *G09G 2310/08* (2013.01); *G09G 2320/0223* (2013.01)

(58) Field of Classification Search
CPC .. H01L 27/124; G09G 3/3225; G09G 3/3275; G09G 2300/0809; G09G 2310/08; G09G 3/3266; G09G 2320/0223; G09G 2300/0426
See application file for complete search history.

(56) References Cited

U.S. PATENT DOCUMENTS

| | | |
|---|---|---|
| 2008/0197354 A1 | 8/2008 | Cho et al. |
| 2008/0203391 A1 | 8/2008 | Kim et al. |
| 2009/0189835 A1 | 7/2009 | Kim et al. |
| 2010/0025690 A1 | 2/2010 | Kim et al. |
| 2010/0156945 A1 | 6/2010 | Yoshida |
| 2011/0157110 A1 | 6/2011 | Chou et al. |
| 2012/0001885 A1 | 1/2012 | Kang et al. |
| 2012/0313905 A1 | 12/2012 | Kang et al. |
| 2013/0321251 A1 | 12/2013 | Kang et al. |
| 2014/0022230 A1 | 1/2014 | Hasumi et al. |
| 2014/0117320 A1 | 5/2014 | Jung |
| 2014/0139771 A1 | 5/2014 | Choi |
| 2014/0145153 A1 | 5/2014 | Kim et al. |
| 2015/0340648 A1 | 11/2015 | Jang |
| 2016/0118452 A1 | 4/2016 | Pyon |
| 2016/0126303 A1 | 5/2016 | Kwon et al. |
| 2016/0190166 A1 | 6/2016 | Kim et al. |
| 2016/0343777 A1 | 11/2016 | Hirakata et al. |
| 2016/0358938 A1 | 12/2016 | Lee et al. |
| 2017/0025070 A1 | 1/2017 | Kang et al. |
| 2017/0154945 A1 | 6/2017 | Shin et al. |
| 2017/0219895 A1 | 8/2017 | Yu et al. |
| 2017/0249905 A1 | 8/2017 | Kim et al. |
| 2017/0262109 A1 | 9/2017 | Choi et al. |

FOREIGN PATENT DOCUMENTS

| | | |
|---|---|---|
| KR | 100570977 B1 | 4/2006 |
| KR | 100708686 B1 | 4/2007 |
| KR | 1020100049385 A | 5/2010 |
| KR | 1020120006214 A | 1/2012 |
| KR | 101452288 B1 | 10/2014 |
| KR | 1020150135724 A | 12/2015 |
| WO | 2017127563 A1 | 7/2017 |

OTHER PUBLICATIONS

Extended European Search Report for Application No. 18197484.1 dated Jul. 8, 2019, citing the above reference(s).

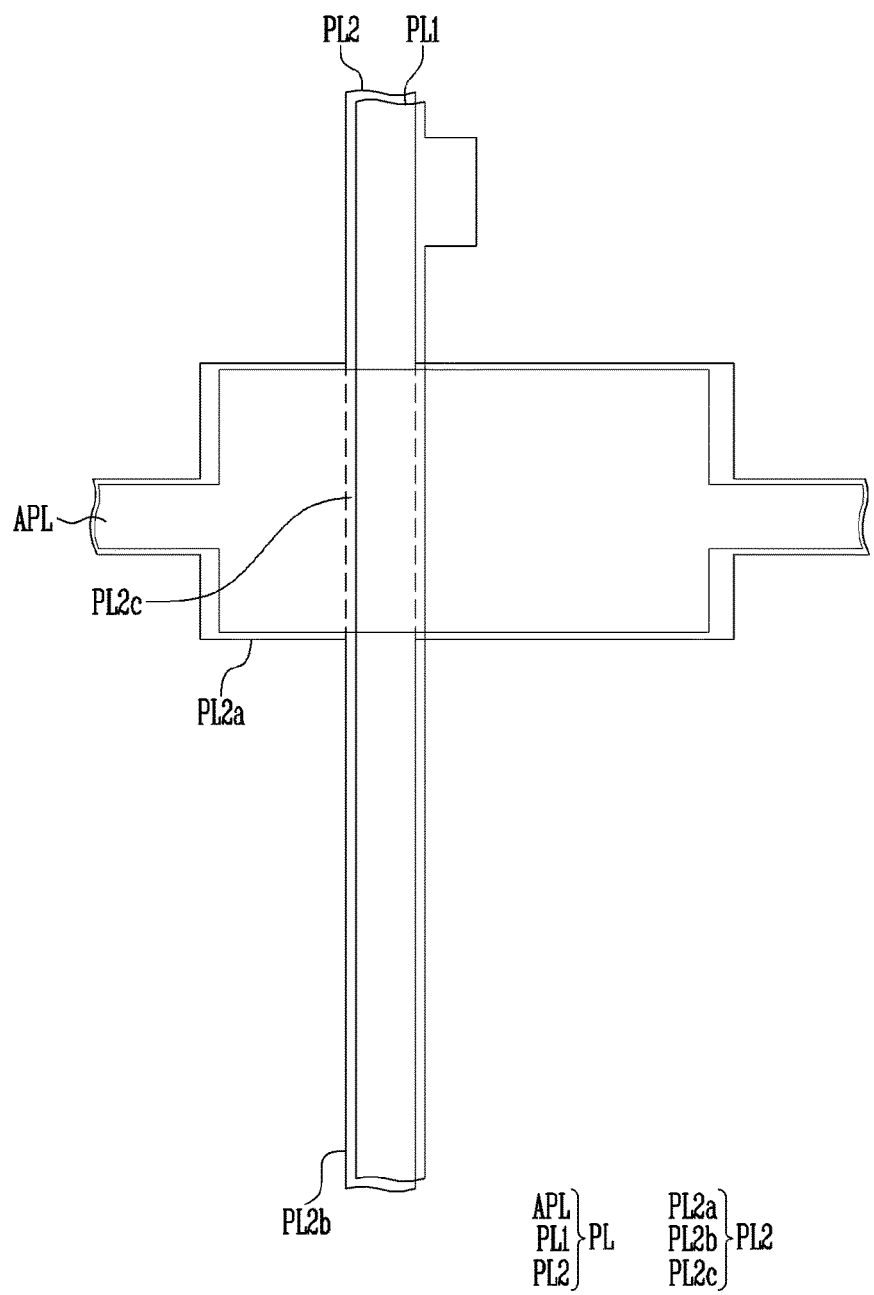

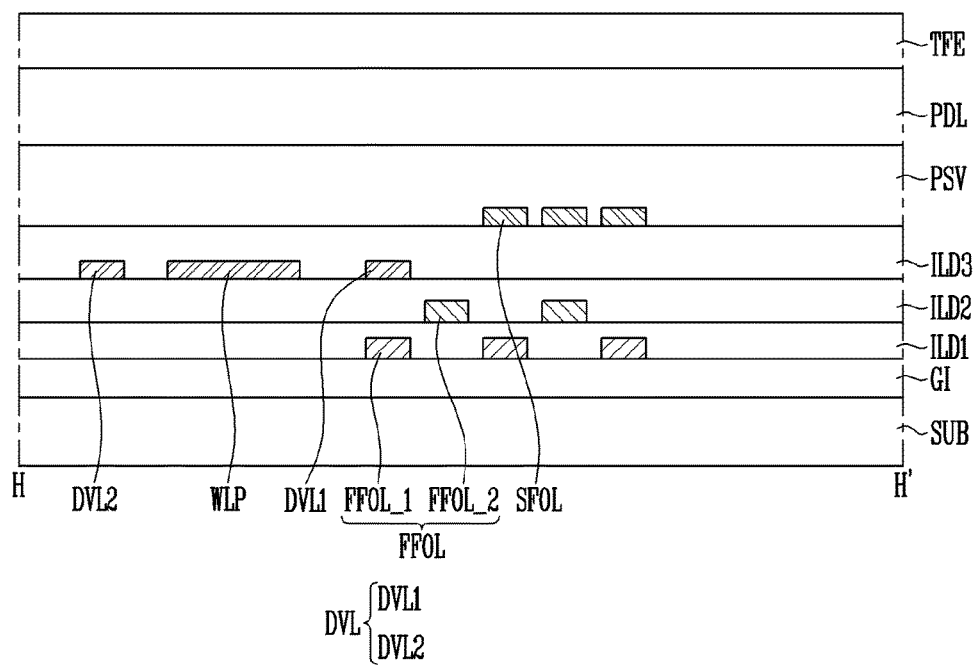

DISPLAY DEVICE

The application claims priority to Korean Patent Application No. 10-2017-0127882, filed on Sep. 29, 2017, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

In general, a display device may include a display region that displays an image and a non-display region that surrounds at least one side of the display region.

Recently, as interest in information displays and demand for portable information media increase, research and commercialization has centered on display devices. In particular, as demand for maximally securing an area of a display device by reducing a bezel corresponding to the non-display region of the display device increases, various researches for minimizing the non-display region have been conducted.

SUMMARY

Exemplary embodiments of the invention provide a display device capable of minimizing the area of a non-display region.

Exemplary embodiments of the invention also provide a display device capable of improving image quality.

According to an exemplary embodiment of the invention, there is provided a display device including a substrate including a first display region, a second display region extended from a first side of first the display region, the second display region having an area smaller than that of the first display region, a third display region extended from the a second side of the first display region, the third display region having an area smaller than that of the first display region, and a non-display region, a plurality of pixels provided in the first to third display regions, a power line connected to each of the plurality of pixel, the power line applying a first power voltage to the plurality of pixels, and a fan-out line provided in the non-display region, the fan-out line applying a data signal to the plurality of pixels, where the power line includes an additional power line extending in a first direction, a first power line extending in a second direction intersecting the first direction, the first power line being disposed on the additional power line with a first insulating layer interposed therebetween, and a second power line disposed on the first power line with a second insulating layer interposed therebetween.

In an exemplary embodiment, the additional power line and the first and second power lines may be electrically connected to each other.

In an exemplary embodiment, in a plan view, the second power line may include a first part overlapping with the additional power line and a second part overlapping with the first power line. The second power line further includes a third part in which the first part and the second part overlap.

In an exemplary embodiment, the first display region includes a (1-1)th display region, and a (1-2)th display region which is disposed between the (1-1)th display region and the third display region. The (1-2)th display region may include a first region provided with pixels of the plurality of pixels arranged on the same pixel column as the pixels of the (1-1)th display region; and a second region provided with pixels of the plurality of pixels arranged on the same pixel column as the pixels of the plurality of pixels of the (1-1)th display region and the third display region, except the first region.

In an exemplary embodiment, the first region of the (1-2)th display region may be a corner portion having a round shape of which a width decreases as it becomes farther from the (1-1)th display region along the second direction.

In an exemplary embodiment, the fan-out line may include a first fan-out line which applies the data signal to the pixels provided in the second display region, a second fan-out line which applies the data signal to the pixels provided in the first region of the (1-2)th display region, and a third fan-out line applying the data signal to the pixels provided in the third display region. The third fan-out line may also apply the data signal to pixels of the first display region, which are disposed on the same pixel column as pixels provided in the third display region.

In an exemplary embodiment, the first fan-out line may include a (1-1)th fan-out line and a (1-2)th fan-out line, which are provided in layers different from each other on the substrate. The (1-1)th fan-out line and the (1-2)th fan-out line may be alternately disposed.

In an exemplary embodiment, in a plan view, the first to third fan-out lines may be spaced apart from each other on the substrate.

In an exemplary embodiment, the first to third fan-out lines may be disposed in layers different from one another. The second fan-out line may be disposed on the first fan-out line with the first and second insulating layers interposed therebetween. In a plan view, the first fan-out line and the second fan-out line may overlap with each other.

In an exemplary embodiment, the display device may further include a first driving voltage line which is provided in the non-display region and applies the first power source to the power line, and a second driving voltage line which is provided in the non-display region and applies a second power voltage to each of the plurality of pixels.

In an exemplary embodiment, the first driving voltage line may be disposed in the non-display region surrounding one side of the third display region.

In an exemplary embodiment, the first driving voltage line may be disposed in the non-display region to surround one side of the second display region, one side of the third display region, and one side of the (1-2)th display region. In the plan view, the first driving voltage line may overlap with the first fan-out line.

In an exemplary embodiment, the second driving voltage line may be provided in a double-layered structure including a first metal layer and a second metal layer disposed on the first metal layer with the second insulating layer interposed therebetween. In the plan view, the first metal layer and the second metal layer may completely overlap with each other.

In an exemplary embodiment, the display device may further include a driving unit which is provided between the second driving voltage line and the first fan-out line in the non-display region in a plan view, and provides a driving signal for driving the plurality of pixels. The driving unit may include a circuit driver and a signal line unit connected to the circuit driver.

In an exemplary embodiment, in the plan view, a first portion of the first fan-out line may overlap with the second fan-out line, a second portion of the first fan-out line may overlap with the second driving voltage line, and a third portion of the first fan-out line may overlap with the signal line unit.

In an exemplary embodiment, in a plan view, a portion of the first fan-out line may overlap with the second fan-out line, and the other portion of the first fan-out line may overlap with the second driving voltage line. The second driving voltage line may be disposed on the first fan-out line with the first insulating layer interposed therebetween, and the second fan-out line may be disposed on the second driving voltage line with the second insulating layer interposed therebetween. The second driving voltage line may be provided in a single-layered structure.

In an exemplary embodiment, the display device may further include a scan line extending in the first direction and connected to each of the plurality of pixels, data lines extending in the second direction and connected to each of the plurality pixels, and a contact line which extends from the non-display region to the first display region and the second region of the (1-2)th display region along the second direction, and is disposed between the first power line and the second power line. The contact line extending to the second region of the (1-2)th display region may be bent in the first direction to be electrically connected to a data line of the data lines which corresponds to a pixel of the pixels provided in the first region, and the contact line extending to the first display region may be bent in the first direction to be electrically connected to a data line of the data lines which corresponds to a pixel of the pixels provided in the second display region In an exemplary embodiment, the data lines may be disposed in the same layer as the third fan-out line. The data lines and the third fan-out line may be unitary with and be electrically connected to each other.

In an exemplary embodiment, each of the second and third display regions may have a shape of which a width decreases as it becomes farther from the first display region along the second direction. The first to third fan-out lines may be provided in the same layer.

In an exemplary embodiment, each of the plurality of pixels may include at least one transistor disposed on the substrate, and a light emitting element connected to the transistor to emit light. The at least one transistor may include an active pattern disposed on the substrate, a gate electrode disposed on the active pattern with a gate insulating layer interposed therebetween, and a source electrode and a drain electrode, each connected to the active pattern.

In an exemplary embodiment, the light emitting element may include a first electrode connected to the at least one transistor, an emitting layer disposed on the first electrode, and a second electrode disposed on the emitting layer.

In an exemplary embodiment, the display device may further include a bridge pattern disposed between the at least one transistor and the first electrode, the bridge pattern electrically connecting the at least one transistor to the light emitting element. The bridge pattern may be disposed in the same layer as the second power line.

In an exemplary embodiment, in a plan view, the second power line may not overlap with the bridge pattern. The second power line may have a plate shape.

In an exemplary embodiment, each of the second and third regions may be foldable toward the outside of the first display region along a folding line on the substrate.

BRIEF DESCRIPTION OF THE DRAWINGS

Exemplary embodiments will now be described more fully hereinafter with reference to the accompanying drawings, in which:

FIG. 4B is a plan view illustrating only a power line in the pixel of FIG. 4A.

FIG. 9B is a cross-sectional view taken along line H-H' of FIG. 9A.

DETAILED DESCRIPTION

Figure 1:
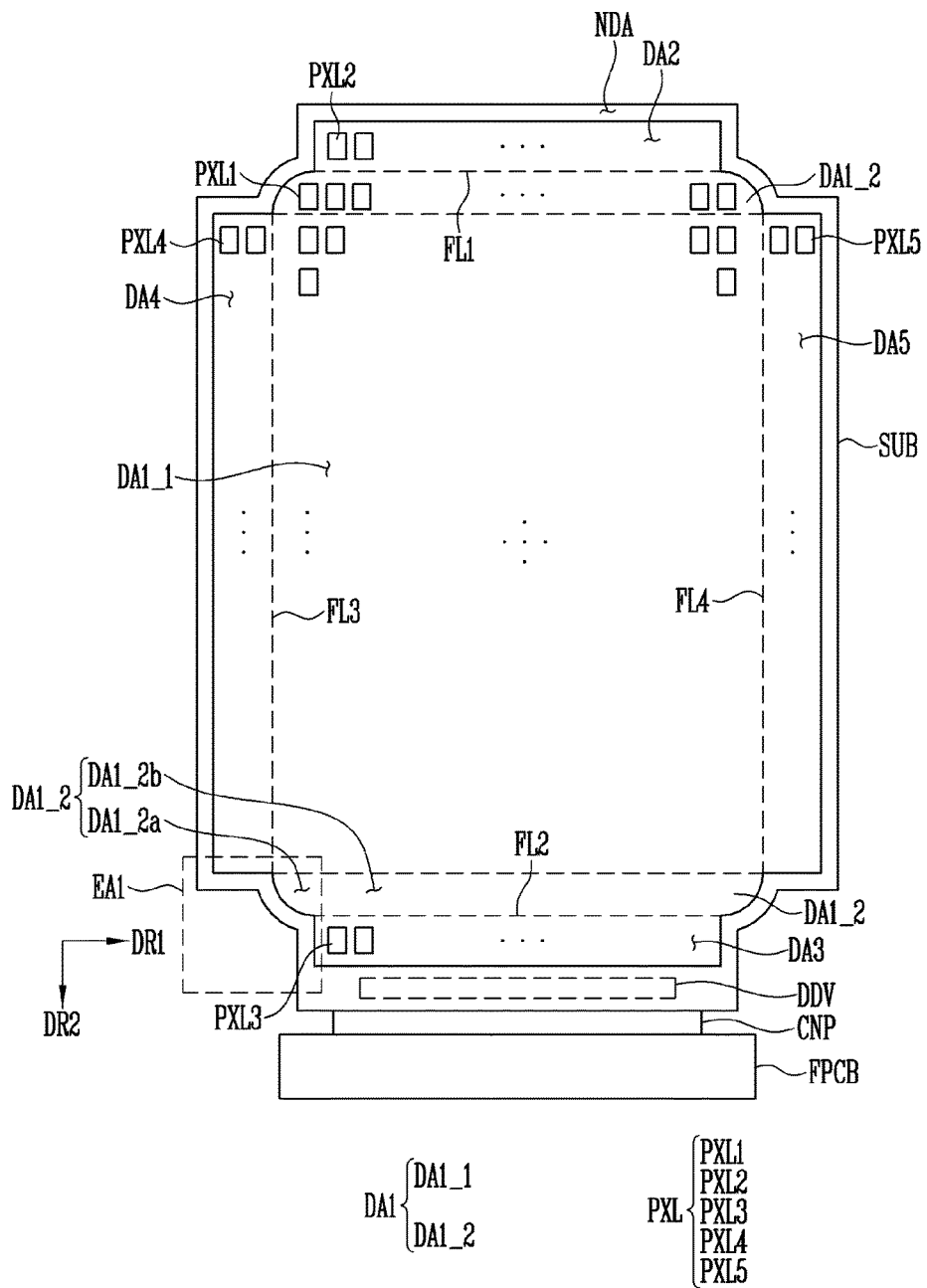
FIG. 1 is a plan view illustrating an exemplary embodiment of a display device according to the invention.

The disclosure may apply various changes and different shape, therefore only illustrate in details with particular examples. However, the examples do not limit to certain shapes but apply to all the change and equivalent material and replacement. The drawings included are illustrated a fashion where the drawing figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of the invention will be described in detail with reference to the accompanying drawings.

FIG. 1 is a plan view illustrating a display device according to an exemplary embodiment of the invention.

Referring to FIG. 1, the display device according to the exemplary embodiment of the invention may include a substrate SUB, pixels PXL provided on the substrate SUB, a driving unit that is provided on the substrate SUB and drives the pixels PXL, a power supply unit that supplies a power source to the pixels PXL, and a line unit (not shown) that allows the pixels PXL and the driving unit to be connected to each other.

In an exemplary embodiment, the substrate SUB may have an approximately rectangular shape, for example. In an exemplary embodiment of the invention, the substrate SUB may include a pair of short sides parallel to each other in a first direction DR1 and a pair of long sides parallel to each other in a second direction DR2. However, the shape of the substrate SUB is not limited thereto, and the substrate SUB may have various shapes. In an exemplary embodiment, the substrate SUB may have a closed polygonal shape including linear sides, for example. In an exemplary embodiment, the substrate SUB may also have shapes such as a circle and an ellipse, including curved sides. In an exemplary embodiment, the substrate SUB may also have shapes such as a semicircle and a semi-ellipse, including linear and curved sides.

In an exemplary embodiment of the invention, when the substrate SUB has linear sides, at least some of corners of each of the shapes may be provided in a curve. In an exemplary embodiment, when the substrate SUB has a rectangular shape, for example, a portion at which adjacent linear sides meet each other may be replaced with a curve having a predetermined curvature.

When the substrate SUB includes a plurality of regions, each region may have various shapes such as a closed polygon including linear sides, a circle and an ellipse, including curved sides, and a semicircle and a semi-ellipse, including linear and curved sides. In some exemplary embodiments, the substrate SUB may include a plurality of regions protruding in a first direction DR1 and a plurality of regions protruding in a second direction DR2 intersecting the first direction DR1. The regions may surround a central region of the substrate SUB. Each of the regions may have a rectangular shape, and a connecting portion connecting the regions may have a curvature. In addition, the substrate SUB may have a rectangular shape in which an edge enters the central region of the substrate SUB.

The substrate SUB may include a display region in which an image is displayed and a non-display region NDA provided at at least one side of the display region. The display region may be provided in a shape corresponding to the substrate SUB.

The display region may be provided in plural. Specifically, in a plan view, the display region may include a first display region DA1 that occupies the largest area, a second display region DA2 and a third display region DA3 extending in the second direction DR2 of the first display region DA1, a fourth display region DA4 and a fifth display region DA5 extending in the first direction DR1 of the first display region DA1.

Each of the first display region DA1, the second display region DA2, the third display region DA3, the fourth display region DA4, and the fifth display region DA5 may have various shapes. In an exemplary embodiment, each of the first display region DA1, the second display region DA2, the third display region DA3, the fourth display region DA4, and the fifth display region DA5 may be provided in various shapes such as a closed polygon including linear sides, a circle and an ellipse, including curved sides, and a semi-circle and a semi-ellipse, including linear and curved sides, for example.

The first display region DA1 may be provided in a rectangular plate shape having two pairs of sides parallel to each other. In this case, any one pair of sides among the two pairs of sides may be provided longer than the other pair of sides. In an exemplary embodiment of the invention, the first display region DA1 may include a (1-1)th display region DA1_1 and a (1-2)th display region DA1_2. The (1-1)th display region DA1_1 may have a rectangular shape having a pair of long sides and a pair of short sides. The (1-2)th display region DA1_2 may have a polygonal shape including a first region DA1_2a including a curved line connecting adjacent linear sides, e.g., a second folding line FL2 and a third folding line FL3 and a second region DA1_2b except the first region DA1_2a. In an exemplary embodiment of the invention, the first region DA1_2a may be a corner portion of the (1-2)th display region DA1_2. In FIG. 1, the extending direction of the short side is specified as the first direction DR1, and the extending direction of the long side is specified as the second direction DR2.

The (1-2)th display region DA1_2 may be disposed at both sides of the (1-1)th display region DA1_1, which are opposite to each other. The (1-2)th display region DA1_2 may have a shape of which a width decreases as it becomes farther from the (1-1)th display region DA1_1. In an exemplary embodiment of the invention, the (1-2)th display region DA1_2 may have a shape of which a width decreases as it becomes farther from the (1-1)th display region DA1_1, but the invention is not limited thereto. In an exemplary embodiment, the (1-2)th display region DA1_2 may have a trapezoidal shape due to corner portions including inclined linear sides or have a step shape due to corner portions having stepped portions, for example.

The second display region DA2 may be provided in a shape that is connected to the (1-2)th display region DA1_2 and protrudes from the (1-2)th display region DA1_2. The second display region DA2 may be provided in a shape corresponding to that of the first display region DA1, but the invention is not limited thereto. The second display region DA2 may be a display region that is foldable toward the outside of the first display region DA1 along a first folding line FL1. Here, the first folding line FL1 may be provided at a boundary portion between the (1-2)th display region DA1_2 and the second display region DA2.

The third display region DA3 may be provided in a shape that is connected to the (1-2)th display region DA1_2 and protrudes from the (1-2)th display region DA1_2. In a plan view, the third display region DA3 may be opposite to the second display region DA2 with the first display region DA1 interposed therebetween in the second direction DR2. The third display region DA3 may be provided in a shape corresponding to that of the first display region DA1, but the invention is not limited thereto. Also, the third display region DA3 may be a display region that is foldable toward the outside of the first display region DA1 along the second folding line FL2.

The fourth display region DA4 may be provided in a shape that is connected to the (1-1)th display region DA1_1 and protrudes from the (1-1)th display region DA1_1. The fourth display region DA4 may be provided in a shape corresponding to that of the first display region DA1, but the invention is not limited thereto. The fourth display region DA4 may be a display region that is foldable toward the outside of the first display region DA1 along the third folding line FL3.

The fifth display region DA5 may be provided in a shape that is connected to the (1-1)th display region DA1_1 and protrudes from the (1-1)th display region DA1_1. In a plan view, the fifth display region DA5 may be opposite to the fourth display region DA4 with the first display region DA1 interposed therebetween in the first direction DR1. The fifth display region DA5 may be provided in a shape corresponding to that of the first display region DA1, but the invention is not limited thereto. Also, the fifth display region DA5 may be a display region that is foldable toward the outside of the first display region DA1 along a fourth folding lien FL4.

The plurality of pixels PXL may be provided in the first display region DA1, the second display region DA2, the third display region DA3, the fourth display region DA4, and fifth display region DA5. Each pixel PXL may be any one of a red pixel, a green pixel, a blue pixel, and a white pixel, but the invention is not limited thereto. In an exemplary embodiment, each pixel PXL may be any one of a magenta pixel, a cyan pixel, and a yellow pixel, for example. Each pixel PXL may include a display element that emits light for display an image. The display element may be a light emitting element including an organic emitting layer. However, the invention is not limited thereto, and the display element may be implemented in various forms such as a liquid crystal device, an electrophoretic device, and an electrowetting device. In an exemplary embodiment of the invention, the pixels PXL may be light emitting elements.

The pixels PXL disposed in each of the first display region DA1, the second display region DA2, the third display region DA3, the fourth display region DA4, and the fifth display region DA5 may be arranged in a matrix form along rows extending in the first direction DR1 and columns extending in the second direction DR2. However, the arrangement form of the pixels PXL is not particularly limited, and the pixels PXL may be arranged in various forms.

In an exemplary embodiment of the invention, the plurality of pixels PXL may include first to fifth pixels PXL1 to PXL5. The first pixel PXL1 may be disposed in the first display region DA1, the second pixel PXL2 may be disposed in the second display region DA2, the third pixel PXL3 may be disposed in the third display region DA3, the fourth pixel PXL4 may be disposed in the fourth display region DA4, and the fifth pixel PXL5 may be disposed in the fifth display region DA5. The first to fifth pixels PXL1 to PXL5 may be provided in the same structure.

In an exemplary embodiment of the invention, the second to fifth display regions DA2 to DA5 may have an area smaller than that of the first display region DA1. In addition, the second display region DA2 and the third display region DA3 may have the same area with each other, but the invention is not limited thereto. In addition, the fourth display region DA4 and the fifth display region DA5 may have the same area with each other, but the invention is not limited thereto.

The non-display region NDA is a region in which the pixels PXL are not provided, and may be a region in which the image is not displayed. The non-display region NDA may be provided with a data driver DDV for driving the pixels PXL, first and second driving voltage lines (not shown) that receive a driving voltage provided from the power supply unit, and a line unit (not shown) that allows the pixels PXL and the driving unit to be connected to each other. The non-display region NDA corresponds to a bezel in a final display device, and the width of the bezel may be determined according to the width of the non-display region NDA.

The line unit may include fan-out lines that provide a data signal to each pixel PXL from the data driver DDV.

The data driver DDV may provide the data signal to each of the pixels PXL disposed in the first display region DA1, the second display region DA2, the third display region DA3, the fourth display region DA4, and the fifth display region DA5 through the fan-out lines. In an exemplary embodiment, the data driver DDV may be disposed along the first direction DR1 in the non-display region NDA, for example, but the data driver DDV is not limited thereto.

For convenience of description, a scan driver, an emission driver, and the like are not illustrated in FIG. 1, but the scan driver, the emission driver, and the like may be provided in the non-display region NDA. In this case, a plurality of line units (not shown) respectively connected to the scan driver and the emission driver may be disposed in the non-display region NDA.

In an exemplary embodiment of the invention, the display device may further include a flexible printed circuit board FPCB attached to one side of the non-display region NDA through a connection part CNP. In an exemplary embodiment, the connection part CNP may be a chip on film ("COF"), for example.

The flexible printed circuit board FPCB may be disposed in a region in which any image is not displayed in the display device. In order to hide a component unnecessary to be viewed by a user, the flexible printed circuit board FPCB may be unitary with the connection part CNP. A timing controller (not shown) for controlling the data driver DDV, the scan driver, and the emission driver, a touch driver (not shown) for sensing a touch of a user, the power supply unit, and the like may be disposed (e.g., mounted) on the flexible printed circuit board FPCB.

Figure 2:
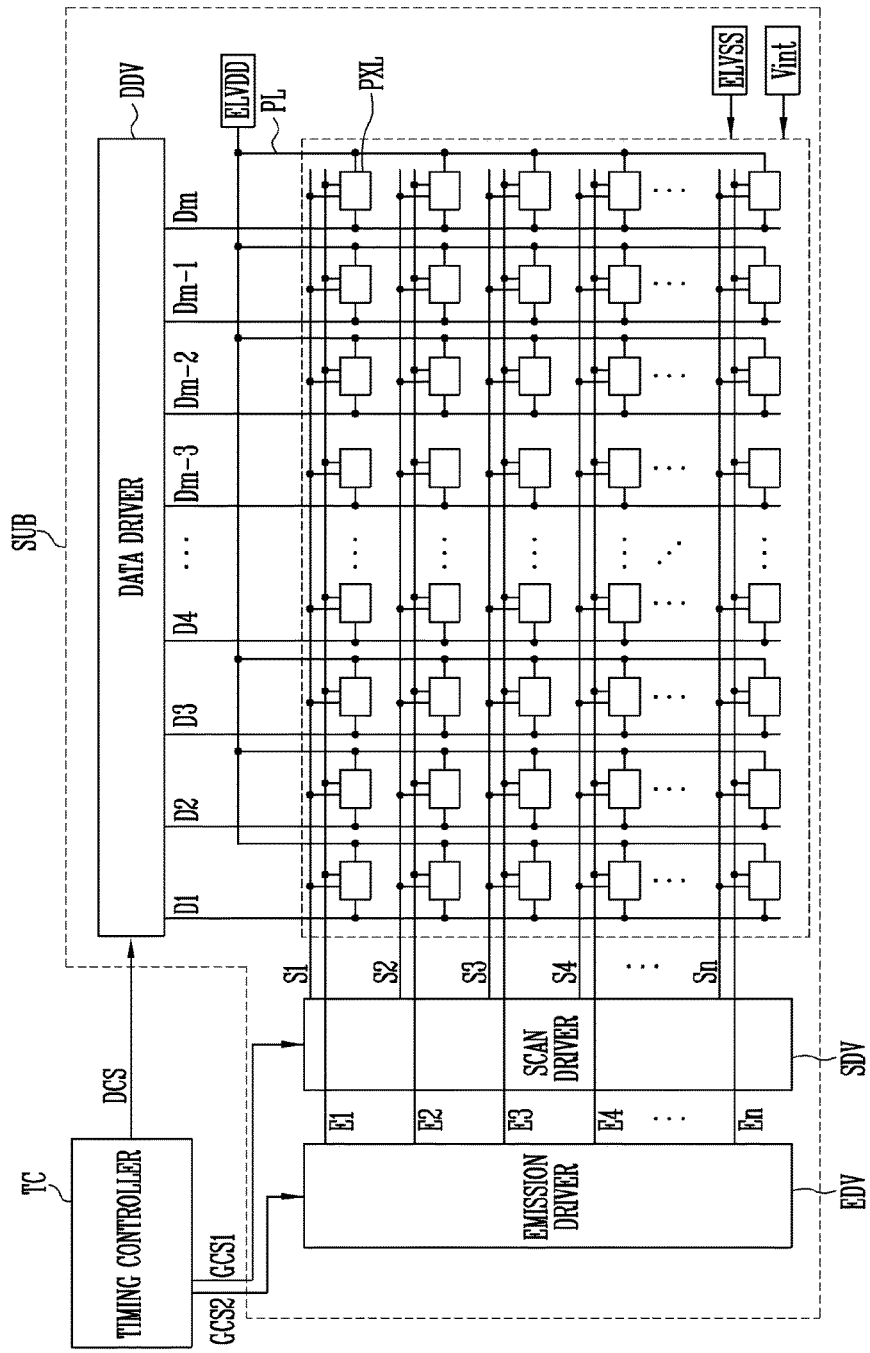
FIG. 2 is a block diagram illustrating an exemplary embodiment of pixels and a driving unit in the display device of FIG. 1.

FIG. 2 is a block diagram illustrating an exemplary embodiment of the pixels and the driving unit in the display device of FIG. 1.

Referring to FIGS. 1 and 2, the display device according to the exemplary embodiment of the invention may include pixels PXL, a driving unit, and a line unit.

The pixels PXL may be provided in plural. The drive unit may include a scan driver SDV, an emission driver EDV, a data driver DDV, and a timing controller TC. In FIG. 2, positions of the scan driver SDV, the emission driver EDV, the data driver DDV, and the timing controller TC are set for convenience of description. When an actual display device is implemented, the scan driver SDV, the emission driver EDV, the data driver DDV, and the timing controller TC may be disposed at other positions in the display device.

The line unit may include scan lines, data lines, emission control lines, a power line PL, and an initialization power line (not shown), which are disposed in the display region to provide signals from the drive unit to each pixel PXL. The scan lines may include a plurality of scan lines S1 to Sn, the emission control lines may include a plurality of emission control lines E1 to En, and the data lines may include a plurality of data lines D1 to Dm where n and m are natural numbers.

The pixels PXL may be provided in the first display region DA1, the second display region DA2, the third display region DA3, the fourth display region DA4, and the fifth display region DA5. When a scan signal is supplied from a scan line corresponding to each pixel PXL, the pixel PXL may be supplied with a data signal from a data line. The pixel PXL supplied with the data signal may control an amount of current flowing to a light emitting element (not shown) to drive the light emitting element.

The scan driver SDV may supply the scan signal to the scan lines S1 to Sn in response to a first gate control signal GCS1 from the timing controller TC. In an exemplary embodiment, the scan driver SDV may sequentially supply the scan signal to the scan lines S1 to Sn, for example. When the scan signal is sequentially supplied to the scan lines S1 to Sn, the pixels PXL may be sequentially selected in units of horizontal lines.

The emission driver EDV may supply the emission control signal to the emission control lines E1 to En in response to a second gate control signal GCS2 from the timing controller TC. In an exemplary embodiment, the emission driver EDV may sequentially supply the emission control signal to the emission control lines E1 to En, for example.

Here, the emission control signal may be set to a width wider than that of the scan signal. In an exemplary embodiment, an emission control signal supplied to an ith (i is a natural number) emission control line Ei may be supplied to overlap with a scan signal supplied to an (i−1)th scan line Si−1 and a scan signal supplied to an ith scan line Si during a partial period, for example. Additionally, the emission control signal may be set to a gate-off voltage (e.g., a high voltage) such that transistors included in the pixels PXL may be turned off, and the scan signal may be set to a gate-on voltage (e.g., a low voltage) such that the transistors included in the pixels PXL may be turned on.

The data driver DDV may supply the data signal to the data lines D1 to Dm in response to a data control signal DCS. The data signal supplied to the data lines D1 to Dm may be supplied to pixels PXL selected by the scan signal.

The timing controller TC may supply, to the scan driver SDV and the emission driver EDV, the gate control signals GCS1 and GCS2 generated based on timing signals supplied from the outside. Also, the timing controller TC may supply the data control signal DCS to the data driver DDV.

A start pulse and clock signals may be included in each of the gate control signals GCS1 and GCS2. The start pulse controls a timing of a first scan signal or a first light emitting control signal. The clock signals are used to shift the start pulse.

A source start pulse and clock signals may be included in the data control signal DCS. The source start pulse controls a sampling start time of data. The color signals are used to control a sampling operation.

Figure 3:
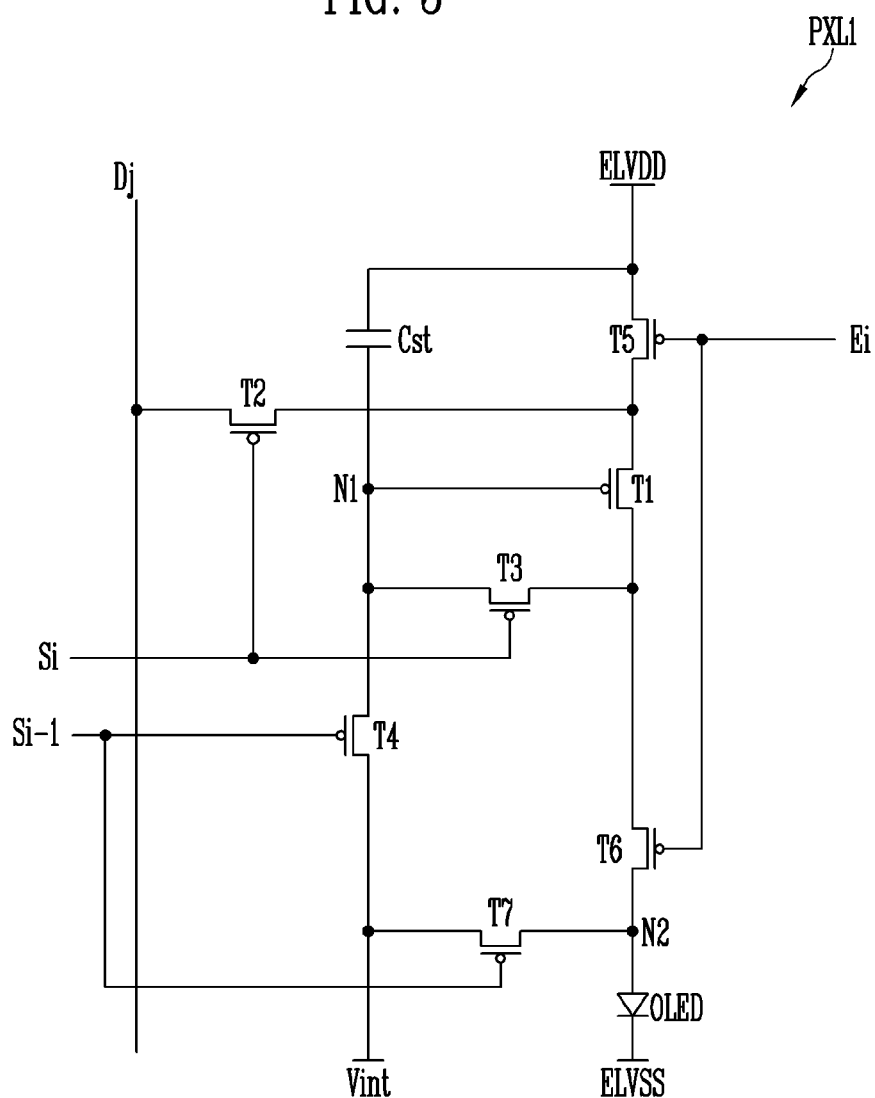
FIG. 3 is an equivalent circuit diagram illustrating one pixel among pixels shown in FIG. 2.

FIG. 3 is an equivalent circuit diagram illustrating one pixel among the pixels shown in FIG. 2. For convenience of description, a first pixel connected to a jth data line Dj, an ith emission control line Ei, an ith scan line Si, and an (i−1)th scan line Si−1 is illustrated in FIG. 3.

Referring to FIGS. 2 and 3, the first pixel PXL1 according to an exemplary embodiment of the invention may include a light emitting element OLED, first to seventh transistors T1 to T7, and a storage capacitor Cst.

An anode electrode of the light emitting element OLED is connected to the first transistor T1 via the sixth transistor T6, and a cathode electrode of the light emitting element OLED is connected to a second power voltage ELVSS. The light emitting element OLED may generate light with a predetermined luminance corresponding to an amount of current supplied from the first transistor T1. A first power voltage ELVDD applied to the power line PL to enable current to flow through the light emitting element OLED may be set to a voltage higher than that of the second power voltage ELVSS.

A source electrode of the first transistor (also referred to as driving transistor) T1 is connected to the first power voltage ELVDD via the fifth transistor T5, and a drain electrode of the first transistor T1 is connected to the anode electrode of the light emitting element OLED via the sixth transistor T6. The first transistor T1 controls an amount of current flowing from the first power voltage ELVDD to the second power voltage ELVSS via the light emitting element OLED, corresponding to a voltage of a first node N1 that is connected to a gate electrode of the first transistor T1.

The second transistor (also referred to as switching transistor) T2 is connected between a jth data line Dj and the source electrode of the first transistor T1. In addition, a gate electrode of the second transistor T2 is connected to an ith scan line Si. The second transistor T2 is turned on when a scan signal is supplied to the ith scan line Si, to allow the jth data line Dj and the source electrode of the first transistor T1 to be electrically connected to each other.

The third transistor T3 is connected between the drain electrode of the first transistor T1 and the first node N1. In addition, a gate electrode of the third transistor T3 is connected to the ith scan line Si. The third transistor T3 is turned on when a scan signal is supplied to the ith scan line Si, to allow the drain electrode of the first transistor T1 and the first node N1 to be electrically connected to each other. Thus, the first transistor T1 is diode-coupled when the third transistor T3 is turned on.

The fourth transistor T4 is connected between the first node N1 and an initialization power source Vint. In addition, a gate electrode of the fourth transistor T4 is connected to an (i−1)th scan line Si−1. The fourth transistor T4 is turned on when a scan signal is supplied to the (i−1)th scan line Si−1, to supply the voltage of the initialization power source Vint to the first node N1. Here, the initialization power source Vint is set to a voltage lower than that of a data signal.

The fifth transistor T5 is connected between the first power voltage ELVDD and the source electrode of the first transistor T1. In addition, a gate electrode of the fifth transistor T5 is connected to an ith emission control line Ei. The fifth transistor T5 is turned off when an emission control signal is supplied to the ith emission control line Ei, and is turned on otherwise.

The sixth transistor T6 is connected between the drain electrode of the first transistor T1 and the anode electrode of the light emitting element OLED. In addition, a gate electrode of the sixth transistor T6 is connected to the ith emission control line Ei. The sixth transistor T6 is turned off when an emission control signal is supplied to the ith emission control line Ei, and is turned on otherwise.

The seventh transistor T7 is connected between the initialization power source Vint and the anode electrode of the light emitting element OLED, i.e., between the initialization power source Vint and a second node N2. In addition, a gate electrode of the seventh transistor T7 is connected to the (i−1)th scan line Si−1. The seventh transistor T7 is turned on when a scan signal is supplied to the (i−1)th scan line Si−1, to supply the voltage of the initialization power source Vint to the anode electrode of the light emitting element OLED.

The storage capacitor Cst is connected between the first power voltage ELVDD and the first node N1. The storage capacitor Cst stores a voltage corresponding to the data signal and a threshold voltage of the first transistor T1.

Figure 4A:
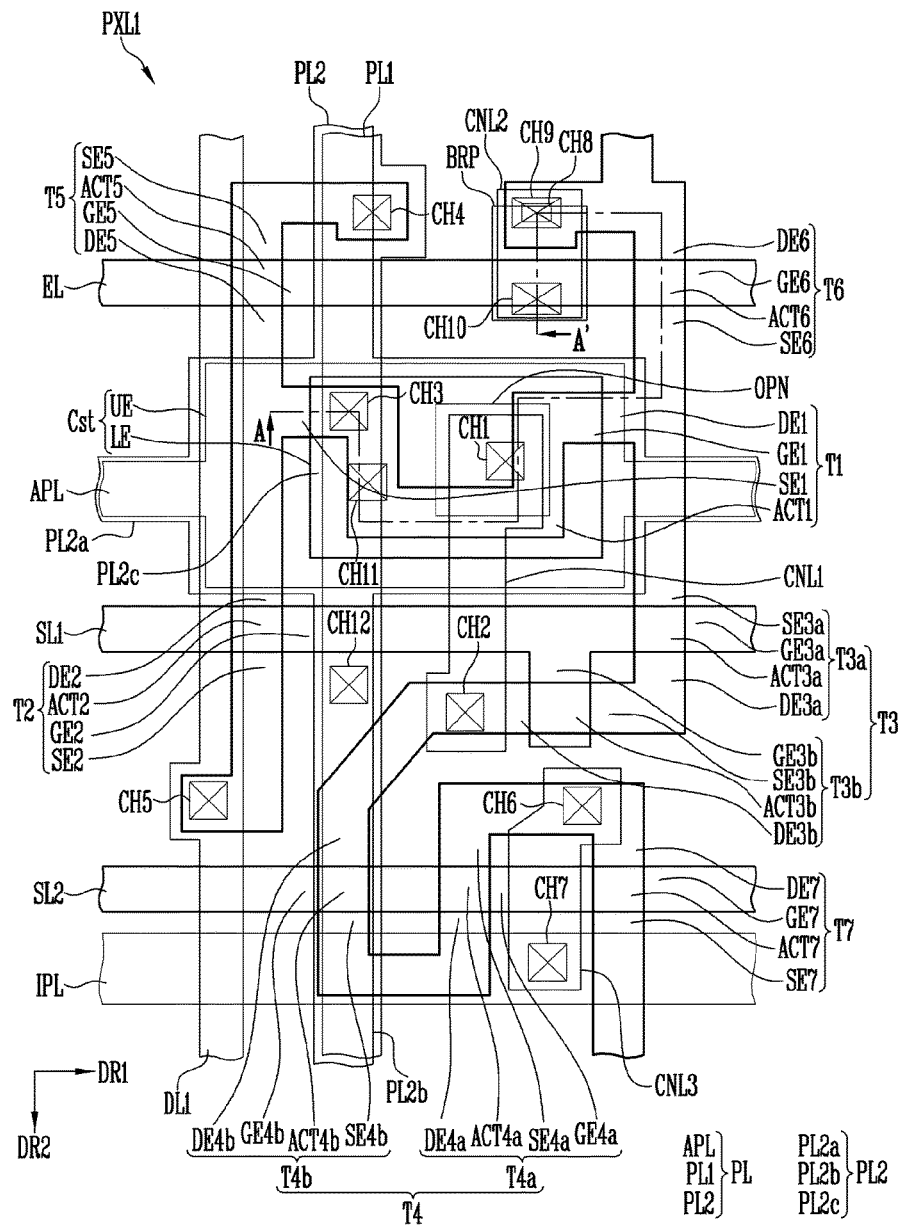
FIG. 4A is a plan view illustrating in detail the one pixel shown in FIG. 3.
Figure 5:
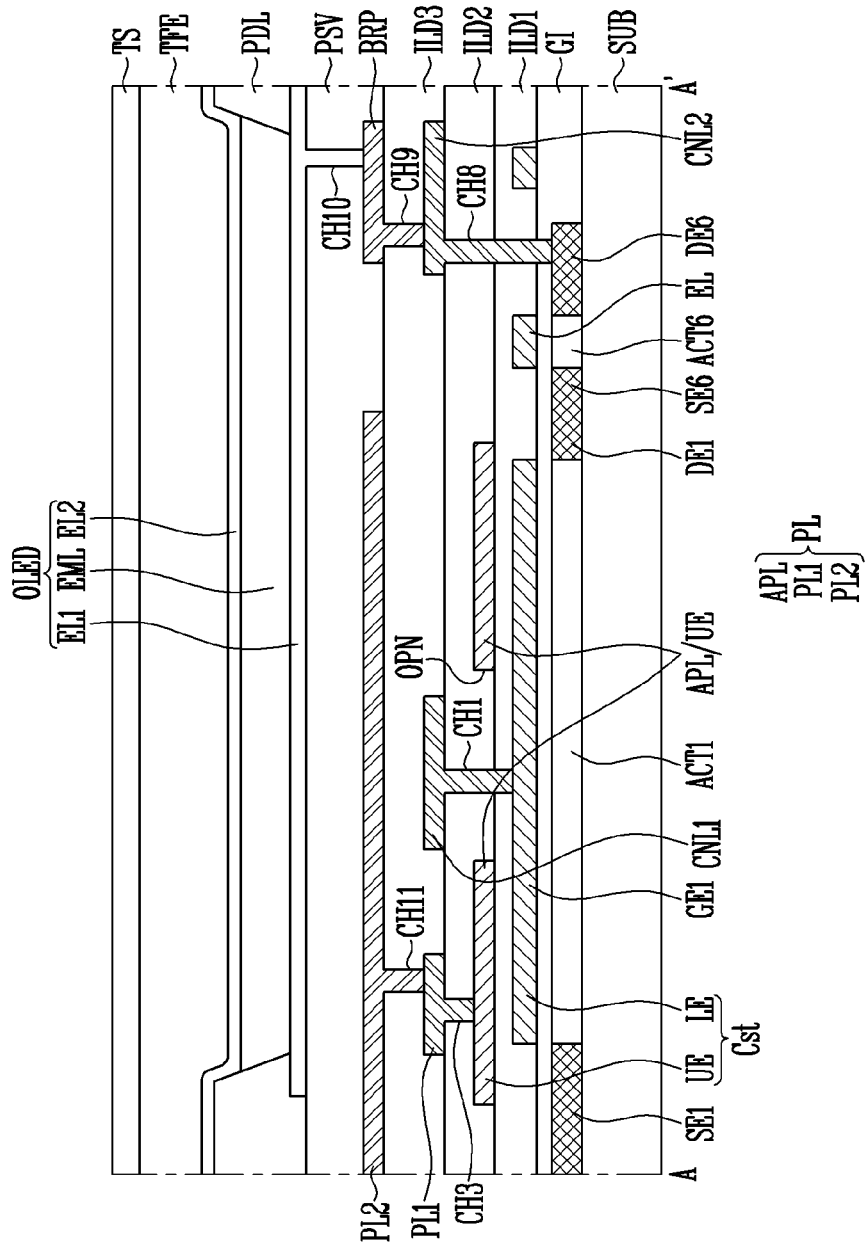
FIG. 5 is a cross-sectional view taken along line A-A' of FIG. 4.

FIG. 4A is a plan view illustrating in detail the one pixel shown in FIG. 3. FIG. 4B is a plan view illustrating only a power line in the pixel of FIG. 4A. FIG. 5 is a cross-sectional view taken along line A-A' of FIG. 4A. Based on a first pixel PXL1 disposed on an ith row and a jth column in the first display region, two scan lines, one emission control line, one power line, and two data lines adjacent to each other, which are connected to the first pixel PXL1, are illustrated in FIGS. 4A, 4B, and 5.

In FIGS. 4A, 4B and 5, for convenience of description, in lines provided to the first pixel PXL1, among the two scan lines to which a scan signal is applied, a scan line on an (i−1)th row is designated as an "(i−1)th scan line SL2," and a scan line on the ith row is designated as an "ith scan line SL1." In addition, an emission control line on the ith row, to which an emission control signal is applied, is designated as an "emission control line EL," a data line on the jth column, to which a data signal is applied, is designated as a "data line DL1," and an initialization power line to which the initialization power source Vint is applied is designated as an "initialization power line IPL."

Referring to FIGS. 3 to 5, the display device according to the exemplary embodiment of the invention may include a substrate SUB, a line unit, and a first pixel PXL1.

The substrate SUB may include a transparent insulating material to enable light to be transmitted therethrough. The substrate SUB may be a rigid substrate or a flexible substrate. In an exemplary embodiment, the rigid substrate may include a glass substrate, a quartz substrate, a glass ceramic substrate, and a crystalline glass substrate, for example. In an exemplary embodiment, the flexible substrate may include a film substrate and a plastic substrate, which include an organic polymer material, for example. In an exemplary embodiment, the flexible substrate may include at least one of polyethersulfone ("PES"), polyacrylate ("PA"), polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC"), triacetate cellulose ("TAC"), and cellulose acetate propionate ("CAP"), for example. In an exemplary embodiment, the flexible substrate may include fiber glass reinforced plastic ("FRP"), for example.

The material applied to the substrate SUB may preferably have resistance (or heat resistance) against high processing temperature in a manufacturing process of the display device. In an exemplary embodiment of the invention, the whole or at least a portion of the substrate SUB may have flexibility.

The line unit may include scan lines SL1, SL2, a data line DL1, an emission control line EL, a power line PL, and an initialization power line IPL.

The scan lines SL1 and SL2 may extend in a first direction DR1. The scan lines SL1 and SL2 may include an ith scan line SL1 and an (i−1)th scan line SL2, which are sequentially arranged along a second direction DR2 intersecting the first direction DR1. A scan signal may be applied to the scan lines SL1 and SL2. In an exemplary embodiment, an (i−1)th scan signal may be applied to the (i−1)th scan line SL2, and an ith scan signal may be applied to the ith scan line SL1, for example. In an exemplary embodiment of the invention, the (i−1)th scan line SL2 may branch off into two lines, and the branching-off (i−1)th scan lines SL2 may be respectively connected to transistors different from each other.

The emission control line EL may extend in the first direction DR1, and be disposed to be spaced apart from the ith scan line SL1 in the second direction DR2. An emission control signal may be applied to the emission control line EL.

The data line DL1 may extend in the second direction DR2, and adjacent data lines DL1 may be sequentially arranged along the first direction DR1. A data signal may be applied to the data line DL1.

The power line PL may include an additional power line APL, a first power line PL1, and a second power line PL2. The additional power line APL, the first power line PL1, and the second power line PL2 may be electrically connected to each other. The additional power line APL may extend along the first direction DR1, the first power line PL1 may extend along the second direction DR2, and the second power line PL2 may extend along the first and second directions DR1 and DR2. In a plan view, the additional power line APL, the first power line PL1, and the second power line PL2 may overlap with each other. A first power voltage (refer to ELVDD of FIG. 3) may be applied to the second power line PL2. Since the second power line PL2 is electrically connected to the first power line PL1, the first power voltage ELVDD may be applied to the first power line PL1. Also, since the first power line PL1 is electrically connected to the additional power line APL, the first power voltage ELVDD may be applied to the additional power line APL.

The initialization power line IPL may extend along the first direction DR1, and be provided between the (i−1)th scan line SL2 and an emission control line EL on a first pixel on the next row. An initialization power source Vint (refer to FIG. 3) may be applied to the initialization power line IPL.

The first pixel PXL1 may include first to seventh transistors T1 to T7, a storage capacitor Cst, and a light emitting element OLED.

The first transistor T1 may include a first gate electrode GE1, a first active pattern ACT1, a first source electrode SE1, a first drain electrode DE1, and a first contact part CNL1.

The first gate electrode GE1 may be connected to a third drain electrode DE3 of the third transistor T3 and a fourth drain electrode DE4 of the fourth transistor T4 through the first contact part CNL1. One end of the first contact part CNL1 may be connected to the first gate electrode GE1 through a first contact hole CH1, and the other end of the contact part CNL1 may be connected to the third drain electrode DE3 and the fourth drain electrode DE4 through a second contact hole CH2.

In an exemplary embodiment of the invention, the first active pattern ACT1, the first source electrode SE1, and the first drain electrode DE1 may include a semiconductor layer undoped or doped with an impurity. In an exemplary embodiment, the first source electrode SE1 and the first drain electrode DE1 may include a semiconductor layer doped with the impurity, and the first active pattern ACT1 may include a semiconductor layer undoped with the impurity, for example.

The first active pattern ACT1 has a bar shape extending in a predetermined direction, and may have a shape in which it is bent plural times along the extending direction. In a plan view, the first active pattern ACT1 may overlap with the first gate electrode GE1. As the first active pattern ACT1 is provided long, a channel region of the first transistor T1 may be provided long. Thus, the driving range of a gate voltage applied to the first transistor T1 is widened. Accordingly, the gray scale of light emitted from the light emitting element OLED may be minutely controlled.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5.

The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, and a second source electrode SE2, and the second drain electrode DE2.

The second gate electrode GE2 may be connected to the ith scan line SL1. The second gate electrode GE2 may be provided as a portion of the ith scan line SL1 or may be provided in a shape protruding from the ith scan line SL1.

The second active pattern ACT2 may include a semiconductor layer undoped with the impurity. In a plan view, the second active pattern ACT2 may overlap with the second gate electrode GE2.

One end of the second source electrode SE2 may be connected to the second active pattern ACT2, and the other end of the second source electrode SE2 may be connected to the data line DL1 through a fifth contact hole CH5.

One end of the second drain electrode DE2 may be connected to the second active pattern ACT2, and the other end of the second drain electrode DE2 may be connected to the first source electrode SE1 of the first transistor T1 and the fifth drain electrode DE5 of the fifth transistor T5.

The third transistor T3 may be provided in a double gate structure so as to prevent a leakage current. That is, the third transistor T3 may include a 3ath transistor T3a and a 3bth transistor T3b. The 3ath transistor T3a may include a 3ath gate electrode GE3a, a 3ath active pattern ACT3a, a 3ath source electrode SE3a, and a 3ath drain electrode DE3a. The 3bth transistor T3b may include a 3bth gate electrode GE3b, a 3bth active pattern ACT3b, a 3bth source electrode SE3b, and a 3bth drain electrode DE3b. In an exemplary embodiment of the invention, for convenience of description, the 3ath gate electrode GE3a and the 3bth gate electrode GE3b are referred to as a third gate electrode GE3, the 3ath active pattern ACT3a and the 3bth active pattern ACT3b are referred to as a third active pattern ACT3, the 3ath source electrode SE3a and the 3bth source electrode SE3b are referred to as the third source electrode SE3, and the 3ath drain electrode DE3a and the 3bth drain electrode DE3b are referred to as the third drain electrode DE3.

The third gate electrode GE3 may be connected to the ith scan line SL1. The third gate electrode GE3 may be provided as a portion of the ith scan line SL1 or may be provided in a shape protruding from the ith scan line SL1.

The third active pattern ACT3 may include a semiconductor layer undoped with the impurity. In a plan view, the third active pattern ACT3 may overlap with the third gate electrode GE3.

One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6.

One end of the third drain electrode DE3 may be connected to the third active pattern ACT3. The other end of the third drain electrode DE3 may be connected to the fourth drain electrode DE4 of the fourth transistor T4 and the first gate electrode GE1 of the first transistor T1.

The fourth transistor T4 may be provided in a double gate structure so as to prevent a leakage current. That is, the fourth transistor T4 may include a 4ath transistor T4a and a 4bth transistor T4b. The 4ath transistor T4a may include a 4ath gate electrode GE4a, a 4ath active pattern ACT4a, a 4ath source electrode SE4a, and a 4ath drain electrode DE4a, and the 4bth transistor T4b may include a 4bth gate electrode GE4b, a 4bth active pattern ACT4b, a 4bth source electrode SE4b, and a 4bth drain electrode DE4b. In an exemplary embodiment of the invention, for convenience of description, the 4ath gate electrode GE4a and the 4bth gate electrode GE4b are referred to as a fourth gate electrode GE4, the 4ath active pattern ACT4a and the 4bth active pattern ACT4b are referred to as a fourth active pattern ACT4, the 4ath source electrode SE4a and the 4bth source electrode SE4b are referred to as a fourth source electrode SE4, and the 4ath drain electrode DE4a and the 4bth drain electrode DE4b are referred to as the fourth drain electrode DE4.

The fourth gate electrode GE4 may be connected to the (i−1)th scan line SL2. The fourth gate electrode GE4 may be provided as a portion of the (i−1)th scan line SL2 or may be provided in a shape protruding from the (i−1)th scan line SL2.

The fourth active pattern ACT4 may include a semiconductor layer undoped with the impurity. In a plan view, the fourth active pattern ACT4 may overlap with the fourth gate electrode GE4.

One end of the fourth source electrode SE4 may be connected to the fourth active pattern ACT4. The other end of the fourth source electrode SE4 may be connected to a seventh drain electrode DE7 of a seventh transistor T7 and the initialization power line IPL. A third contact part CNL3 may be provided between the fourth source electrode SE4 and the initialization power line IPL. One end of the third contact part CNL3 may be connected to the fourth source electrode SE4 through a sixth contact hole CH6. The other end of the third contact part CNL3 may be connected to the initialization power line IPL through a seventh contact hole CH7.

One end of the fourth drain electrode DE4 may be connected to the fourth active pattern ACT4, and the other end of the fourth drain electrode DE4 may be connected to the third drain electrode DE3 of the third transistor T3 and the first gate electrode GE1 of the first transistor T1.

The fifth transistor T5 may include a fifth gate electrode GE5, a fifth active pattern ACT5, a fifth source electrode SE5, and the fifth drain electrode DE5.

The fifth gate electrode GE5 may be connected to the emission control line EL. The fifth gate electrode GE5 may be provided as a portion of the emission control line EL or may be provided in a shape protruding from the emission control line EL.

The fifth active pattern ACT5 may include a semiconductor layer undoped with the impurity. In a plan view, the fifth active pattern ACT5 may overlap with the fifth gate electrode GE5.

One end of the fifth source electrode SE5 may be connected to the fifth active pattern ACT5. The other end of the fifth source electrode SE5 may be connected to the first power line PL1 through a fifth contact hole CH5.

One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode GE6 may be connected to the emission control line EL. The sixth gate electrode GE6 may be provided as a portion of the emission control line EL or may be provided in a shape protruding from the emission control line EL.

The sixth active pattern ACT6 may include a semiconductor layer undoped with the impurity. In a plan view, the sixth active pattern ACT6 may overlap with the sixth gate electrode GE6.

One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3.

One end of the sixth drain electrode DE6 may be connected to the sixth active pattern ACT6. The other end of the sixth drain electrode DE6 may be connected to a seventh source electrode SE7 of a seventh transistor T7 of a first pixel PXL1 in the previous row.

The seventh transistor T7 may include a seventh gate electrode GE7, a seventh active pattern ACT7, the seventh source electrode SE7, and a seventh drain electrode DE7.

The seventh gate electrode GE7 may be connected to the (i−1)th scan line SL2. The seventh gate electrode GE7 may be provided as a portion of the (i−1)th scan line SL2 or may be provided in a shape protruding from the (i−1)th scan line SL2.

The seventh active pattern ACT7 may include a semiconductor layer undoped with the impurity. In a plan view, the seventh active pattern ACT7 may overlap with the seventh gate electrode GE7.

One end of the seventh source electrode SE7 may be connected to the seventh active pattern ACT7. The other end of the seventh source electrode SE7 may be connected to the sixth drain electrode DE6 of the sixth transistor T6.

One end of the seventh drain electrode DE7 may be connected to the seventh active pattern ACT7. The other end of the seventh drain electrode DE7 may be connected to the initialization power line IPL and the fourth source electrode SE4 of the fourth transistor T4.

The storage capacitor Cst may include a lower electrode LE and an upper electrode UE. The lower electrode LE may be configured as the first gate electrode GE1 of the first transistor T1.

The upper electrode UE may overlap with the lower electrode LE. In a plan view, the upper electrode UE may cover the lower electrode LE. As the overlapping area of the upper electrode UE and the lower electrode LE is widened, the capacitance of the storage capacitor Cst may be increased. The upper electrode UE may extend in the first direction DR1. In an exemplary embodiment of the invention, the upper electrode UE may be the additional power line APL. Therefore, a voltage having the same level as that of the first power voltage ELVDD may be applied to the upper electrode UE. An opening OPN may be defined in the upper electrode UE in a region including the first contact hole CH1 through which the first gate electrode GE1 and the first contact part CNL1 are connected to each other.

The light emitting element OLED may include a first electrode EL1, a second electrode EL2, and an emitting layer EML provided between the first electrode EL1 and the second electrode EL2.

The first electrode EL1 may be provided in each first pixel PXL1. The first electrode EL1 may be connected to the seventh source electrode SE7 of the seventh transistor T7 and the sixth drain electrode DE6 of the sixth transistor T6 through eighth to tenth contact holes CH8 to CH10. A second contact part CNL2 and a bridge pattern BRP may be provided between the eighth to tenth contact holes CH8 to CH10 to allow the sixth drain electrode DE6 and the seventh source electrode SE7 to be connected to the first electrode EL1.

Hereinafter, a structure of the display device according to the exemplary embodiment of the invention will be described along a stacking order with reference to FIGS. 4 and 5.

The first to seventh active patterns ACT1 to ACT7 may be provided on the substrate SUB. The first to seventh active patterns ACT1 to ACT7 may include a semiconductor material.

A buffer layer (not shown) may be disposed between the substrate SUB and the first to seventh active patterns ACT1 to ACT7. The buffer layer may prevent an impurity from being diffused into the first to seventh transistors T1 to T7. The buffer layer may be provided in a single layer, but be provided in a multi-layer including at least two layers. When the buffer layer is provided in the multi-layer, the layers may include the same material or include different materials. The buffer layer may be omitted according to the material and process conditions of the substrate SUB.

A gate insulating layer GI may be disposed on the substrate SUB on which the first to seventh active patterns ACT1 to ACT7 are provided. The gate insulating layer GI may be an inorganic layer including an inorganic material. In an exemplary embodiment, the gate insulating layer GI may include at least one of silicon nitride, silicon oxide, and silicon oxynitride, for example.

The ith scan line SL1, the (i−1)th scan line SL2, the emission control line EL, and the first to seventh gate electrode GE1 to GE7 may be disposed on the gate insulating layer GI. The first gate electrode GE1 may become the lower electrode LE of the storage capacitor Cst. The second gate electrode GE2 and the third gate electrode GE3 may be unitary with the ith scan line SL1. The fourth gate electrode GE4 and the seventh gate electrode GE7 may be unitary with the (i−1)th scan line SL2. The fifth gate electrode GE5 and the sixth gate electrode GE6 may be unitary with the emission control line EL.

A first inter-insulating layer ILD1 may be disposed on the substrate SUB on which the scan lines SL1 and SL2 and the like are provided. The first inter-insulating layer ILD1 may include the same material as that of the gate insulating layer GI.

The upper electrode UE of the storage capacitor Cst, the initialization power line IPL, and the additional power line APL may be disposed on the first inter-insulating layer ILD1.

The upper electrode UE may cover the lower electrode LE. The upper electrode UE along with the lower electrode LE may constitute the storage capacitor Cst with the first inter-insulating layer ILD1 interposed therebetween.

A second inter-insulating layer ILD2 may be disposed on the substrate SUB on which the additional power line APL and the like are disposed.

The data line DL1, the first power line PL1, and the first to third contact parts CNL1 to CNL3 may be disposed on the second inter-insulating layer ILD2.

The data line DL1 may be connected to the second source electrode SE2 through the fifth contact hole CH5 sequentially passing through the gate insulating layer GI and the first and second inter-insulating layers ILD1 and ILD2.

The first power line PL1 may be connected to the upper electrode UE of the storage capacitor Cst and the additional power line APL through a third contact hole CH3 passing through the second inter-insulating layer ILD2. Also, the first power line PL1 may be connected to the fifth source electrode SE5 through a fourth contact hole CH4 sequentially passing through the gate insulating layer GI and the first and second inter-insulating layers ILD1 and ILD2.

The first contact part CNL1 may be connected to the first gate electrode GE1 through the first contact hole CH1 sequentially passing through the first and second inter-insulating layers ILD1 and ILD2. Also, the first contact part CNL1 may be connected to the third drain electrode DE3 and the fourth drain electrode DE4 through the second contact hole CH2 sequentially passing through the gate insulating layer GI and the first and second inter-insulating layers ILD1 and ILD2.

The second contact part CNL2 may be a conductive pattern provided as a medium connecting the sixth drain electrode DE6 to the first electrode EL1 between the sixth drain electrode DE6 and the first electrode EL'. The second contact part CNL2 may be connected to the sixth drain electrode DE6 and the seventh source electrode SE7 through the eighth contact hole CH8 sequentially passing through the gate insulating layer GI and the first and second inter-insulating layers ILD1 and ILD2.

The third contact part CNL3 may be connected to the initialization power line IPL through the seventh contact hole CH7 passing through the second inter-insulating layer ILD2. Also, the third contact part CNL3 may be connected to the fourth source electrode SE4 and the seventh drain electrode DE7 through the sixth contact hole CH6 sequentially passing through the gate insulating layer GI and the first and second inter-insulating layers ILD1 and ILD2.

A third inter-insulating layer ILD3 may be disposed on the substrate SUB on which the data line DL1 and the like are disposed. The third inter-insulating layer ILD3 may be an inorganic insulating layer including an inorganic material or an organic insulating layer including an organic material. The third inter-insulating layer ILD3 may be provided in a single layer as shown in the drawing. However, the invention is not limited thereto, and the third inter-insulating layer ILD3 may be provided in a multi-layer. When the third inter-insulating layer ILD3 is provided in the multi-layer, the third inter-insulating layer ILD3 may have a structure in which a plurality of inorganic insulating layers and a plurality of organic insulating layers are alternately stacked. In an exemplary embodiment, the third inter-insulating layer ILD3 may have a structure in which a first organic insulating layer, an inorganic insulating layer, and a second organic insulating layer are sequentially stacked, for example.

The bridge pattern BRP and the second power line PL2 may be provided on the third inter-insulating layer ILD3.

The bridge pattern BRP may be connected to the second contact part CNL2 through the ninth contact hole CH9 passing through the third inter-insulating layer ILD3.

The second power line PL2 may be connected to the first power line PL1 through an eleventh contact hole CH11 passing through the third inter-insulating layer ILD3.

A protective layer PSV may be disposed on the substrate SUB on which the bridge pattern BRP and the like are disposed.

The first electrode EL1 may be disposed on the protective layer PSV. The first electrode EL1 may be connected to the bridge pattern BRP through the tenth contact hole CH10 passing through the protective layer PSV. Since the bridge pattern BRP is connected to the second contact part CNL2 through the ninth contact hole CH9, the first electrode EL1 may be finally connected to the sixth drain electrode DE6 and the seventh source electrode SE7 through the bridge pattern BRP and the second contact part CNL2.

A pixel defining layer PDL that defines a light emitting region to correspond to each first pixel PXL1 may be disposed on the substrate SUB on which the first electrode EL1 is disposed. The pixel defining layer PDL may expose a top surface of the first electrode EL1 and protrude from the substrate SUB along the circumference of the first pixel PXL1.

The emitting layer EML may be disposed on the first electrode EL1 surrounded by the pixel defining layer PDL, and the second electrode EL2 may be disposed on the emitting layer EML.

The pixel defining layer PDL may include an organic insulating material. In an exemplary embodiment, the pixel defining layer PDL may include at least one of polystyrene, polymethylmethacrylate ("PMMA"), polyacrylonitrile ("PAN"), PA, PI, polyarylether ("PAE"), heterocyclic polymer, parylene, epoxy, benzocyclobutene ("BCB"), siloxane based resin, and silane based resin, for example.

The emitting layer EML may be disposed on the exposed surface of the first electrode Ell. The emitting layer EML may have a multi-layered thin film structure including at least a light generation layer ("LGL"). In an exemplary embodiment, the emitting layer EML may include a hole injection layer ("HIL") for injecting holes, a hole transport layer ("HTL") having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer ("HBL") for suppressing the movement of holes that fail to be combined in the LGL, an electron transport layer ("ETL") smoothly transporting electrons to the LGL, and an electron injection layer ("EIL") for injecting electrons, for example.

In an exemplary embodiment, the color of light generated in the LGL may be one of red, green, blue, and white, for example, but the invention is not limited thereto. In an exemplary embodiment, the color of light generated in the LGL may also be one of magenta, cyan, and yellow, for example.

The HIL, HTL, HBL, ETL, and EIL may be common layers connected in adjacent light emitting regions.

A thin film encapsulation layer TFE that covers the second electrode EL2 may be provided over the second electrode EL2.

The thin film encapsulation layer TFE may prevent oxygen and moisture from penetrating into the light emitting element OLED. The thin film encapsulation layer TFE may be provided in a single layer, but be provided in a multilayer. The thin film encapsulation layer TFE may include a plurality of insulating layers that cover the light emitting element OLED. Specifically, the thin film encapsulation layer TFE may include a plurality of inorganic layers and a plurality of organic layers. In an exemplary embodiment, the thin film encapsulation layer TFE may have a structure in which the inorganic layers and the organic layers are alternately stacked, for example. In an exemplary embodiment, the thin film encapsulation layer TFE may be an encapsulation substrate that is disposed on the light emitting element OLED and is joined with the substrate SUB through a sealant.

The display device according to the exemplary embodiment of the invention may include a touch sensor TS provided on the thin film encapsulation layer TFE. The touch sensor TS may be disposed on a surface of the substrate SUB in the direction in which an image is emitted, to receive a touch input of a user. The touch sensor TS may recognize a touch event from the display device through a finger of a user or a separate input means.

The touch sensor TS may be driven using a mutual capacitance method. In the mutual capacitance method, a change in capacitance, caused by an interaction between two touch sensing electrodes, is sensed. In addition, the touch sensor TS may be driven using a self-capacitance method. In the self-capacitance method, when a user touches a region, a change in capacitance of a sensing electrode in the touched region is sensed using touch sensing electrodes arranged in a matrix shape and sensing lines connected to the respective sensing electrodes.

The touch sensor TS may include the touch sensing electrodes, sensing lines connected to the touch sensing electrodes, and a pad unit connected to end portions of the sensing lines.

A window (not shown) for protecting an exposed surface of the touch sensor TS may be provided on the touch sensor TS. The window allows an image from the substrate SUB to be transmitted therethrough and simultaneously reduces impact from the outside, so that it is possible to prevent the display device from being damaged or erroneously operated due to the impact from the outside.

As described above, in an exemplary embodiment of the invention, the power line PL may include the additional power line APL, the first power line PL1, and the second power line PL2.

The additional power line APL and the first and second power lines PL1 and PL2 may be provided in layers different from each other. In an exemplary embodiment, the second power line PL2 may be provided on the first power line PL1 with the third inter-insulating layer ILD3 interposed therebetween, and the first power line PL1 may be provided on the additional power line APL with the second inter-insulating layer ILD2 interposed therebetween, for example.

The first power line PL1 may extend and may be connected to the additional power line APL through the third contact hole CH3. Accordingly, the additional power line APL and the first power line PL1 may be electrically connected to each other. The second power line PL2 may extend and may be connected to the first power line PL1 through the eleventh contact hole CH11. Accordingly, the first power line PL1 and the second power line PL2 may be electrically connected to each other. Consequently, the additional power line APL and the first and second power lines PL1 and PL2 may be electrically connected to each other. As the first power voltage ELVDD is supplied to the second power line PL2, the first power voltage ELVDD may also be supplied to the additional power line APL and the first power line PL1.

In a plan view, the second power line PL2 may include a first part PL2a that extends along the first direction DR1 and overlaps with the additional power line APL and a second part PL2b that extends along the second direction DR2 and overlaps with the first power line PL1. In addition, the PL2 may include a third part PL2c in which the first part PL2a and the second part PL2b overlap. The first part PL2a, the second part PL2b, and the third part PL2c may be provided integrally. In an exemplary embodiment of the invention, the first part PL2a may be provided in common to pixels (not shown) adjacent to the first pixel PXL1 along the first direction DR1. The second part PL2b may be provided in common to pixels adjacent to the first pixel PXL1 along the second direction DR2. Due to a structural characteristic of the second power line PL2 including the first part PL2a, the second part PL2b, and the third part PL2c, the second power line PL2 may be provided in a mesh form on the substrate SUB. The first power voltage ELVDD is supplied to the second power line PL2 disposed in the mesh form on the substrate SUB. Thus, the first power voltage ELVDD may be uniformly supplied to each pixel PXL of the display device. Accordingly, the display device may realize a uniform luminance throughout the entire display region (refer to DA1 to DA5 of FIG. 1).

Figure 6A:
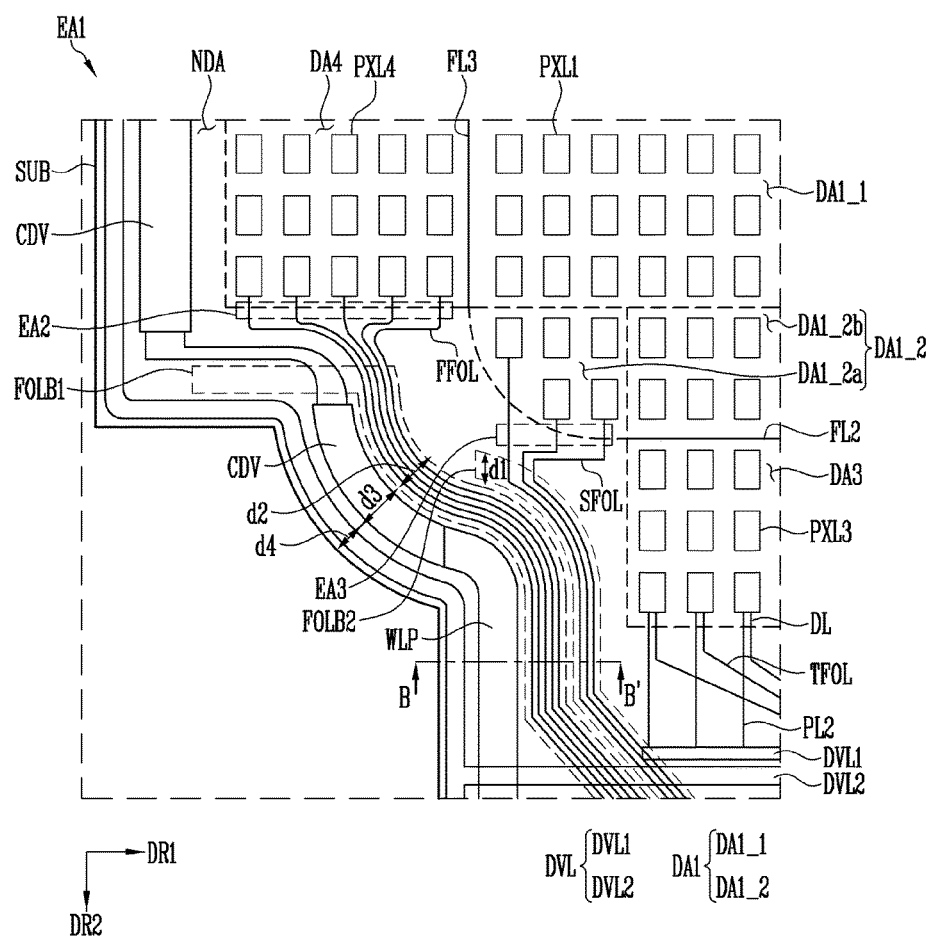
FIG. 6A is an enlarged plan view of portion EA1 of FIG. 1.
Figure 6B:
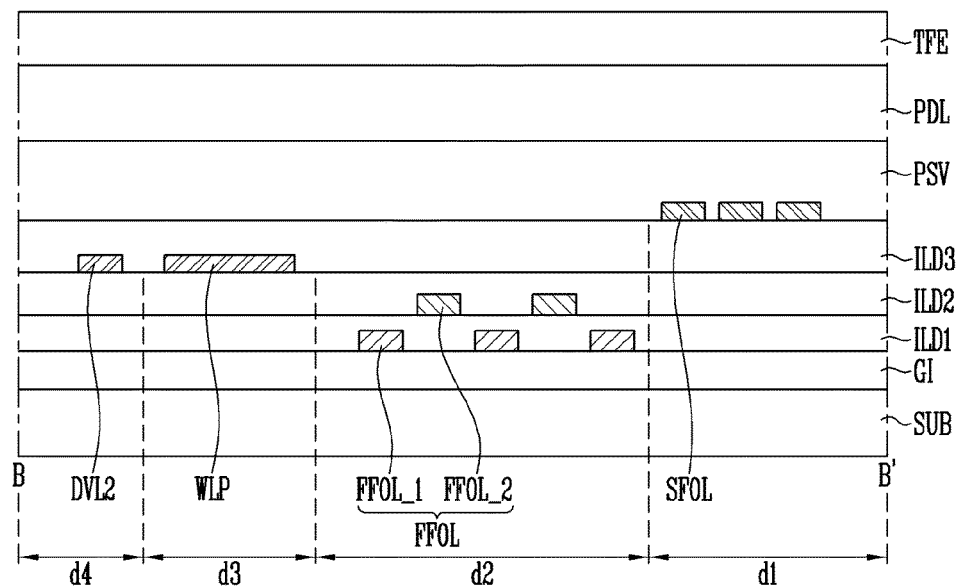
FIG. 6B is a cross-sectional view taken along line B-B' of FIG. 6A.

FIG. 6A is an enlarged plan view of portion EA1 of FIG. 1, and FIG. 6B is a cross-sectional view taken along line B-B' of FIG. 6A.

In FIG. 6A, an arrangement relationship of the components arranged in the non-display region, e.g., the fan-out lines, the first and second driving voltage lines, the driving unit, and the like will be mainly illustrated for convenience of description.

Referring to FIGS. 1 to 5, 6A, and 6B, the display device according to the exemplary embodiment of the invention may include a substrate SUB including a first display region DA1, a second display region DA2, a third display region DA3, a fourth display region DA4, a fifth display region DA5 and a non-display region NDA, a plurality of pixels PXL disposed on the substrate SUB, a line unit connected to the pixels PXL.

The pixels PXL may be arranged in a matrix form. In an exemplary embodiment, the pixels PXL may constitute a plurality of pixel rows and a plurality of pixel columns in the first display region DA1, the second display region DA2, the third display region DA3, the fourth display region DA4, and the fifth display region DA5, for example. The pixel rows may include a plurality of pixels PXL arranged in a first direction DR1, to have a shape extending in the first direction DR1. The pixel rows may be arranged in a second direction DR2. The pixel columns may include a plurality of pixels PXL arranged in the second direction DR2, to have a shape extending in the second direction DR2. The pixel columns may be arranged in the first direction DR1. In an exemplary embodiment of the invention, a case where the pixels PXL are arranged in a matrix form is illustrated as an example. However, the invention is not limited thereto, and the pixels PXL may be arranged in various shapes.

In an exemplary embodiment of the invention, the pixels PXL may include first pixels PXL1 arranged in the first display region DA1, second pixels PXL2 arranged in the second display region DA2, third pixels PXL3 arranged in the third display region DA3, fourth pixels PXL4 arranged in the fourth display region DA4, and fifth pixels PXL5 arranged in the fifth display region DA5.

The first display region DA1 has a plurality of short sides and a pair of long sides, and may include a (1-1)th display region DA1_1 and at least one (1-2)th display region DA1_2. The (1-2)th display region DA1_2 may be disposed at both sides of the (1-1)th display region DA1_1, which are opposite to each other, in the second direction DR2.

The (1-2)th display region DA1_2 may include a first region DA1_2a including a curved line connecting two adjacent linear sides and a second region DA1_2b except the first region DA1_2a. The first region DA1_2a may be a corner portion of the (1-2)th display region DA1_2. The (1-2)th display region DA1_2 may have a shape of which a width decreases as it becomes farther from the (1-1)th display region DA1_1 in the second direction DR2. In an exemplary embodiment, the (1-2)th display region DA1_2 may have a shape of which a width decreases as it becomes farther from the (1-1)th display region DA1_1, for example. Accordingly, in the (1-2)th display region DA1_2, the number of first pixels PXL1 provided on each pixel row may decrease as they become farther from the (1-1)th display region DA1_1.

In an exemplary embodiment of the invention, a case where the (1-2)th display region DA1_2 includes corner portions having a round shape is illustrated as an example, but the invention is not limited thereto. In an exemplary embodiment, the (1-2)th display region DA1_2 may have a trapezoidal shape due to corner portions including inclined linear sides or have a step shape due to corner portions having stepped portions.

For convenience of description, only one side portion of the substrate SUB is illustrated in FIG. 6A, but the other side portion may be provided in the substantially same manner such that the shape of the substrate SUB is bilaterally symmetrical. Here, it is unnecessary that the length of the pixel rows of the (1-2)th display region DA1_2 decrease at the same rate (or the numbers of first pixels PXL1 arranged on the pixel rows decrease at the same rate) as they become farther from the (1-1)th display region DA1_1. The number of first pixels PXL1 arranged on each pixel row of the (1-2)th display region DA1_2 may be variously changed.

The third display region DA3 may be a display region that is foldable toward the outside of the first display region DA1 along a second folding line FL2, and the third pixels PXL3 may be provided in the third display region DA3.

The fourth display region DA4 may be a display region that is foldable toward the outside of the first display region DA1 along a third folding line FL3, and the fourth pixels PXL4 may be provided in the fourth display region DA4.

The non-display region NDA may be a region in which the pixels PXL are not provided. A driving voltage line DVL, a data driver DDV, a driving unit, and a fan-out line unit may be disposed in the non-display region NDA.

The driving voltage line DVL may include a first driving voltage line DVL1 and a second driving voltage line DVL2. The first driving voltage line DVL1 may apply a first power voltage (refer to ELVDD of FIG. 3) to the pixels PXL, and the second driving voltage line DVL2 may apply a second power voltage (refer to ELVSS of FIG. 3) to the pixels PXL.

In a plan view, the first driving voltage line DVL1 may be disposed in the non-display region NDA to correspond to only an outside of the third display region DA3. The first driving voltage line DVL1 may be electrically connected to a second power line PL2 connected to the third pixels PXL3 to apply the first power voltage ELVDD to the third pixels PXL3.

The second driving voltage line DVL2 may be disposed at the outermost portion of the non-display region NDA. In an exemplary embodiment, the second driving voltage line DVL2 may be disposed in the non-display region NDA to surround the first display region DA1, the second display region DA2, the third display region DA3, the fourth display region DA4, and the fifth display region DA5, for example.

The data driver DDV may provide a data signal to each of the pixels PXL through the fan-out line unit. The data driver DDV may be disposed along the width direction (e.g., the first direction DR1) of the first display region DA1 in the non-display region NDA.

The driving unit may be provided between the second driving voltage line DVL2 and the fan-out line unit. The driving unit may include a circuit driver CDV including a scan driver for supplying a scan signal to the pixels PXL and an emission control driver for supplying an emission control signal to the pixels PXL, and a signal line unit WLP connected to the circuit driver CDV. The signal line unit WLP may include a plurality of lines electrically connected to the transistor. In an exemplary embodiment, the lines may include a clock signal line for supplying a clock signal, and the like, for example. In the following embodiment, for convenience of description, a case where the signal line unit WLP is a clock signal line is illustrated as an example.

The fan-out line unit may include a first fan-out line block FOLB1 and a second fan-out line block FOLB2.

The first fan-out line block FOLB1 may include a first fan-out line FFOL that electrically connect the data driver DDV (refer to FIG. 1) to the fourth pixels PXL4 disposed on pixel columns of the fourth display region DA4. One end of the first fan-out line FFOL may be connected to a data line DL connected to each of the pixel columns on which the fourth pixels PXL4 are provided. In addition, the other end of the first fan-out line FFOL may be connected to the data driver DDV. Therefore, a data signal from the data driver DDV may be applied to the fourth pixel PXL4 through the first fan-out line FFOL. The first fan-out line FFOL may substantially extend along a diagonal direction intersecting with the first direction DR1 and the second direction DR2. As at least a portion of the first fan-out line FFOL is bent, the first fan-out line FFOL may extend in a direction inclined with respect to the second direction DR2. At least a portion of the first fan-out line FFOL may include a curve part having a predetermined curvature.

The first fan-out line FFOL may include a (1-1)th fan-out line FFOL_1 and a (1-2)th fan-out line FFOL_2, which are alternately disposed. The (1-1)th fan-out line FFOL_1 and the (1-2)th fan-out line FFOL_2 may be provided in layers different from each other.

The second fan-out line block FOLB2 may include a second fan-out line SFOL. The second fan-out line SFOL may electrically connect the data driver DDV to the first pixels PXL1 disposed on a pixel column extending to the (1-1)th display region DA1_1 from a corner portion of the (1-2)th display region DA1_2. One end of the second fan-out line SFOL may be connected to a data line connected to each of the pixel columns on which the first pixels PXL1 are provided. In addition, the other end of the second fan-out line SFOL may be connected to the data driver DDV. Therefore, a data signal from the data driver DDV may be applied to the first pixels PXL1 of the (1-2)th display region DA1_2 through the second fan-out line SFOL.

The fan-out line unit may include a third fan-out line TFOL that connects the data driver DDV to the third pixels PXL3 disposed on pixel columns of the third display region DA3. One end of the third fan-out line TFOL may be connected to a data line DL connected to each of the pixel columns on which the third pixels PXL3 are provided. In addition, the other end of the third fan-out line TFOL may be connected to the data driver DDV. Therefore, a data signal from the data driver DDV may be applied to the third pixels PXL3 through the third fan-out line TFOL.

In an exemplary embodiment of the invention, the data line DL connected to the third pixels PXL3 may extend to the first display region DA1 along the second direction DR2. That is, the third pixels PXL3 may share the same data line DL with the first pixels PXL1 disposed on the same pixel column. Therefore, the third fan-out line TFOL may apply the data signal from the data driver DDV to not only the third pixels PXL3 but also the first pixels PXL1 disposed on the same column as the third pixels PXL3. In addition, the second power line PL2 connected to the third pixels PXL3 may extend to the first display region DA1 along the second direction DR2. Therefore, the third pixels PXL3 may share the same second power line PL2 with the first pixels PXL1 disposed on the same pixel column.

The second driving voltage line DLV2 may have a fourth width d4 in the non-display region NDA, the driving unit including the signal line unit WLP and the circuit driver CDV may have a third width d3 in the non-display region NDA to correspond to the outside of the third display region DA3, the first fan-out line block FOLB1 may have a second width d2 in the non-display region NDA, and the second fan-out line block FOLB2 may have a first width d1 in the non-display region NDA. In an exemplary embodiment of the invention, the first to fourth widths d1 to d4 may be different from one another. In an exemplary embodiment, the second width d2 may be largest, for example.

In a plan view, the second driving voltage line DVL2, the driving unit, and the first and second fan-out line blocks FOLB1 and FOLB2 may not overlap with each other.

As described above, the third pixels PXL3 may be supplied with the first power voltage ELVDD through the second power line PL2 connected to the first driving voltage line DVL1. As the first power voltage ELVDD is supplied to the third pixels PXL3, the first power voltage ELVDD may also be supplied to the first pixels PXL1 disposed on the same pixel column as the third pixels PXL3.

In an exemplary embodiment of the invention, the third pixels PXL3 and the first pixels PXL1, which are disposed on the same pixel column, may share the same second power line PL2.

In each pixel PXL, the second power line PL2, as shown in FIG. 4A, may include a first part PL2a extending in the first direction DR1, a second part PL2b extending in the second direction DR2, and a third part PL2c in which the first part PL2a and the second part PL2b overlap. The first part PL2a, the second part PL2b, and the third part PL2c may be provided integrally. Due to a structural characteristic of the second power line PL2, a second power line PL2 disposed in one pixel PXL and a second power line PL2 disposed in a pixel adjacent to the one pixel PXL may be electrically connected to each other. Accordingly, the first power voltage ELVDD may be uniformly supplied to the one pixel PXL and the pixel PXL adjacent thereto.

Thus, although only the second power line PL2 connected to the third pixels PXL3 is connected to the first driving voltage line DVL1, the first power voltage ELVDD may be supplied to the first display region DA1, the second display region DA2, the third display region DA3, the fourth display region DA4, and the fifth display region DA5 due to a structural characteristic of the second power line PL2 including the first part PL2a, the second part PL2b, and the third part PL2c. Accordingly, the first power voltage ELVDD from the first driving voltage line DVL1 may be uniformly supplied to the first display region DA1, the second display region DA2, the third display region DA3, the fourth display region DA4, and the fifth display region DA5.

In an exemplary embodiment of the invention, the first driving voltage line DVL1 may be disposed in the non-display region NDA to correspond to an outside of the third display region DA3. Therefore, the first driving voltage line DVL1 may directly apply the first power voltage ELVDD to the third pixels PXL3 of the third display region DA3 through the second power line PL2. In addition, the first power voltage ELVDD may be directly applied to some first pixels PXL1 that share the same second power line PL2 with the third pixels PXL3. The first power voltage ELVDD may be applied to the other pixels PXL except the third pixels PXL3 and the some first pixels PXL1 due to an electrical connection relationship of the second power lines PL2 provided to the respective pixels PXL.

As described above, although the first power voltage ELVDD is applied to only a specific pixel PXL as the first driving voltage line DVL1 is disposed in a specific region of the non-display region NDA, the first power voltage ELVDD may be uniformly supplied to all of the pixels PXL disposed on the substrate SUB.

According to the exemplary embodiment of the invention, the first driving voltage line DVL1 is disposed in the non-display region NDA to correspond to only a partial display region, so that the area occupied by the first driving voltage line DVL1 in the non-display region NDA may be decreased. Consequently, according to the exemplary embodiment of the invention, the area of dead spaces in the non-display region NDA may be minimized.

Hereinafter, a structure of the non-display region NDA in the display device according to the exemplary embodiment of the invention will be described along a stacking order with reference to FIGS. 6A and 6B.

A gate insulating layer GI may be disposed on the substrate SUB.

The (1-1)th fan-out line FFOL_1 may be disposed on the gate insulating layer GI.

A first inter-insulating layer ILD1 may be disposed on the substrate SUB on which the (1-1)th fan-out line FFOL_1 is disposed.

The (1-2)th fan-out line FFOL_2 may be disposed on the first inter-insulating layer ILD1. The (1-2)th fan-out line FFOL_2 may be alternately disposed with the (1-1)th fan-out line FFOL_1 on the first inter-insulating layer ILD1.

As shown in the drawings, the (1-2)th fan-out line FFOL_2 may be disposed on the first inter-insulating layer ILD1 not to overlap with the (1-1)th fan-out line FFOL_1, but the invention is not limited thereto. In an exemplary embodiment, in a plan view, the (1-2)th fan-out line FFOL_2 may overlap with the (1-1)th fan-out line FFOL_1, for example. In this case, the area occupied by the first fan-out line FFOL in the non-display region NDA may be decreased. Accordingly, the area of dead spaces in the non-display region NDA may be decreased.

In an exemplary embodiment of the invention, the (1-1)th fan-out line FFOL_1 and the (1-2)th fan-out line FFOL_2 may be provided in layers different from each other, but the invention is not limited thereto. In some exemplary embodiments, the (1-1)th fan-out line FFOL_1 and the (1-2)th fan-out line FFOL_2 may be provided in the same layer. A structure in which the (1-1)th fan-out line FFOL_1 and the (1-2)th fan-out line FFOL_2 are provided in the same layer will be described with reference to FIG. 6H.

A second inter-insulating layer ILD2 may be provided over the (1-2)th fan-out line FFOL_2.

The second driving voltage line DVL2 and the signal line unit WLP may be disposed on the second inter-insulating layer ILD2. The signal line unit WLP may be a clock signal line to which a clock signal is provided. Here, the second driving voltage line DVL2 may be provided in a single layer. However, the invention is not limited thereto, and the second driving voltage line DVL2 may be provided in a multi-layer.

A third inter-insulating layer ILD3 may be disposed on the substrate SUB on which the second driving voltage line DVL2 and the signal line unit WLP are disposed. The third inter-insulating layer ILD3 may be provided in a single layer. However, the invention is not limited thereto, and the third inter-insulating layer ILD3 may be provided in a multi-layer.

The second fan-out line SFOL may be disposed on the third inter-insulating layer ILD3.

A protective layer PSV, a pixel defining layer PDL, and a thin film encapsulation layer TFE may be sequentially provided over the second fan-out line SFOL.

In an exemplary embodiment of the invention, the first fan-out line FFOL, the second fan-out line SFOL, and the second driving voltage line DVL2 may be provided in layers different from one another. In an exemplary embodiment, among the second driving voltage line DVL2 and the first and second fan-out lines FFOL and SFOL, the second fan-out line SFOL may be disposed in the uppermost layer on the substrate SUB, and the first fan-out line FFOL may be disposed in the lowermost layer on the substrate SUB, for example.

In an exemplary embodiment of the invention, the (1-1)th fan-out line FFOL_1 may be provided in the same layer as the scan lines SL1 and SL2 connected to the pixels PXL, and the (1-2)th fan-out line FFOL_2 may be provided in the same layer as the additional power line APL connected to the pixels PXL. However, the invention is not limited thereto, and vice versa in another exemplary embodiment. That is, the (1-1)th fan-out line FFOL_1 may be provided in the same layer as the additional power line APL, and the (1-2)th fan-out line FFOL_2 may be provided in the same layer as the scan lines SL1 and SL2. The second driving voltage line DVL2 may be provided in the same layer as the first power line PL1 connected to each pixel PXL. The second fan-out line SFOL may be provided in the same layer as the second power line PL2 connected to each pixel PXL.

Figure 6C:
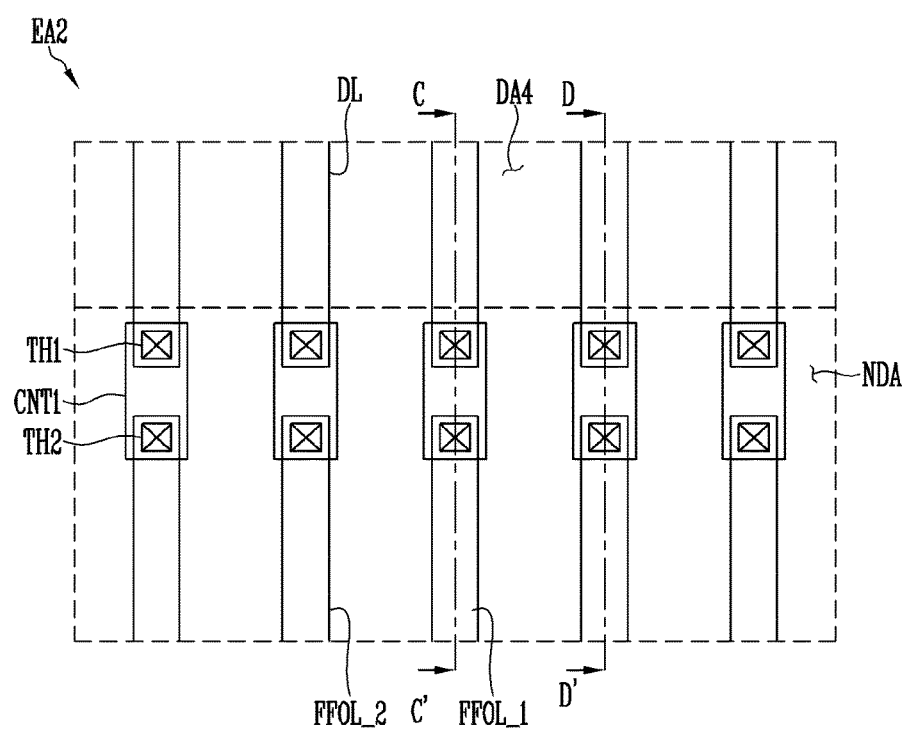
FIG. 6C is an enlarged plan view of portion EA2 of FIG. 6A.
Figure 6D:
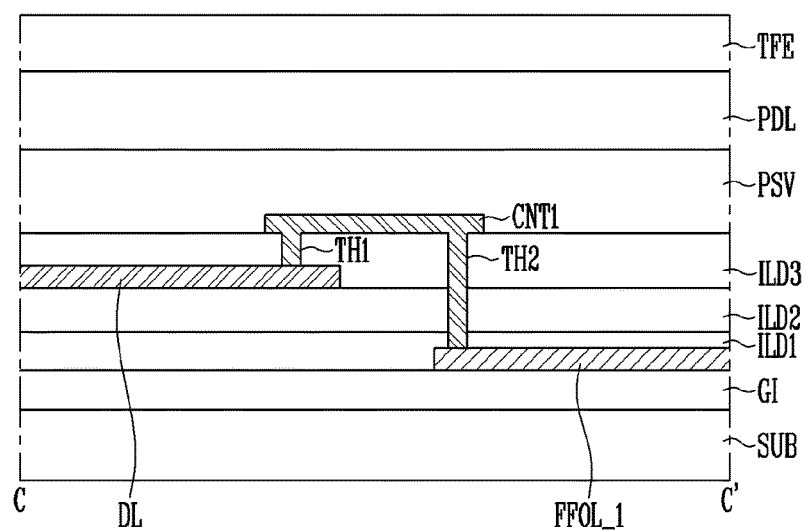
FIG. 6D is a cross-sectional view taken along line C-C' of FIG. 6C.
Figure 6E:
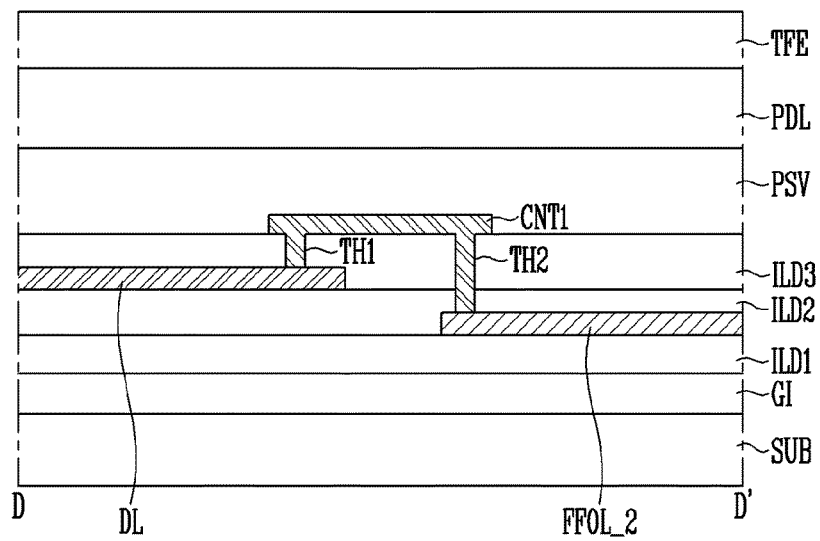
FIG. 6E is a cross-sectional view taken along line D-D' of FIG. 6C.

FIG. 6C is an enlarged plan view of portion EA2 of FIG. 6A, FIG. 6D is a cross-sectional view taken along line C-C' of FIG. 6C, and FIG. 6E is a cross-sectional view taken along line D-D' of FIG. 6C.

Referring to FIGS. 6A and 6C to 6E, one data line DL disposed in the fourth display region DA4 may be electrically connected to one first fan-out line FFOL disposed in the non-display region NDA. Specifically, the data line DL may be electrically connected to the first fan-out line FFOL by a first contact electrode CNT1 disposed in the non-display region NDA.

The first contact electrode CNT1 may be a conductive pattern provided as a medium that connects the data line DL disposed in the fourth display region DA4 to the first fan-out line FFOL disposed in the non-display region NDA. One end of the first contact electrode CNT1 may extend and may be connected to the data line DL through a first through-hole TH1. The other end of the first contact electrode CNT1 may extend and may be connected to the first fan-out line FFOL through a second through-hole TH2. Accordingly, the data line DL and the first fan-out line FFOL may be electrically connected to each other through the first contact electrode CNT1.

The first fan-out line FFOL may include the (1-1)th fan-out line FFOL_1 and the (1-2)th fan-out line FFOL_2.

The (1-1)th fan-out line FFOL_1 may be disposed on the gate insulating layer GI of the substrate SUB.

The data line DL may be disposed on the (1-1)th fan-out line FFOL_1 with the first and second inter-insulating layers ILD1 and ILD2 interposed therebetween.

The first contact electrode CNT1 may be disposed on the data line DL with the third inter-insulating layer ILD3 interposed therebetween. One end of the first contact electrode CNT1 may be connected to the data line DL through the first through-hole TH1 passing through the third inter-insulating layer ILD3. The other end of the first contact electrode CNT1 may be connected to the (1-1)th fan-out line FFOL_1 through the second through-hole TH2 sequentially passing through the first to third inter-insulating layers ILD1 to ILD3.

The (1-2)th fan-out line FFOL_2 adjacent to the (1-1)th fan-out line FFOL_1 may be disposed on the first inter-insulating layer ILD1 as shown in FIG. 6E. The (1-2)th fan-out line FFOL_2 may be electrically connected to a corresponding data line DL of the fourth display region DA4 through the first contact electrode CNT1.

One end of the first contact electrode CNT1 may be connected to the data line DL through the first through-hole TH1 passing through the third inter-insulating layer ILD3. The other end of the first contact electrode CNT1 may be connected to the (1-2)th fan-out line FFOL_2 through the second through-hole TH2 sequentially passing through the second and third inter-insulating layers ILD2 and ILD3.

In an exemplary embodiment of the invention, the first contact electrode CNT1 may be provided in the same layer as the second fan-out line SFOL, but the invention is not limited thereto.

Figure 6F:
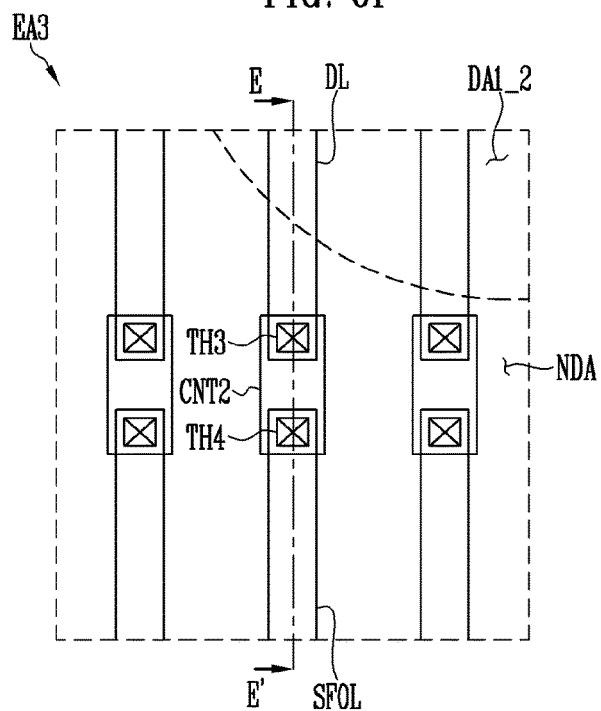
FIG. 6F is an enlarged plan view of portion EA3 of FIG. 6A.
Figure 6G:
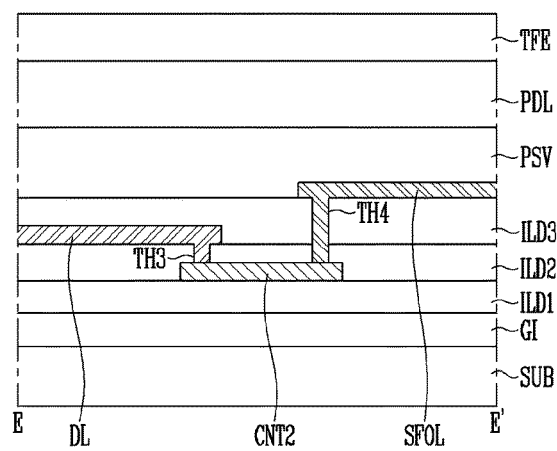
FIG. 6G is a cross-sectional view taken along line E-E' of FIG. 6F.

FIG. 6F is an enlarged plan view of portion EA3 of FIG. 6A, and FIG. 6G is a cross-sectional view taken along line E-E' of FIG. 6F.

Referring to FIGS. 6A, 6F, and 6G, a data line DL disposed at a first region DA1_2a of the (1-2)th display region DA1_2 may be electrically connected to a corresponding second fan-out line SFOL disposed in the non-display region NDA. Specifically, the data line DL may be electrically connected to the second fan-out line SFOL by a second contact electrode CNT2 disposed in the non-display region NDA.

The second contact electrode CNT2 may be a conductive pattern provided as a medium that connects the data line DL to the second fan-out line SFOL. One end of the second contact electrode CNT2 may extend and may be connected to the data line DL through a third through-hole TH3. The other end of the second contact electrode CNT2 may extend and may be connected to the second fan-out line SFOL through a fourth through-hole TH4. Accordingly, the data line and the second fan-out line SFOL may be electrically connected to each other through the second contact electrode CNT2.

The second contact electrode CNT2 may be disposed on the first inter-insulating layer ILD1 of the substrate SUB.

The data line DL may be disposed on the second contact electrode CNT2 with the second inter-insulating layer ILD2 interposed therebetween.

The second fan-out line SFOL may be disposed on the data line DL with the third inter-insulating layer ILD3 interposed therebetween.

One end of the second contact electrode CNT2 may be connected to the data line DL through the third through-hole TH3 passing through the second inter-insulating layer ILD2. The other end of the second contact electrode CNT2 may be connected to the second fan-out line SFOL through the fourth through-hole TH4 sequentially passing through the second and third inter-insulating layers ILD2 and IDL3. In an exemplary embodiment of the invention, the second contact electrode CNT2 may be provided in the same layer as the additional power line (refer to APL of FIG. 4A) connected to first pixels PXL1 disposed at the first region DA1_2a of the (1-2)th display region DA1_2, but the invention is not limited thereto.

Figure 6H:
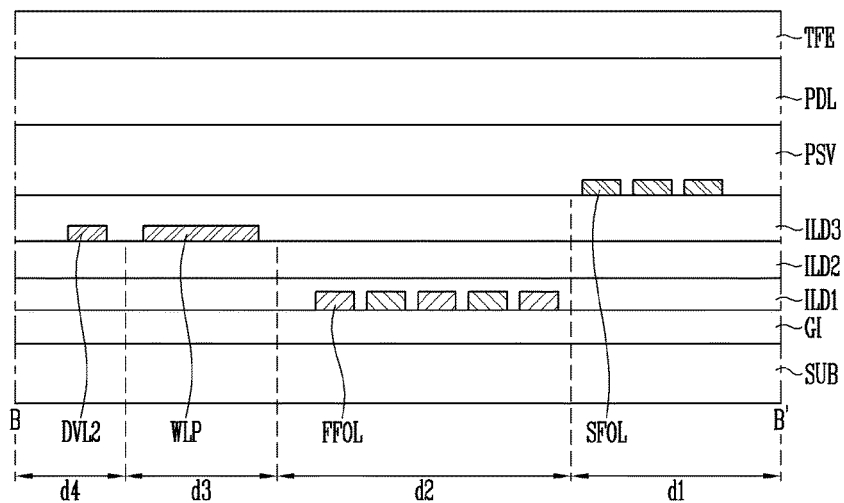
FIG. 6H illustrates another form of a first fan-out line of FIG. 6B, which is a cross-sectional view taken along line B-B' of FIG. 6A.

FIG. 6H illustrates another form of the first fan-out line of FIG. 6B, which is a cross-sectional view taken along line B-B' of FIG. 6A. In FIG. 6H, portions different from those of the above-described embodiment will be mainly described to avoid redundancy. Portions not particularly described in the exemplary embodiment of the invention follow those of the above-described embodiment. In addition, identical reference numerals refer to identical components, and similar reference numerals refer to similar components.

Referring to FIGS. 6A, 6B, and 6H, a first fan-out line FFOL may be disposed on the substrate SUB. The first fan-out line FFOL may be disposed between the gate insulating layer GI and the first inter-insulating layer ILD1.

The first fan-out line FFOL may be provided in the same layer as the scan lines (refer to SL1 and SL2 of FIG. 4A) connected to a pixel PXL. In an exemplary embodiment of the invention, the first fan-out line FFOL may be disposed on the gate insulating layer GI. However, the invention is not limited thereto, and the first fan-out line FFOL may be disposed on the first inter-insulating layer ILD1. In this case, the first fan-out line FFOL may be provided in the same layer as the additional power line (refer to APL of FIG. 4A) connected to the pixel PXL.

Figure 7A:
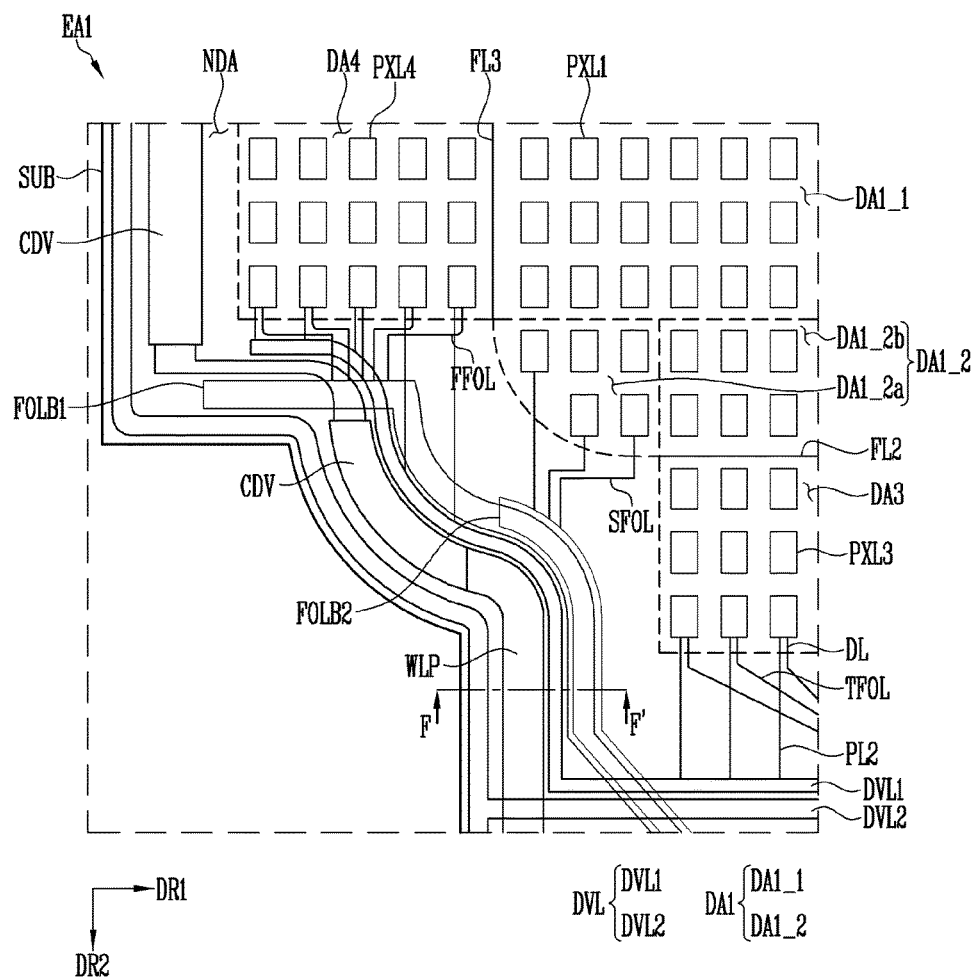
FIG. 7A illustrates an exemplary embodiment of a portion of a display device according to the invention, which is a plan view corresponding to the portion EA1 of FIG. 1.
Figure 7B:
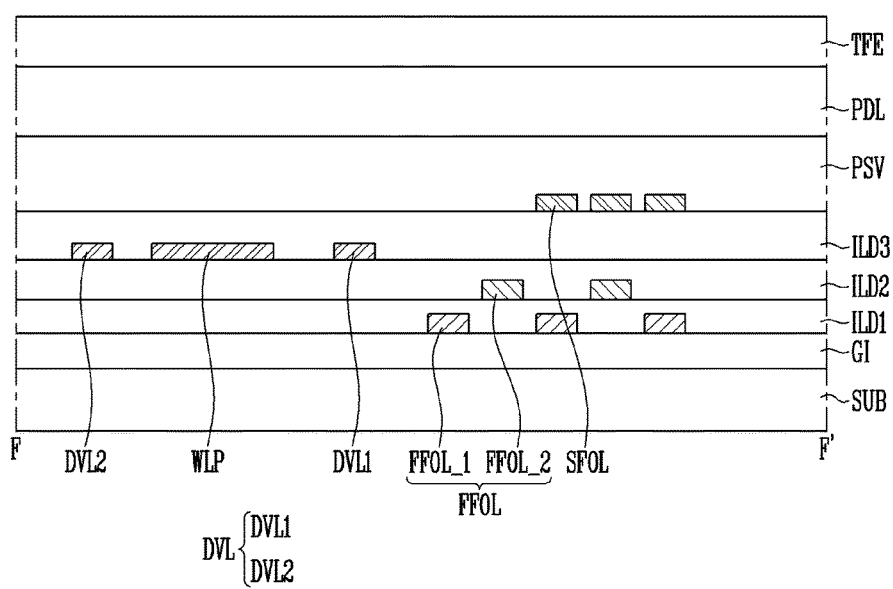
FIG. 7B is a cross-sectional view taken along line F-F' of FIG. 7A.

FIG. 7A illustrates a portion of a display device according to an exemplary embodiment of the invention, which is a plan view corresponding to the portion EA1 of FIG. 1, and FIG. 7B is a cross-sectional view taken along line F-F' of FIG. 7A. In FIGS. 7A and 7B, portions different from those of the above-described embodiment will be mainly described to avoid redundancy. Portions not particularly described in the exemplary embodiment of the invention follow those of the above-described embodiment. In addition, identical reference numerals refer to identical components, and similar reference numerals refer to similar components.

Referring to FIGS. 1 to 5, 7A, and 7B, the display device according to the exemplary embodiment of the invention may include a substrate SUB including a first display region DA1, a second display region DA2, a third display region DA3, a fourth display region DA4, a fifth display region DA5 and a non-display region NDA, a plurality of pixels PXL provided on the substrate SUB, and a line unit connected to the pixels PXL.

The pixels PXL may be arranged in a matrix form. In an exemplary embodiment, the pixels PXL may constitute a plurality of pixel rows and a plurality of pixel columns in the first display region DA1, the second display region DA2, the third display region DA3, the fourth display region DA4, and the fifth display region DA5, for example. In an exemplary embodiment of the invention, the pixels PXL may include first pixels PXL1 arranged in the first display region DA1, second pixels PXL2 arranged in the second display region DA2, third pixels PXL3 arranged in the third display region DA3, fourth pixels PXL4 arranged in the fourth display region DA4, and fifth pixels PXL5 arranged in the fifth display region DA5.

The first display region DA1 may include a (1-1)th display region DA1_1 and a (1-2)th display region DA1_2. The (1-2)th display region DA1_2 may include a first region DA1_2a including a curved line connecting two adjacent linear sides and a second region DA1_2b except the first region DA1_2a. The first region DA1_2a may be a corner portion of the (1-2)th display region DA1_2. The (1-2)th display region DA1_2 may have a shape of which a width decreases as it becomes farther from the (1-1)th display region DA1_1 in a second direction DR2. Accordingly, in the (1-2)th display region DA1_2, the number of first pixels PXL1 provided on each pixel row may decrease as they become farther from the (1-1)th display region DA1_1.

A driving voltage line DVL, a driving unit, and a fan-out line unit may be disposed in the non-display region NDA.

The driving voltage line DVL may include a first driving voltage line DVL1 and a second driving voltage line DVL2.

The first driving voltage line DVL1 may apply a first power voltage ELVDD to the pixels PXL. The first driving voltage line DVL1 may be provided between the driving unit and the fan-out line unit. In a plan view, the first driving voltage line DVL1 may be disposed to surround at least one side of the third display region DA3, at least one side of the (1-2)th display region DA1_2, and at least one side of the fourth display region DA4.

In an exemplary embodiment of the invention, the first driving voltage line DVL1 may apply the first power voltage ELVDD to a corresponding pixel PXL through a second power line PL2. Specifically, the first driving voltage line DVL1 may apply the first power voltage ELVDD to the third pixels PXL3 through a second power line PL2 connected to the third pixels PXL3. In this case, the first power voltage ELVDD may also be applied to the first pixels PXL1 of the first display region DA1, which are disposed on the same pixel column as the third pixels PXL3. In addition, the first driving voltage line DVL1 may apply the first power voltage ELVDD to the fourth pixels PXL4 through a second power line PL2 connected to the fourth pixels PXL4. Although not shown in the drawings, the first driving voltage line DVL1 may be electrically connected to a second power line PL2 provided in the (1-2)th display region DA1_2. Therefore, the first power voltage ELVDD from the first driving voltage line DVL1 may be applied to the first pixels PXL1 of the (1-2)th display region DA1_2.

The second driving voltage line DVL2 may apply a second power voltage ELVSS to the pixels PXL. In a plan view, the second driving voltage line DVL2 may be disposed to surround the first display region DA1, the second display region DA2, the third display region DA3, the fourth display region DA4, and the fifth display region DA5 at the outermost portion of the non-display region NDA.

The driving unit may be provided between the second power line PL2 and the fan-out line unit. The driving unit may include a circuit driver CDV and a signal line unit WLP connected to the circuit driver CDV.

The fan-out line unit may include a first fan-out line block FOLB1 and a second fan-out line block FOLB2.

The first fan-out line block FOLB1 may include a first fan-out line FFOL. The first fan-out line FFOL may electrically connect a data driver DDV (refer to FIG. 1) to the fourth pixels PXL4 disposed on pixel columns of the fourth display region DA4.

In an exemplary embodiment of the invention, the first fan-out line FFOL may include a (1-1)th fan-out line FFOL_1 and a (1-2)th fan-out line FFOL_2, which are alternately disposed on the substrate SUB.

The second fan-out line block FOLB2 may include a second fan-out line SFOL. The second fan-out line SFOL may electrically connect the data driver DDV to the first pixels PXL1 disposed on a pixel column extending to the (1-1)th display region DA1_1 from the first region DA1_2a of the (1-2)th display region DA1_2. The second fan-out line SFOL may overlap with the first fan-out line FFOL in a plan view. As shown in the drawings, the second fan-out line SFOL may partially overlap with the first fan-out line FFOL, but the invention is not limited thereto. In an exemplary embodiment, the second fan-out line SFOL and the first fan-out line FFOL may completely overlap with each other in a plan view.

The fan-out line unit may further include a third fan-out line TFOL. The third fan-out line TFOL may electrically connect the data driver DDV to the third pixels PXL3 disposed on pixel columns of the third display region DA3.

In an exemplary embodiment of the invention, the first driving voltage line DVL1 may apply the first power voltage ELVDD to each pixel PXL through a second power line PL2 corresponding to the pixel PXL. In each pixel PXL, the second power line PL2, as shown in FIGS. 4A and 4B, may include a first part PL2a extending in the first direction DR1, a second part PL2b extending in the second direction DR2, and a third part PL2c in which the first part PL2a and the second part PL2b overlap. The first part PL2a, the second part PL2b, and the third part PL2c may be provided integrally. Due to a structural characteristic of the second power line PL2, a second power line PL2 disposed in one pixel PXL and a second power line PL2 disposed in a pixel adjacent to the one pixel PXL may be electrically connected to each other.

Accordingly, the first power voltage ELVDD may be uniformly supplied to the one pixel PXL and the pixel PXL adjacent thereto. Consequently, the first power voltage ELVDD may be uniformly supplied to each of the pixels PXL provided in the first display region DA1, the second display region DA2, the third display region DA3, the fourth display region DA4, and the fifth display region DA5.

Hereinafter, a structure of the non-display region NDA in the display device according to the exemplary embodiment of the invention will be described along a stacking order with reference to FIGS. 7A and 7B.

A gate insulating layer GI may be disposed on the substrate SUB.

The (1-1)th fan-out line FFOL_1 may be disposed on the gate insulating layer GI.

A first inter-insulating layer ILD1 may be disposed on the substrate SUB on which the (1-1)th fan-out line FFOL_1 is disposed.

The (1-2)th fan-out line FFOL_2 may be disposed on the first inter-insulating layer ILD1. The (1-2)th fan-out line FFOL_2 may be alternately disposed with the (1-1)th fan-out line FFOL_1 on the first inter-insulating layer ILD1.

A second inter-insulating layer ILD2 may be provided over the (1-2)th fan-out line FFOL_2.

The driving voltage line DVL and the signal line unit WLP may be disposed on the second inter-insulating layer ILD2.

A third inter-insulating layer ILD3 may be disposed on the substrate SUB on which the driving voltage line DVL and the like are disposed. The third inter-insulating layer ILD3 may be provided in a single layer. However, the invention is not limited thereto, and the third inter-insulating layer ILD3 may be provided in a multi-layer.

The second fan-out line SFOL may be disposed on the third inter-insulating layer ILD3.

A protective layer PSV, a pixel defining layer PDL, and a thin film encapsulation layer TFE may be sequentially provided over the second fan-out line SFOL.

In an exemplary embodiment of the invention, the first fan-out line FFOL, the second fan-out line SFOL, and the driving voltage line DVL may be provided in layers different from one another. In an exemplary embodiment, among the driving voltage line DVL and the first and second fan-out lines FFOL and SFOL, the second fan-out line SFOL may be disposed in the uppermost layer on the substrate SUB, and the first fan-out line FFOL may be disposed in the lowermost layer on the substrate SUB, for example. Here, the first and second driving voltage lines DVL1 and DVL2 included in the driving voltage line DVL may be provided in the same layer, but the invention is not limited thereto. In some exemplary embodiments, the first and second driving voltage lines DVL1 and DVL2 may be provided in layers different from each other.

In an exemplary embodiment of the invention, the second fan-out line SFOL may be disposed on the first fan-out line FFOL, to cover the first fan-out line FFOL. In a plan view, the second fan-out line SFOL may overlap with the first fan-out line FFOL. The second fan-out line SFOL and the first fan-out line FFOL may partially overlap with each other, but the invention is not limited thereto. In an exemplary embodiment, the second fan-out line SFOL and the first fan-out line FFOL may completely overlap with each other, for example.

As described above, in the display device according to the exemplary embodiment of the invention, the second fan-out line SFOL is designed to overlap with the first fan-out line FFOL, so that the area or width (refer to d1 of FIG. 6A) occupied by the second fan-out line SFOL in the non-display region NDA may be decreased. Accordingly, the area of dead spaces in the non-display region NDA may be minimized.

Figure 8A:
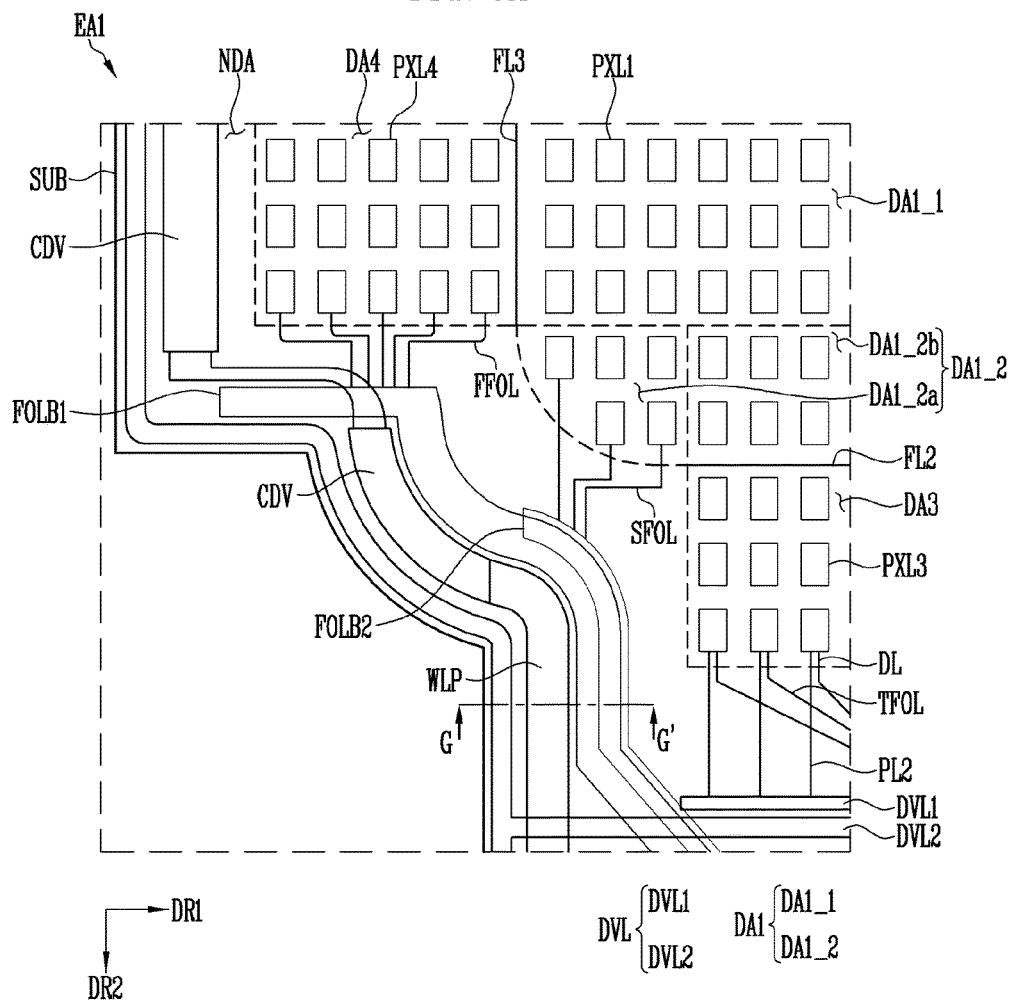
FIG. 8A illustrates an exemplary embodiment of a portion of a display device according to the invention, which is a plan view corresponding to the portion EA1 of FIG. 1.
Figure 8B:
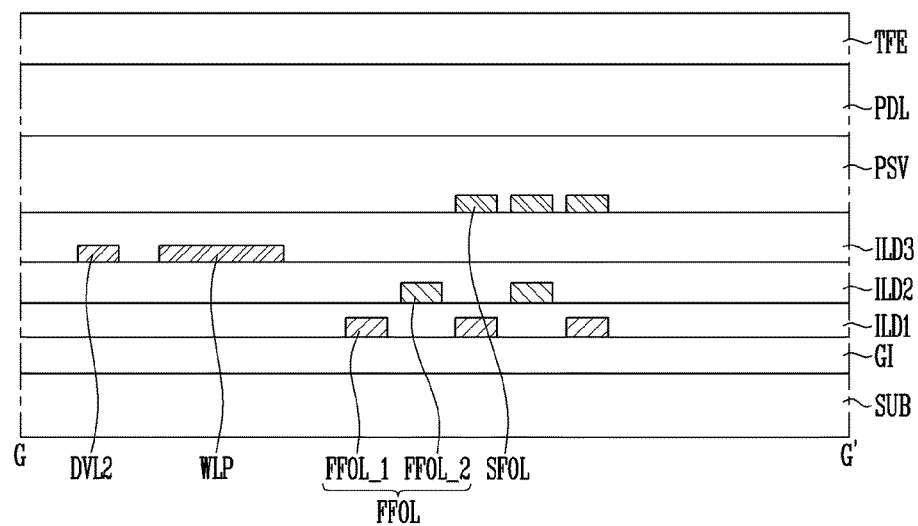
FIG. 8B is a cross-sectional view taken along line G-G' of FIG. 8A.

FIG. 8A illustrates a portion of a display device according to an exemplary embodiment of the invention, which is a plan view corresponding to the portion EA1 of FIG. 1, and FIG. 8B is a cross-sectional view taken along line G-G' of FIG. 8A. In FIGS. 8A and 8B, portions different from those of the above-described embodiment will be mainly described to avoid redundancy. Portions not particularly described in the exemplary embodiment of the invention follow those of the above-described embodiment. In addition, identical reference numerals refer to identical components, and similar reference numerals refer to similar components.

Referring to FIGS. 1 to 5, 8A, and 8B, the display device according to the exemplary embodiment of the invention may include a substrate SUB including a first display region DA1, a second display region DA2, a third display region DA3, a fourth display region DA4, a fifth display region DA5 and a non-display region NDA, a plurality of pixels PXL disposed on the substrate SUB, and a line unit connected to the pixels PXL.

The pixels PXL may include first pixels PXL1 arranged in the first display region DA1, second pixels PXL2 arranged in the second display region DA2, third pixels PXL3 arranged in the third display region DA3, fourth pixels PXL4 arranged in the fourth display region DA4, and fifth pixels PXL5 arranged in the fifth display region DA5.

The first display region DA1 may include a (1-1)th display region DA1_1 and a (1-2)th display region DA1_2. The (1-2)th display region DA1_2 may include a first region DA1_2a including a curved line connecting two adjacent linear sides and a second region DA1_2b except the first region DA1_2a. The first region DA1_2a may be a corner portion of the (1-2)th display region DA1_2. The (1-2)th display region DA1_2 may have a shape of which a width decreases as it becomes farther from the (1-1)th display region DA1_1 in a second direction DR2. Accordingly, in the (1-2)th display region DA1_2, the number of first pixels PXL1 provided on each pixel row may decrease as they become farther from the (1-1)th display region DA1_1.

First and second driving voltage lines DVL1 and DVL2, a driving unit, and a fan-out line unit may be disposed in the non-display region NDA.

The first driving voltage line DVL1 may apply a first power voltage ELVDD to each pixel PXL, and the second driving voltage line DVL2 may apply a second power voltage ELVSS to each pixel PXL.

The first driving voltage line DVL1 is disposed to correspond to a lower portion of the third display region DA3, and may be electrically connected to a second power line PL2 provided to each of the third pixels PXL3. Therefore, the first power voltage ELVDD from the first driving voltage line DVL1 may be applied to the third pixels PXL3 through the second power line PL2.

The fan-out line unit may include a first fan-out line block FOLB1 and a second fan-out line block FOLB2.

The first fan-out line block FOLB1 may include a first fan-out line FFOL. The first fan-out line FFOL may electrically connect a data driver DDV (refer to FIG. 1) to the fourth pixels PXL4 disposed on pixel columns of the fourth display region DA4.

In an exemplary embodiment of the invention, the first fan-out line FFOL may include a (1-1)th fan-out line FFOL_1 and a (1-2)th fan-out line FFOL_2, which are alternately disposed on the substrate SUB.

The second fan-out line block FOLB2 may include a second fan-out line SFOL. The second fan-out line SFOL may electrically connect the data driver DDV to the first pixels PXL1 disposed on pixel columns extending to the (1-1)th display region DA1_1 in the (1-2)th display region DA1_2. The second fan-out line SFOL may overlap with the first fan-out line FFOL in a plan view.

The fan-out line unit may further include a third fan-out line TFOL.

In a plan view, the first fan-out line block FOLB1 may overlap with the second fan-out line block FOLB2.

In an exemplary embodiment of the invention, the first driving voltage line DVL1 may be disposed in the non-display region NDA to correspond to the lower portion of the third display region DA3. The first driving voltage line DVL1 may directly apply the first power voltage ELVDD to the third pixels PXL3 through the second power line PL2. In addition, the first power voltage ELVDD may be directly applied to some first pixels PXL1 that share the same second power line PL2 with the third pixels PXL3. The first power voltage ELVDD may be applied to the other pixels PXL except the third pixels PXL3 and the some first pixels PXL1 due to an electrical connection relationship of the second power lines PL2 provided to the respective pixels PXL.

According to the exemplary embodiment of the invention, the first driving voltage line DVL1 is disposed in the non-display region NDA to correspond to only a partial display region, so that the area occupied by the first driving voltage line DVL1 in the non-display region NDA may be decreased. Consequently, according to the exemplary embodiment of the invention, the area of dead spaces in the non-display region NDA may be minimized.

Hereinafter, a structure of the non-display region NDA in the display device according to the exemplary embodiment of the invention will be described along a stacking order with reference to FIGS. 8A and 8B.

A gate insulating layer GI may be disposed on the substrate SUB.

The (1-1)th fan-out line FFOL_1 may be disposed on the gate insulating layer GI.

A first inter-insulating layer ILD1 may be disposed on the substrate SUB on which the (1-1)th fan-out line FFOL_1 is disposed.

The (1-2)th fan-out line FFOL_2 may be disposed on the first inter-insulating layer ILD1. The (1-2)th fan-out line FFOL_2 may be alternately disposed with the (1-1)th fan-out line FFOL_1 on the first inter-insulating layer ILD1.

A second inter-insulating layer ILD2 may be provided over the (1-2)th fan-out line FFOL_2.

The second driving voltage line DVL2 and the signal line unit WLP may be provided on the second inter-insulating layer ILD2.

A third inter-insulating layer ILD3 may be disposed on the substrate SUB on which the second driving voltage line DVL2 and the signal line unit WLP are disposed.

The second fan-out line SFOL may be disposed on the third inter-insulating layer ILD3.

A protective layer PSV, a pixel defining layer PDL, and a thin film encapsulation layer TFE may be sequentially provided over the second fan-out line SFOL.

In an exemplary embodiment of the invention, the first fan-out line FFOL, the second fan-out line SFOL, and the second driving voltage line DVL2 may be provided in layers different from one another. The second fan-out line SFOL may be disposed on the first fan-out line FFOL, to cover the first fan-out line FFOL. In a plan view, the second fan-out line SFOL may overlap with the first fan-out line FFOL. The second fan-out line SFOL and the first fan-out line FFOL may partially overlap with each other, but the invention is not limited thereto. In some exemplary embodiments, the second fan-out line SFOL and the first fan-out line FFOL may completely overlap with each other.

As described above, in the display device according to the exemplary embodiment of the invention, the second fan-out line SFOL is designed to overlap with the first fan-out line FFOL, so that the area or width (refer to d1 of FIG. 6A) occupied by the second fan-out line SFOL in the non-display region NDA may be decreased. Accordingly, the area of dead spaces in the non-display region NDA may be minimized.

Figure 9A:
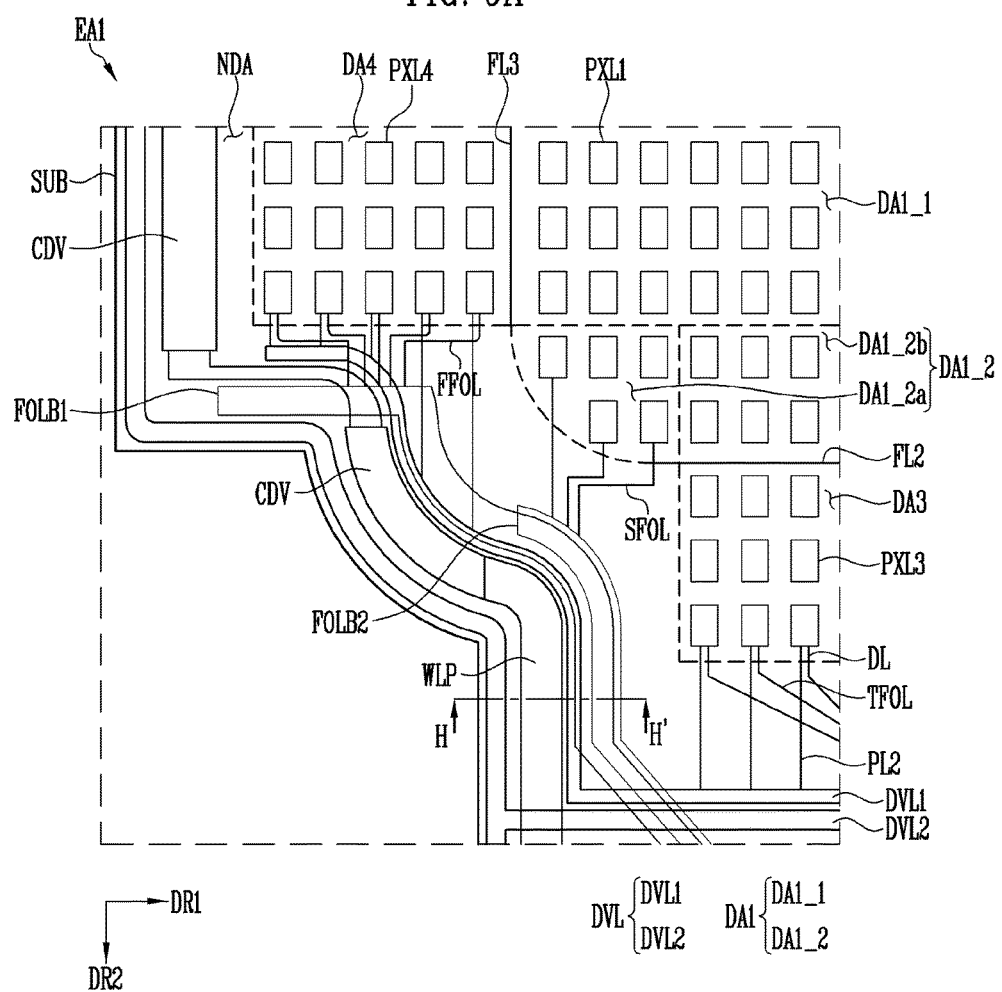
FIG. 9A illustrates an exemplary embodiment of a portion of a display device according to the invention, which is a plan view corresponding to the portion EA1 of FIG. 1.

FIG. 9A illustrates a portion of a display device according to an exemplary embodiment of the invention, which is a plan view corresponding to the portion EA1 of FIG. 1, and FIG. 9B is a cross-sectional view taken along line H-H' of FIG. 9A. In FIGS. 9A and 9B, portions different from those of the above-described embodiment will be mainly described to avoid redundancy. Portions not particularly described in the exemplary embodiment of the invention follow those of the above-described embodiment. In addition, identical reference numerals refer to identical components, and similar reference numerals refer to similar components.

Referring to FIGS. 1 to 5, 9A, and 9B, the display device according to the exemplary embodiment of the invention may include a substrate SUB including a first display region DA1, a second display region DA2, a third display region DA3, a fourth display region DA4, a fifth display region DA5 and a non-display region NDA, a plurality of pixels PXL provided on the substrate SUB, and a line unit connected to the pixels PXL.

The pixels PXL may include first pixels PXL1 arranged in the first display region DA1, second pixels PXL2 arranged in the second display region DA2, third pixels PXL3 arranged in the third display region DA3, fourth pixels PXL4 arranged in the fourth display region DA4, and fifth pixels PXL5 arranged in the fifth display region DA5.

The first display region DA1 may include a (1-1)th display region DA1_1 and a (1-2)th display region DA1_2. The (1-2)th display region DA1_2 may include a first region DA1_2a including a curved line connecting two adjacent linear sides and a second region DA1_2b except the first region DA1_2a. The first region DA1_2a may be a corner portion of the (1-2)th display region DA1_2. The (1-2)th display region DA1_2 may have a shape of which a width decreases as it becomes farther from the (1-1)th display region DA1_1 in a second direction DR2. Accordingly, in the (1-2)th display region DA1_2, the number of first pixels PXL1 provided on each pixel row may decrease as they become farther from the (1-1)th display region DA1_1.

First and second driving voltage lines DVL1 and DVL2, a driving unit, and a fan-out line unit may be disposed in the non-display region NDA.

The first driving voltage line DVL1 may apply a first power voltage ELVDD to each pixel PXL, and the second driving voltage line DVL2 may apply a second power voltage ELVSS to each pixel PXL.

In a plan view, the first driving voltage line DVL1 may be disposed to surround at least one side of the third display region DA3, at least one side of the (1-2)th display region DA1_2, and at least one side of the fourth display region DA4. In an exemplary embodiment of the invention, the first driving voltage line DVL1 may apply the first power voltage ELVDD to a corresponding pixel PXL through a second power line PL2.

As shown in FIGS. 4A and 4B, in each pixel PXL, the second power line PL2 may include a first part PL2a extending in the first direction DR1, a second part PL2b extending in the second direction DR2, and a third part PL2c in which the first part PL2a and the second part PL2b overlap. The first part PL2a, the second part PL2b, and the third part PL2c may be provided integrally. Due to a structural characteristic of the second power line PL2, a second power line PL2 disposed in one pixel PXL and a second power line PL2 disposed in a pixel adjacent to the one pixel PXL may be electrically connected to each other. Accordingly, the first power voltage ELVDD may be uniformly supplied to the one pixel PXL and the pixel PXL adjacent thereto. Consequently, the first power voltage ELVDD may be uniformly supplied to each of the pixels PXL provided in the first display region DA1, the second display region DA2, the third display region DA3, the fourth display region, DA4, and the fifth display region DA5.

The fan-out line unit may include a first fan-out line block FOLB1 and a second fan-out line block FOLB2.

The first fan-out line block FOLB1 may include a first fan-out line FFOL. The first fan-out line FFOL may electrically connect a data driver DDV (refer to FIG. 1) to the fourth pixels PXL4 disposed on pixel columns of the fourth display region DA4. In an exemplary embodiment of the invention, the first fan-out line FFOL may overlap with the first driving voltage line DVL1 in a plan view.

In an exemplary embodiment of the invention, the first fan-out line FFOL may include a (1-1)th fan-out line FFOL_1 and a (1-2)th fan-out line FFOL_2, which are alternately disposed on the substrate SUB.

The second fan-out line block FOLB2 may include a second fan-out line SFOL. The second fan-out line SFOL may electrically connect the data driver DDV to the first pixels PXL1 disposed on pixel columns extending to the (1-1)th display region DA1_1 from the first region DA1_2a of the (1-2)th display region DA1_2. The second fan-out line SFOL may overlap with the first fan-out line FFOL in a plan view.

The fan-out line unit may further include a third fan-out line TFOL.

Hereinafter, a structure of the non-display region NDA in the display device according to the exemplary embodiment of the invention will be described along a stacking order with reference to FIGS. 9A and 9B.

A gate insulating layer GI may be disposed on the substrate SUB.

The (1-1)th fan-out line FFOL_1 may be disposed on the gate insulating layer GI.

A first inter-insulating layer ILD1 may be disposed on the substrate SUB on which the (1-1)th fan-out line FFOL_1 is disposed.

The (1-2)th fan-out line FFOL_2 may be disposed on the first inter-insulating layer ILD1. The (1-2)th fan-out line FFOL_2 may be alternately disposed with the (1-1)th fan-out line FFOL_1 on the first inter-insulating layer ILD1.

A second inter-insulating layer ILD2 may be provided over the (1-2)th fan-out line FFOL_2.

The first and second driving voltage lines DVL1 and DVL2 and the signal line unit WLP may be provided on the second inter-insulating layer ILD2.

A third inter-insulating layer ILD3 may be disposed on the substrate SUB on which the first and second driving voltage lines DVL1 and DVL2 are disposed.

The second fan-out line SFOL may be disposed on the third inter-insulating layer ILD3.

A protective layer PSV, a pixel defining layer PDL, and a thin film encapsulation layer TFE may be sequentially provided over the second fan-out line SFOL.

In an exemplary embodiment of the invention, the first fan-out line FFOL, the second fan-out line SFOL, and the first and second driving voltage lines DVL1 and DVL2 may be provided in layers different from one another. In an exemplary embodiment, among the first and second driving voltage lines DVL1 and DVL2, the first fan-out line FFOL, and the second fan-out line SFOL, the second fan-out line SFOL may be disposed in the uppermost layer, and the first fan-out line FFOL may be disposed in the lowermost layer. As shown in the drawings, the first driving voltage line DVL1 and the second driving line DVL2 may be provided in the same layer, but the invention is not limited thereto. In some exemplary embodiments, the first driving voltage line DVL1 and the second driving line DVL2 may be provided in layers different from each other.

In an exemplary embodiment of the invention, the second fan-out line SFOL may be disposed on the first fan-out line FFOL, to cover a portion of the first fan-out line FFOL. In a plan view, the second fan-out line SFOL may partially overlap with the first fan-out line FFOL. In addition, the first driving voltage line DVL1 may be disposed on the first fan-out line FFOL, to cover the other portion of the first fan-out line FFOL. In a plan view, the first driving voltage line DVL1 may partially overlap with the first fan-out line FFOL.

In an exemplary embodiment of the invention, it is illustrated that the second fan-out line SFOL and the first driving voltage line DVL1 do not overlap with each other, but the invention is not limited thereto. In some exemplary embodiments, the second fan-out line SFOL and the first driving voltage line DVL1 may partially or completely overlap with each other, for example.

As described above, in the display device according to the exemplary embodiment of the invention, the second fan-out line SFOL may be designed to overlap with a portion of the first fan-out line FFOL, and the first driving voltage line DVL1 may be designed to overlap with the other portion of the first fan-out line FFOL. Thus, in the display device according to the exemplary embodiment of the invention, the area occupied by the second fan-out line SFOL and the area occupied by the first driving voltage line DVL1 in the non-display region NDA may be decreased. Accordingly, the area of dead spaces in the non-display region NDA may be decreased.

Figure 10A:
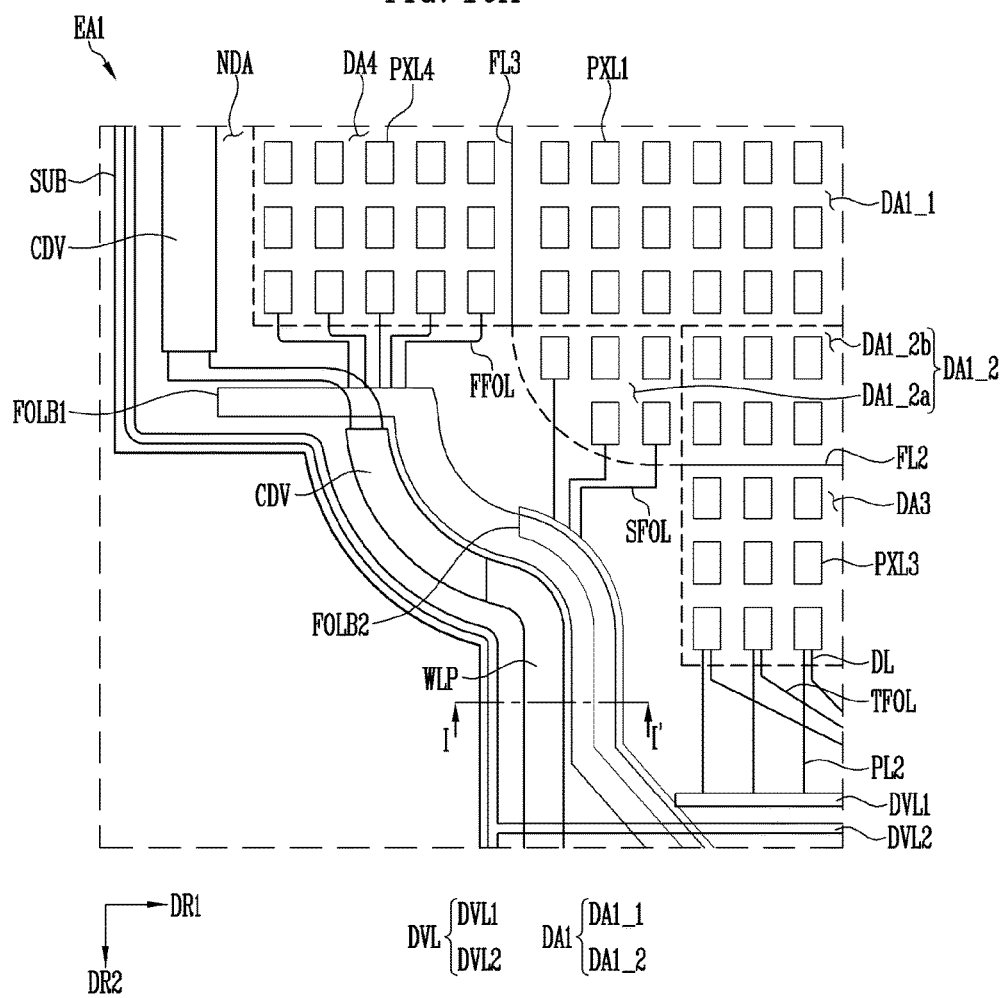
FIG. 10A illustrates an exemplary embodiment of a portion of a display device according to the invention, which is a plan view corresponding to the portion EA1 of FIG. 1.
Figure 10B:
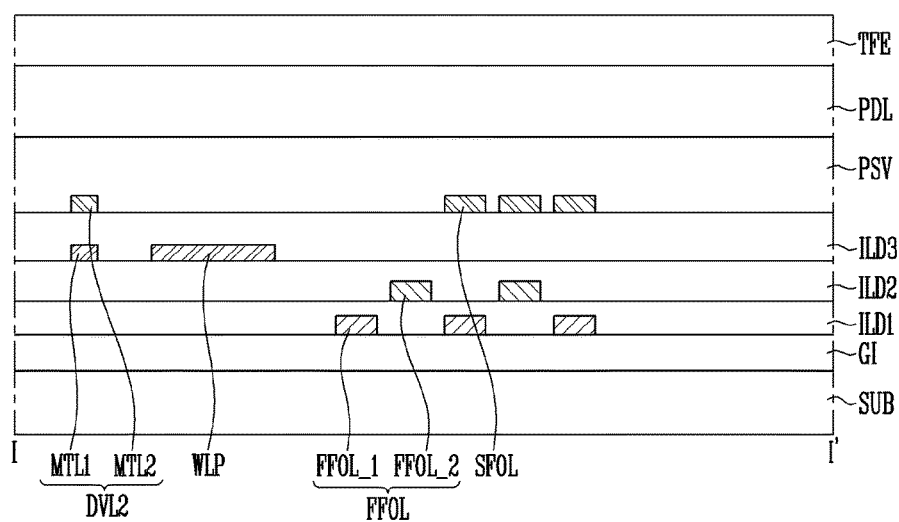
FIG. 10B is a cross-sectional view taken along line I-I' of FIG. 10A.

FIG. 10A illustrates a portion of a display device according to an exemplary embodiment of the invention, which is a plan view corresponding to the portion EA1 of FIG. 1, and FIG. 10B is a cross-sectional view taken along line I-I' of FIG. 10A. In FIGS. 10A and 10B, portions different from those of the above-described embodiment will be mainly described to avoid redundancy. Portions not particularly described in the exemplary embodiment of the invention follow those of the above-described embodiment. In addition, identical reference numerals refer to identical components, and similar reference numerals refer to similar components.

Referring to FIGS. 1 to 5, 10A, and 10B, the display device according to the exemplary embodiment of the invention may include a substrate SUB including a first display region DA1, a second display region DA2, a third display region DA3, a fourth display region DA4, a fifth display region DA5 and a non-display region NDA, a plurality of pixels PXL provided on the substrate SUB, and a line unit connected to the pixels PXL.

The pixels PXL may include first pixels PXL1 arranged in the first display region DA1, second pixels PXL2 arranged in the second display region DA2, third pixels PXL3 arranged in the third display region DA3, fourth pixels PXL4 arranged in the fourth display region DA4, and fifth pixels PXL5 arranged in the fifth display region DA5.

The first display region DA1 may include a (1-1)th display region DA1_1 and a (1-2)th display region DA1_2. The (1-2) the display region DA1_2 may include a first region DA1_2a including a curved line connecting two adjacent linear sides and a second region DA1_2b except the first region DA1_2a. The first region DA1_2a may be a corner portion of the (1-2) the display region DA1_2. The (1-2)th display region DA1_2 may have a shape of which a width decreases as it becomes farther from the (1-1)th display region DA1_1 in a second direction DR2. Accordingly, in the (1-2)th display region DA1_2, the number of first pixels PXL1 provided on each pixel row may decrease as they become farther from the (1-1)th display region DA1_1.

First and second driving voltage lines DVL1 and DVL2, a driving unit, and a fan-out line unit may be disposed in the non-display region NDA.

The first driving voltage line DVL1 may apply a first power voltage ELVDD to each pixel PXL, and the second driving voltage line DVL2 may apply a second power voltage ELVSS to each pixel PXL.

The first driving voltage line DVL1 is disposed to correspond to an outside of the third display region DA3, and may be electrically connected to the third pixels PXL3 through a second power line PL2. Therefore, the first power voltage ELVDD from the first driving voltage line DVL1 may be supplied to the third pixels PXL3 through the second power line PL2. In each third pixel PXL3, the second power line PL2, as shown in FIGS. 4A and 4B, may include a first part PL2a extending in a first direction DR1, a second part PL2b extending in a second direction DR2, and a third part PL2c in which the first part PL2a and the second part PL2b overlap.

The second driving voltage line DVL2 may be configured as a double layer including a first metal layer MTL1 and a second metal layer MTL2. The second metal layer MTL2 may be disposed on the first metal layer MTL1 to overlap with the first metal layer MTL1 in a plan view. The second metal layer MTL2 may be electrically connected to the first metal layer MTL1.

The fan-out line unit may include a first fan-out line block FOLB1 and a second fan-out line block FOLB2.

The first fan-out line block FOLB1 may include a first fan-out line FFOL. The first fan-out line FFOL may electrically connect a data driver DDV (refer to FIG. 1) to the fourth pixels PXL4 disposed on pixel columns of the fourth display region DA4.

In an exemplary embodiment of the invention, the first fan-out line FFOL may include a (1-1)th fan-out line FFOL_1 and a (1-2)th fan-out line FFOL_2, which are alternately disposed on the substrate SUB.

The second fan-out line block FOLB2 may include a second fan-out line SFOL. The second fan-out line SFOL may electrically connect the data driver DDV to the first pixels PXL1 disposed on pixel columns extending to the (1-1)th display region DA1_1 in the (1-2)th display region DA1_2. The second fan-out line SFOL may overlap with the first fan-out line FFOL in a plan view.

The fan-out line unit may further include a third fan-out line TFOL.

In an exemplary embodiment of the invention, the first driving voltage line DVL1 may directly apply the first power voltage ELVDD to the third pixels PXL3 through the second power line PL2. In addition, the first power voltage ELVDD may also be directly applied to some first pixels PXL1 that share the same second power line PL2 with the third pixels PXL3. The first power voltage ELVDD may be applied to the other pixels PXL except the third pixels PXL3 and the some first pixels PXL1 due to an electrical connection relationship of the second power lines PL2 provided to the respective pixels PXL.

According to the exemplary embodiment of the invention, the first driving voltage line DVL1 is disposed in the non-display region NDA to correspond to only a partial display region, so that the area occupied by the first driving voltage line DVL1 in the non-display region NDA may be decreased. Consequently, according to the exemplary embodiment of the invention, the area of dead spaces in the non-display region NDA may be minimized.

Hereinafter, a structure of the non-display region NDA in the display device according to the exemplary embodiment of the invention will be described along a stacking order with reference to FIGS. 10A and 10B.

A gate insulating layer GI may be disposed on the substrate SUB.

The (1-1)th fan-out line FFOL_1 may be disposed on the gate insulating layer GI.

A first inter-insulating layer ILD1 may be disposed on the substrate SUB on which the (1-1)th fan-out line FFOL_1 is disposed.

The (1-2)th fan-out line FFOL_2 may be disposed on the first inter-insulating layer ILD1. The (1-2)th fan-out line FFOL_2 may be alternately disposed with the (1-1)th fan-out line FFOL_1 on the first inter-insulating layer ILD1.

A second inter-insulating layer ILD2 may be provided over the (1-2)th fan-out line FFOL_2.

The first metal layer MTL1 and the signal line unit WLP may be provided on the second inter-insulating layer ILD2.

A third inter-insulating layer ILD3 may be disposed on the substrate SUB on which the first metal layer MTL1 and the signal line unit WLP are disposed.

The second metal layer MTL2 and the second fan-out line SFOL may be disposed on the third inter-insulating layer ILD3.

A protective layer PSV, a pixel defining layer PDL, and a thin film encapsulation layer TFE may be sequentially provided over the second metal layer MTL2 and the second fan-out line SFOL.

In an exemplary embodiment of the invention, the second metal layer MTL2 may be provided in the same layer as the second fan-out line SFOL. In addition, in a plan view, the second metal layer MTL2 covers the first metal layer MTL1, and may have a width equal to that of the first metal layer MTL1. As the first and second metal layers MTL1 and MTL2 are electrically connected to each other, the second driving voltage line DVL2 may be configured as a double layer. As described above, when the second driving voltage line DVL2 is configured as the double layer, the width of the second driving voltage line DVL2 may correspond to a half of that of the second driving voltage line DVL2 configured as a single layer as shown in FIG. 6A. Although the width of the second driving voltage line DVL2 is decreased, when the second driving voltage line DVL2 is configured as the double layer, the second driving voltage line DVL2 may have the same line resistance as the second driving voltage line DVL2 configured as the single layer.

In the display device according to the exemplary embodiment of the invention, the second fan-out line SFOL is designed to overlap with the first fan-out line FFOL, so that the area or width occupied by the second fan-out line SFOL in the non-display region NDA may be decreased. Accordingly, the area of dead spaces in the non-display region NDA may be minimized.

Further, in the display device according to the exemplary embodiment of the invention, the second driving voltage line DVL2 is configured as a double layer, so that the area or width occupied by the second driving voltage line DVL2 in the non-display region NDA may be decreased. Accordingly, the area of dead spaces in the non-display region NDA may be minimized.

Figure 11A:
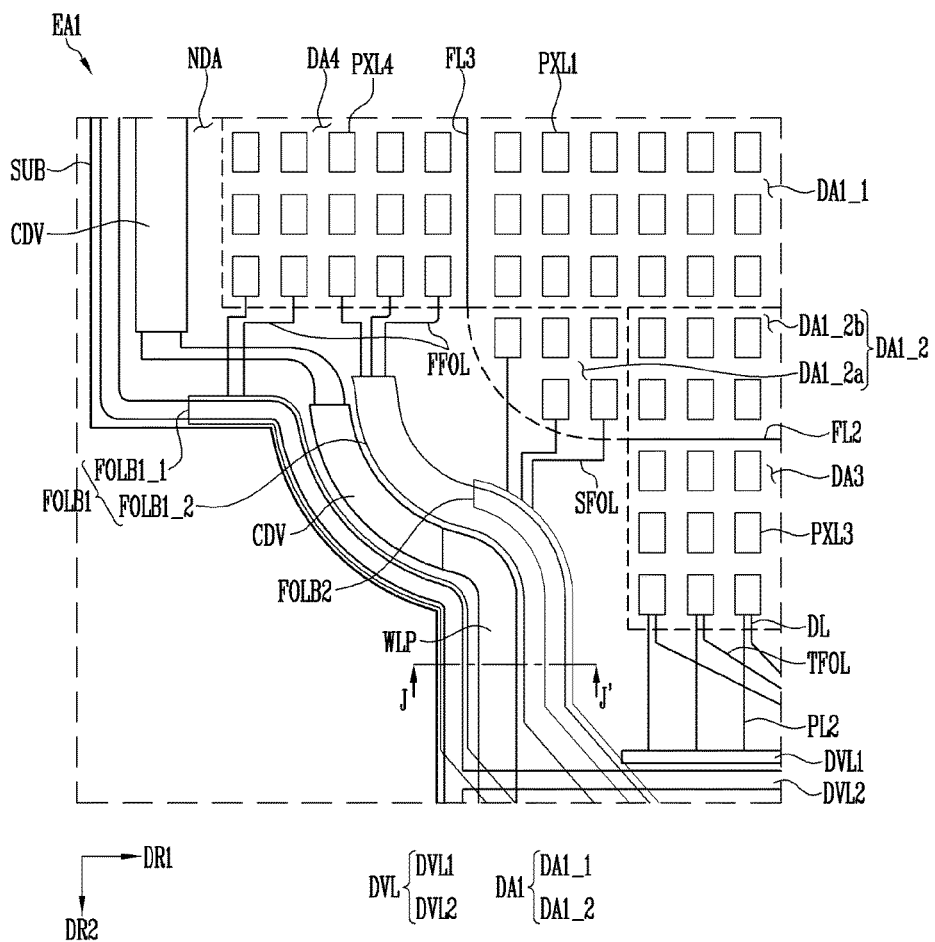
FIG. 11A illustrates an exemplary embodiment of a portion of a display device according to the invention, which is a plan view corresponding to the portion EA1 of FIG. 1.
Figure 11B:
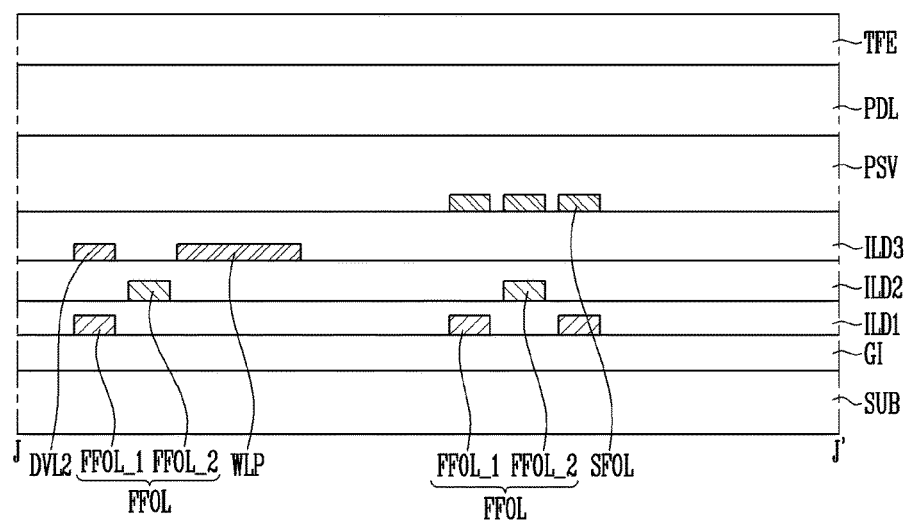
FIG. 11B is a cross-sectional view taken along line J-J' of FIG. 11A.

FIG. 11A illustrates a portion of a display device according to an exemplary embodiment of the invention, which is a plan view corresponding to the portion EA1 of FIG. 1, and FIG. 11B is a cross-sectional view taken along line J-J' of FIG. 11A. In FIGS. 11A and 11B, portions different from those of the above-described embodiment will be mainly described to avoid redundancy. Portions not particularly described in the exemplary embodiment of the invention follow those of the above-described embodiment. In addition, identical reference numerals refer to identical components, and similar reference numerals refer to similar components.

Referring to FIGS. 1 to 5, 11A, and 11B, the display device according to the exemplary embodiment of the invention may include a substrate SUB including a first display region DA1, a second display region DA2, a third display region DA3, a fourth display region DA4, a fifth display region DA5 and a non-display region NDA, a plurality of pixels PXL disposed on the substrate SUB, and a line unit connected to the pixels PXL.

The pixels PXL may include first pixels PXL1 arranged in the first display region DA1, second pixels PXL2 arranged in the second display region DA2, third pixels PXL3 arranged in the third display region DA3, fourth pixels PXL4 arranged in the fourth display region DA4, and fifth pixels PXL5 arranged in the fifth display region DA5.

The first display region DA1 may include a (1-1)th display region DA1_1 and a (1-2)th display region DA1_2. The (1-2)th display region DA1_2 may include a first region DA1_2a including a curved line connecting two adjacent linear sides and a second region DA1_2b except the first region DA1_2a. The first region DA1_2a may be a corner portion of the (1-2)th display region DA1_2. The (1-2)th display region DA1_2 may have a shape of which a width decreases as it becomes farther from the (1-1)th display region DA1_1 in a second direction DR2. Accordingly, in the (1-2)th display region DA1_2, the number of first pixels PXL1 provided on each pixel row may decrease as they become farther from the (1-1)th display region DA1_1.

First and second driving voltage lines DVL1 and DVL2, a driving unit, and a fan-out line unit may be disposed in the non-display region NDA.

The first driving voltage line DVL1 may apply a first power voltage ELVDD to each pixel PXL, and the second driving voltage line DVL2 may apply a second power voltage ELVSS to each pixel PXL.

The first driving voltage line DVL1 is disposed to correspond to an outside of the third display region DA3, and may be electrically connected to the third pixels PXL3 through a second power line PL2. Therefore, the first power voltage ELVDD from the first driving voltage line DVL1 may be applied to the third pixels PXL3 through the second power line PL2.

The fan-out line unit may include a first fan-out line block FOLB1 and a second fan-out line block FOLB2.

The first fan-out line block FOLB1 may include a (1-1)th fan-out line block FOLB1_1 and a (1-2)th fan-out line block FOLB1_2. Each of the (1-1)th fan-out line block FOLB1_1 and the (1-2)th fan-out line block FOLB1_2 may include a first fan-out line FFOL. In a plan view, the (1-1)th fan-out line block FOLB1_1 may overlap with the second driving voltage line DVL2, and the (1-2)th fan-out line block FOLB1_2 may overlap with the second fan-out line block FOLB2.

The first fan-out line FFOL disposed in each of the (1-1)th fan-out line block FOLB1_1 and the (1-2)th fan-out line block FOLB1_2 may electrically connect the data driver DDV to the fourth pixels PXL4 disposed on pixel columns of the fourth display region DA4.

In an exemplary embodiment of the invention, the first fan-out line FFOL may include a (1-1)th fan-out line FFOL_1 and a (1-2)th fan-out line FFOL_2, which are alternately disposed.

The second fan-out line block FOLB2 may include a second fan-out line SFOL. The second fan-out line SFOL may electrically connect the data driver DDV to the first pixels PXL1 disposed on pixel columns extending to the (1-1)th display region DA1_1 in the (1-2)th display region DA1_2.

The fan-out line unit may further include a third fan-out line TFOL.

In an exemplary embodiment of the invention, the first driving voltage line DVL1 may be disposed in the non-display region NDA to correspond to an outside of the third display region DA3. The first driving voltage line DVL1 may directly apply the first power voltage ELVDD to the third pixels PXL3 through the second power line PL2. In addition, the first power voltage ELVDD may also be applied to some first pixels PXL that share the same second power line PL2 as the third pixels PXL3 among the first pixels PXL1. The first power voltage ELVDD may also be applied to the third pixels PXL3 and the other pixels PXL1 except the some first pixels PXL1 among the first pixels PXL1 due to a structural characteristic of of the second power line PL2 provided in each pixel PXL.

In the display device according to the exemplary embodiment of the invention, the first driving voltage line DVL1 is disposed to correspond to only a partial display region, so that the area occupied by the first driving voltage line DVL1 in the non-display region NDA may be decreased. Consequently, according to the exemplary embodiment of the invention, the area of dead spaces in the non-display region NDA may be minimized.

Hereinafter, a structure of the non-display region NDA in the display device according to the exemplary embodiment of the invention will be described along a stacking order with reference to FIGS. 11A and 11B.

A gate insulating layer GI may be disposed on the substrate SUB.

The (1-1)th fan-out line FFOL_1 may be disposed on the gate insulating layer GI. The (1-1)th fan-out line FFOL_1 disposed in the (1-1)th fan-out line block FOLB1_1 and the (1-1)th fan-out line FFOL_1 disposed in the (1-2)th fan-out line block FOLB1_2 may be disposed on the gate insulating layer GI to be spaced apart from each other at a certain distance.

A first inter-insulating layer ILD1 may be disposed on the substrate SUB on which the (1-1)th fan-out line FFOL_1 is disposed.

The (1-2)th fan-out line FFOL_2 may be disposed on the first inter-insulating layer ILD1. The (1-2)th fan-out line FFOL_2 may be alternately disposed with the (1-1)th fan-out line FFOL_1 on the first inter-insulating layer ILD1.

A second inter-insulating layer ILD2 may be disposed on the (1-2)th fan-out line FFOL_2.

The second driving voltage line DVL2 and the signal line unit WLP may be disposed on the second inter-insulating layer ILD2. Here, the second driving voltage line DVL2 may be disposed on the second inter-insulating layer ILD2 to overlap with the (1-1)th fan-out line FFOL_1 disposed in the (1-1)th fan-out line block FOLB1_1.

A third inter-insulating layer ILD3 may be disposed on the substrate SUB on which the second driving voltage line DVL2 and the signal line unit WLP are disposed.

The second fan-out line SFOL may be disposed on the third inter-insulating layer ILD3. Here, the second fan-out line SFOL may be disposed on the third inter-insulating layer ILD3 to overlap with the first fan-out line FFOL provided in the (1-2)th fan-out line block FOLB1_2.

A protective layer PSV, a pixel defining layer PDL, and a thin film encapsulation layer TFE may be sequentially provided over the second fan-out lines SFOL.

In an exemplary embodiment of the invention, the first fan-out line FFOL, the second driving voltage line DVL2, and the second fan-out line SFOL may be provided in layers different from one another. In an exemplary embodiment, the second fan-out line SFOL among the second driving voltage line DVL2 and the first and second fan-out lines FFOL and SFOL may be in the uppermost layer, and the (1-1)th fan-out line FFOL_1 in the first fan-out line FFOL may be disposed in the lowermost layer, for example.

As described above, in the display device according to the exemplary embodiment of the invention, a portion of the first fan-out line FFOL may be designed to overlap with the second driving voltage line DVL2, and the other portion of the first fan-out line FFOL may be designed to overlap with the second fan-out line SFOL. Thus, in the display device according to the exemplary embodiment of the invention, the area occupied by the first fan-out line FFOL in the non-display region NDA is decreased, so that the area of dead spaces in the non-display region NDA may be minimized.

Figure 12A:
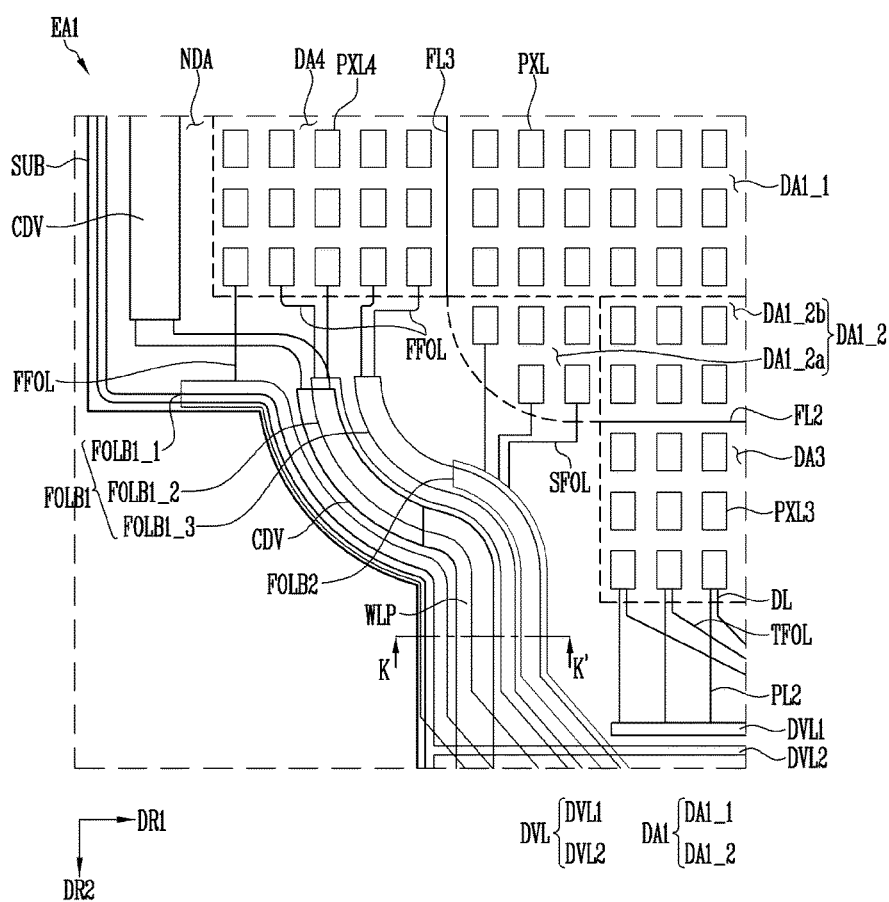
FIG. 12A illustrates an exemplary embodiment of a portion of a display device according to the invention, which is a plan view corresponding to the portion EA1 of FIG. 1.
Figure 12B:
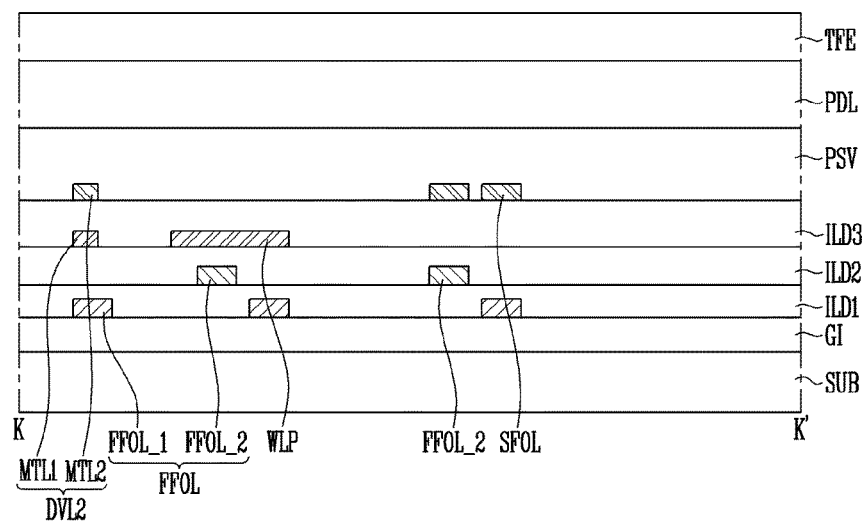
FIG. 12B is a cross-sectional view taken along line K-K' of FIG. 12A.

FIG. 12A illustrates a portion of a display device according to an exemplary embodiment of the invention, which is a plan view corresponding to the portion EA1 of FIG. 1, and FIG. 12B is a cross-sectional view taken along line K-K' of FIG. 12A. In FIGS. 12A and 12B, portions different from those of the above-described embodiment will be mainly described to avoid redundancy. Portions not particularly described in the exemplary embodiment of the invention follow those of the above-described embodiment. In addition, identical reference numerals refer to identical components, and similar reference numerals refer to similar components.

Referring to FIGS. 1 to 5, 12A, and 12B, the display device according to the exemplary embodiment of the invention may include a substrate SUB including a first display region DA1, a second display region DA2, a third display region DA3, a fourth display region DA4, a fifth display region DA5 and a non-display region NDA, a plurality of pixels PXL disposed on the substrate SUB, and a line unit connected to the pixels PXL.

The pixels PXL may include first pixels PXL1 disposed in the first display region DA1, second pixels PXL2 disposed in the second display region DA2, third pixels PXL3 disposed in the third display region DA3, fourth pixels PXL4 disposed in the fourth display region DA4, and fifth pixels PXL5 disposed in the fifth display region DA5.

The first display region DA1 may include a (1-1)th display region DA1_1 and a (1-2)th display region DA1_2. The (1-2)th display region DA1_2 may include a first region DA1_2a including a curved line connecting two adjacent linear sides and a second region DA1_2b except the first region DA1_2a. The first region DA1_2a may be a corner portion of the (1-2)th display region DA1_2. The (1-2)th display region DA1_2 may have a shape of which a width decreases as it becomes farther from the (1-1)th display region DA1_1 in a second direction DR2. Accordingly, in the (1-2)th display region DA1_2, the number of first pixels PXL1 provided on each pixel row may decrease as they become farther from the (1-1)th display region DA1_1.

First and second driving voltage lines DVL1 and DVL2, a driving unit, and a fan-out line unit may be disposed in the non-display region NDA.

The first driving voltage line DVL1 may apply a first power voltage ELVDD to each pixel PXL, and the second driving voltage line DVL2 may apply a second power voltage ELVSS to each pixel PXL.

The first driving voltage line DVL1 is disposed to correspond to an outside of the third display region DA3, and may be electrically connected to the third pixels PXL3 through a second power line PL2. Therefore, the first power voltage ELVDD from the first driving voltage line DVL1 may be applied to the third pixels PXL3 through the second power line PL2. In each third pixel PXL3, the second power line PL2, as shown in FIGS. 4A and 4B, may include a first part PL2a extending in a first direction DR1, a second part PL2b extending in a second direction DR2, and a third part PL2c in which the first part PL2a and the second part PL2b overlap.

The second driving voltage line DVL2 may be configured as a double layer including a first metal layer MTL1 and a second metal layer MTL2. The second metal layer MTL2 may be disposed on the first metal layer MTL1 to overlap with the first metal layer MTL1 in a plan view. The second metal layer MTL2 may be electrically connected to the first metal layer MTL1.

The driving unit may be disposed between the second driving voltage line DVL2 and the fan-out line unit, and include a circuit driver CDV and a signal line unit WLP connected to the circuit driver CDV. The circuit driver CDV may include at least one transistor (not shown), and the signal line unit WLP may include a plurality of signal lines connected to the transistor.

The fan-out line unit may include a first fan-out line block FOLB1 and a second fan-out line block FOLB2.

The first fan-out line block FOLB1 may include (1-1)th to (1-3)th fan-out line blocks FOLB1_1 to FOLB1_3.

The (1-1)th fan-out line block FOLB1_1 may overlap with the second driving voltage line DVL2 in a plan view, and be disposed at the outermost portion of the first fan-out line block FOLB1. The (1-2)th fan-out line block FOLB1_2 may overlap with the signal line unit WLP in a plan view, and be provided between the (1-1)th fan-out line block FOLB1_1 and the (1-3)th fan-out line block FOLB1_3. The (1-3)th fan-out line block FOLB1_3 may overlap with the second fan-out line block FOLB2, and be provided at the innermost side of the first fan-out line block FOLB1.

Each of the (1-1)th to (1-3)th fan-out line blocks FOLB1_1 to FOLB1_3 may include a first fan-out line FFOL. The first fan-out line FFOL disposed in each of the (1-1)th to (1-3)th fan-out line blocks FOLB1_1 to FOLB1_3 may electrically connect the data driver DDV to the fourth pixels PXL4 disposed on pixel columns of the fourth display region DA4.

In an exemplary embodiment of the invention, the first fan-out line FFOL may include a (1-1)th fan-out line FFOL_1 and a (1-2)th fan-out line FFOL_2, which are alternately disposed on the substrate SUB.

The second fan-out line block FOLB2 may include a second fan-out line SFOL. The second fan-out line SFOL may electrically connect the data driver DDV to the first pixels PXL1 disposed on pixel columns extending to the (1-1)th display region DA1_1 in the (1-2)th display region DA1_2.

The fan-out line unit may further include a third fan-out line TFOL.

In an exemplary embodiment of the invention, the first driving voltage line DVL1 may directly apply the first power voltage ELVDD to the third pixels PXL3 through the second power line PL2. In addition, the first power voltage ELVDD may also be directly applied to some first pixels PXL1 that share the same second power line PL2 as the third pixels PXL3. The first power voltage ELVDD may also be applied to the other pixels PXL except the third pixels PXL3 and the some first pixels PXL1 due to a structural characteristic of the second power line PL2 provided in each pixel PXL.

In the display device according to the exemplary embodiment of the invention, the first driving voltage line DVL1 is disposed to correspond to only a partial display region, so that the area occupied by the first driving voltage line DVL1 in the non-display region NDA may be decreased. Consequently, according to the exemplary embodiment of the invention, the area of dead spaces in the non-display region may be minimized.

Hereinafter, a structure of the non-display region NDA in the display device according to the exemplary embodiment of the invention will be described along a stacking order with reference to FIGS. 12A and 12B.

A gate insulating layer GI may be disposed on the substrate SUB.

The (1-1)th fan-out line FFOL_1 may be disposed on the first insulating layer GI. Specifically, the (1-1)th fan-out line FFOL_1 provided in the (1-1)th fan-out line block FOLB1_1, the (1-1)th fan-out line FFOL_1 provided in the (1-2)th fan-out line block FOLB1_2, and the (1-1)th fan-out line FFOL_1 provided in the (1-3)th fan-out line block FOLB1_3 may be disposed on the gate insulating layer GI to be spaced apart from each other at a certain distance.

A first inter-insulating layer ILD1 may be disposed on the substrate SUB on which the (1-1)th fan-out line FFOL_1 is disposed.

The (1-2)th fan-out line FFOL_2 may be disposed on the first inter-insulating layer ILD1. Specifically, the (1-2)th fan-out line FFOL_2 provided in the (1-1)th fan-out line block FOLB1_1, the (1-2)th fan-out line FFOL_2 provided in the (1-2)th fan-out line block FOLB1_2, and the (1-2)th fan-out line FFOL_2 provided in the (1-3)th fan-out line block FOLB1_3 may be disposed on the first inter-insulating layer ILD1 to be spaced apart from each other at a certain distance. The (1-2)th fan-out line FFOL_2 may be alternately disposed with the (1-1)th fan-out line FFOL_1 on the first inter-insulating layer ILD1.

A second inter-insulating layer ILD2 may be provided over the (1-2)th fan-out line FFOL_2.

The first metal layer MTL1 and the signal line unit WLP may be disposed on the second inter-insulating layer ILD2. Here, the first metal layer MTL1 may be disposed on the second inter-insulating layer ILD2 to overlap with the (1-1)th fan-out line FFOL_1 provided in the (1-1)th fan-out line block FOLB1_1. The signal line unit WLP may be disposed on the second inter-insulating layer ILD2 to overlap with the first fan-out line FFOL provided in the (1-2)th fan-out line block FOLB1_2.

A third inter-insulating layer ILD3 may be disposed on the substrate SUB on which the first metal layer MTL1 and the signal line unit WLP are disposed.

The second metal layer MTL2 and the second fan-out line SFOL may be disposed on the third inter-insulating layer ILD3. Here, the second metal layer MTL2 may be disposed on the third inter-insulating layer ILD3 to overlap with the first metal layer MTL1. The second fan-out line SFOL may be disposed on the third inter-insulating layer ILD3 to overlap with the first fan-out line FFOL provided in the (1-3)th fan-out line block FOLB1_3.

A protective layer PSV, a pixel defining layer PDL, and a thin film encapsulation layer TFE may be sequentially provided over the second metal layer MTL2 and the second fan-out line SFOL.

In an exemplary embodiment of the invention, the first fan-out line FFOL, the first metal layer MTL1, and the second fan-out line SFOL may be provided in layers different from one another. In an exemplary embodiment, among the first metal layer MTL1 and the first and second fan-out lines FFOL and SFOL, the second fan-out line SFOL may be disposed in the uppermost layer, and the first fan-out line FFOL may be disposed in the lowermost layer, for example.

In an exemplary embodiment of the invention, the second metal layer MTL2 may be provided in the same layer as the second fan-out line SFOL. In addition, in a plan view, the second metal layer MTL2 may cover the first metal layer MTL1, and have the same width as the first metal layer MTL1. The first and second metal layers MTL1 and MTL2 may be electrically connected to each other. Accordingly, the second driving voltage line DVL2 may be configured as a double layer. In some exemplary embodiments, the first and second metal layer MTL1 and MTL2 are connected to each other through a contact hole (not shown) passing through the third inter-insulating layer ILD3.

In the display device according to the exemplary embodiment of the invention, the first fan-out line FFOL provided in the (1-1)th fan-out line block FOLB1_1 may be designed to overlap with the second driving voltage line DVL2, the first fan-out line FFOL provided in the (1-2)th fan-out line block FOLB1_2 may be designed to overlap with the signal line unit WLP, and the first fan-out line FFOL provided in the (1-3)th fan-out line block FOLB1_3 may be designed to overlap with the second fan-out line SFOL. Thus, in the display device according to the exemplary embodiment of the invention, the area occupied by the first fan-out line FFOL in the non-display region NDA is decreased, so that the area of dead spaces in the non-display region NDA may be minimized.

Further, in the display device according to the exemplary embodiment of the invention, as the second driving voltage line DVL2 is configured as a double layer, the width of the second driving voltage line DVL2 is decreased, so that the area occupied by the second driving voltage line DVL2 in the non-display region NDA may be decreased. Accordingly, the area of dead spaces in the non-display region NDA may be minimized.

Figure 13A:
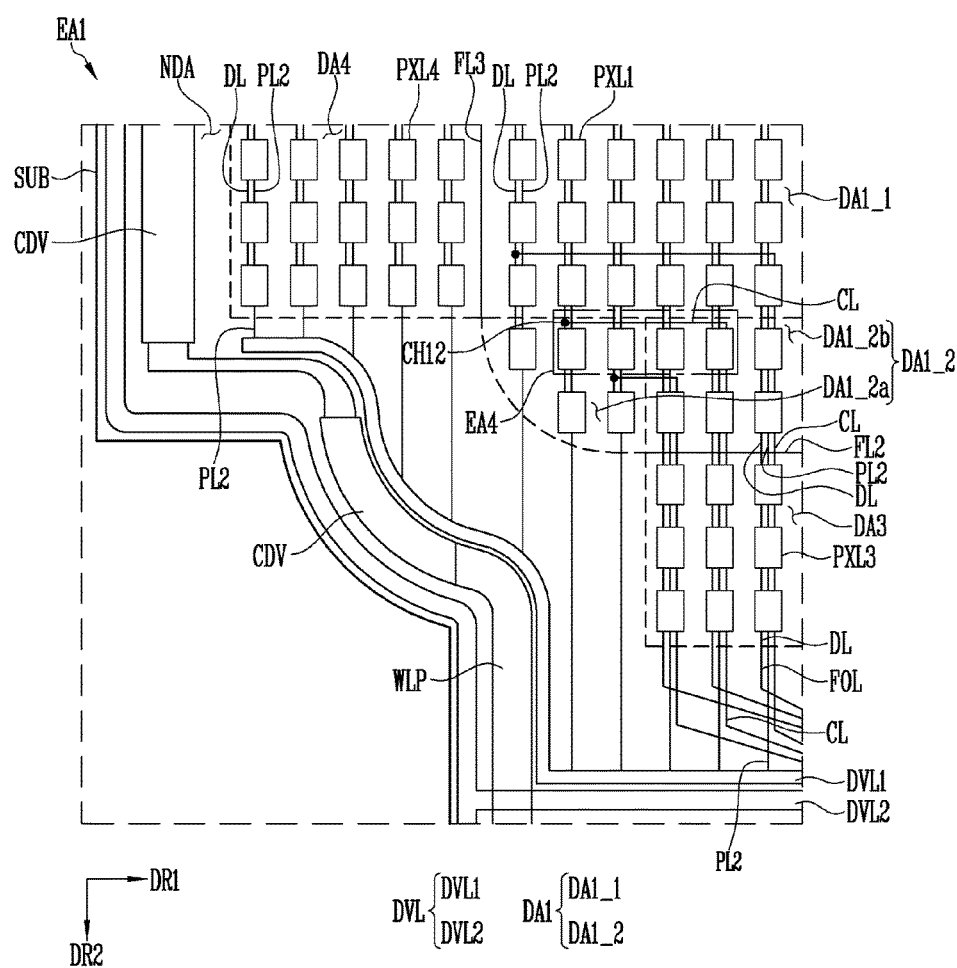
FIG. 13A illustrates an exemplary embodiment of a portion of a display device according to the invention, which is a plan view corresponding to the portion EA1 of FIG. 1.

FIG. 13A illustrates a portion of a display device according to an exemplary embodiment of the invention, which is a plan view corresponding to the portion EA1 of FIG. 1.

Referring to FIGS. 1 to 5 and 13A, the display device according to the exemplary embodiment of the invention may include a substrate SUB including a first display region DA1, a second display region DA2, a third display region DA3, a fourth display region DA4, a fifth display region DA5 and a non-display region NDA, a plurality of pixels PXL disposed on the substrate SUB, and a line unit connected to the pixels PXL.

The pixels PXL may include first pixels PXL1 arranged in the first display region DA1, second pixels PXL2 arranged in the second display region DA2, third pixels PXL3 arranged in the third display region DA3, fourth pixels PXL4 arranged in the fourth display region DA4, and fifth pixels PXL5 arranged in the fifth display region DA5.

The first display region DA1 may include a (1-1)th display region DA1_1 and a (1-2)th display region DA1_2. The (1-2) the display region DA1_2 may include a first region DA1_2a including a curved line connecting two adjacent linear sides and a second region DA1_2b except the first region DA1_2a. The first region DA1_2a may be a corner portion of the (1-2) the display region DA1_2. The (1-2)th display region DA1_2 may have a shape of which a width decreases as it becomes farther from the (1-1)th display region DA1_1 in a second direction DR2. Accordingly, in the (1-2)th display region DA1_2, the number of first pixels PXL1 provided on each pixel row may decrease as they become farther from the (1-1)th display region DA1_1.

First and second driving voltage lines DVL1 and DVL2, a driving unit, and a plurality of fan-out lines FOL may be disposed in the non-display region NDA.

The first driving voltage line DVL1 may apply a first power voltage ELVDD to each pixel PXL, and the second driving voltage line DVL2 may apply a second power voltage ELVSS to each pixel PXL.

In a plan view, the first driving voltage line DVL1 may be disposed to surround at least one side of the third display region DA3, at least one side of the (1-2)th display region DA1_2, and at least one side of the fourth display region DA4. In an exemplary embodiment of the invention, the first driving voltage line DVL1 may apply the first power voltage ELVDD to a corresponding pixel PXL through a second power line PL2.

In each pixel PXL, the second power line PL2, as shown in FIGS. 4A and 4B, may include a first part PL2a extending in a first direction DR1, a second part PL2b extending in the second direction DR2, and a third part PL2c in which the first part PL2*a* and the second part PL2*b* overlap. The first part PL2*a*, the second part PL2*b*, and the third part PL2*c* may be provided integrally. Due to a structural characteristic of the second power line PL2, a second power line PL2 disposed in one pixel PXL and a second power line PL2 disposed in a pixel adjacent to the one pixel PXL may be electrically connected to each other. Accordingly, the first power voltage ELVDD may be uniformly supplied to the one pixel PXL and the pixel PXL adjacent thereto. Consequently, the first power voltage ELVDD may be uniformly supplied to each of the pixels PXL provided in the first display region DA1, the second display region DA2, the third display region DA3, the fourth display region DA4, and the fifth display region DA5.

In a plan view, the second driving voltage line DVL2 may be disposed to surround the first display region DA1, the second display region DA2, the third display region DA3, the fourth display region DA4, and the fifth display region DA5 at the outermost portion of the non-display region NDA.

In an exemplary embodiment of the invention, like the second driving voltage line DVL2 shown in FIGS. 12A and 12B, the second driving voltage line DVL2 may be configured as a double layer including a first metal layer (refer to MTL1 of FIG. 12B) and a second metal layer (refer to MTL2 of FIG. 12B). When the second driving voltage line DVL2 is configured as the double layer, the area occupied by the second driving voltage line DVL2 in the non-display region NDA may be decreased.

The fan-out lines FOL may electrically connect a data driver DDV (refer to FIG. 1) to the third pixels PXL3 disposed on a pixel column of the third display region DA3.

The display device according to the exemplary embodiment of the invention may further include a contact line CL. The contact line CL may extend from the non-display region NDA to the third display region DA3 and the first display region DA1 along the second direction DR2. The contact line CL may be a fan-out line that supplies a data signal from the data driver DDV to each of some first pixels PXL1 and the fourth pixels PXL4.

The contact line CL may extend from the non-display region NDA to the third display region DA3 along the second direction DR2. Also, the contact line CL may extend from the third display region DA3 to the first display region DA1 along the second direction DR2. The contact line CL extending to the first display region DA1 may be bent along the first direction DR1 to extend to a corner portion of the (1-2)th display region DA1_2. The contact line CL extending to the first region DA1_2*a* of the (1-2)th display region DA1_2 may be connected to a data line DL connected to the first pixels PXL1 disposed in the (1-2)th display region DA1_2 through a twelfth contact hole CH12. In addition, although not shown in the drawing, the contact line CL extending to the first display region DA1 may be bent along the first direction DR1 to extend to the fourth display region DA4. The contact line CL extending to the fourth display region DA4 may be connected to a data line DL connected to the fourth pixels PXL4 disposed in the fourth display region DA4 through a contact hole.

In the display device according to the exemplary embodiment of the invention, the contact line CL may be used as a fan-out line that supplies the data signal to each of the some first pixels PXL1 and the fourth pixels PXL4. Accordingly, the second fan-out line (refer to SFOL of FIG. 6A) connected to the first pixels PXL1 disposed in the (1-2)th display region DA1_2 and the first fan-out line (refer to FFOL of FIG. 6A) connected to the fourth pixels PXL4 disposed in the fourth display region DA4 may be removed in the non-display region NDA. Consequently, in the display device according to the exemplary embodiment of the invention, the area occupied by the first and second fan-out lines FFOL and SFOL in the non-display region NDA is decreased, so that the area of dead spaces in the non-display region NDA may be minimized.

Figure 13B:
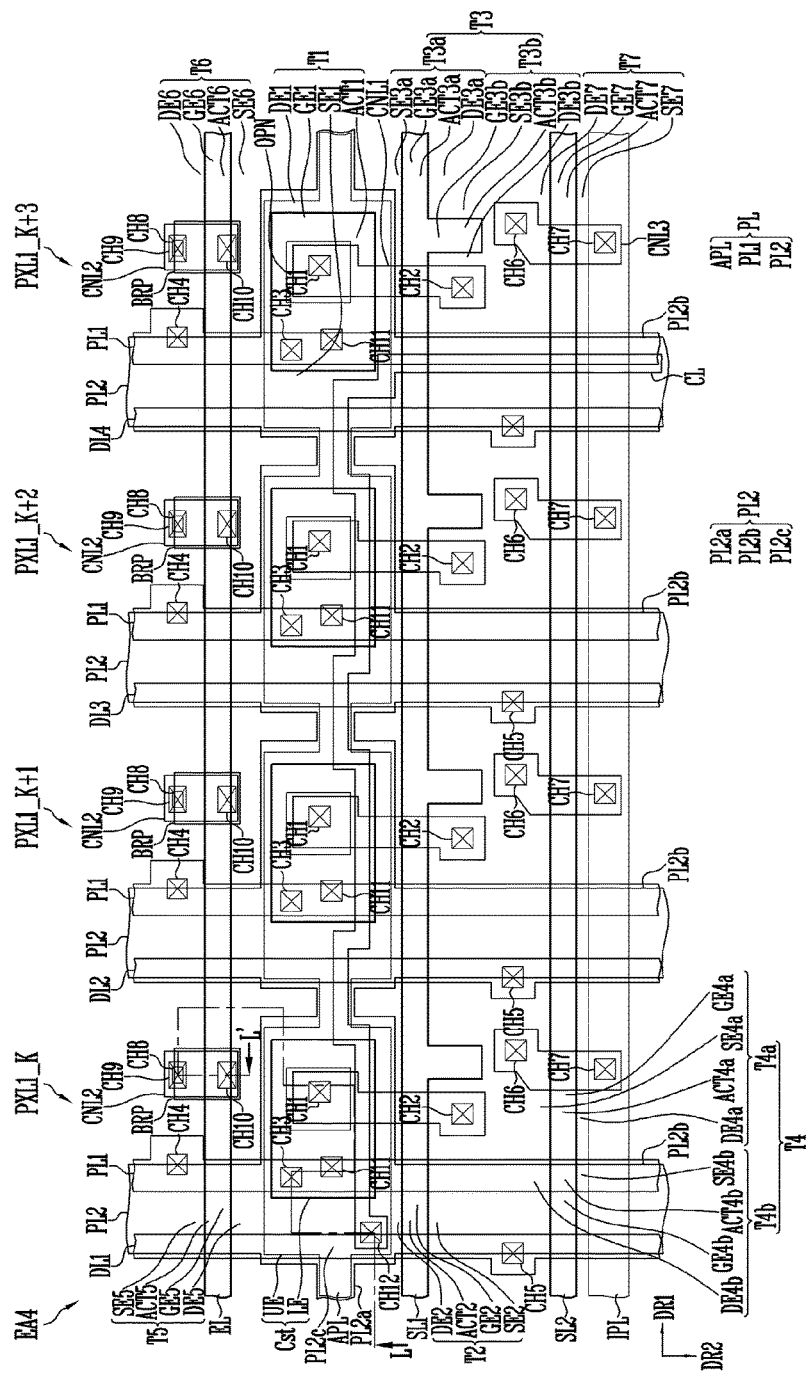
FIG. 13B is an enlarged plan view of portion EA4 of FIG. 13A.
Figure 13C:
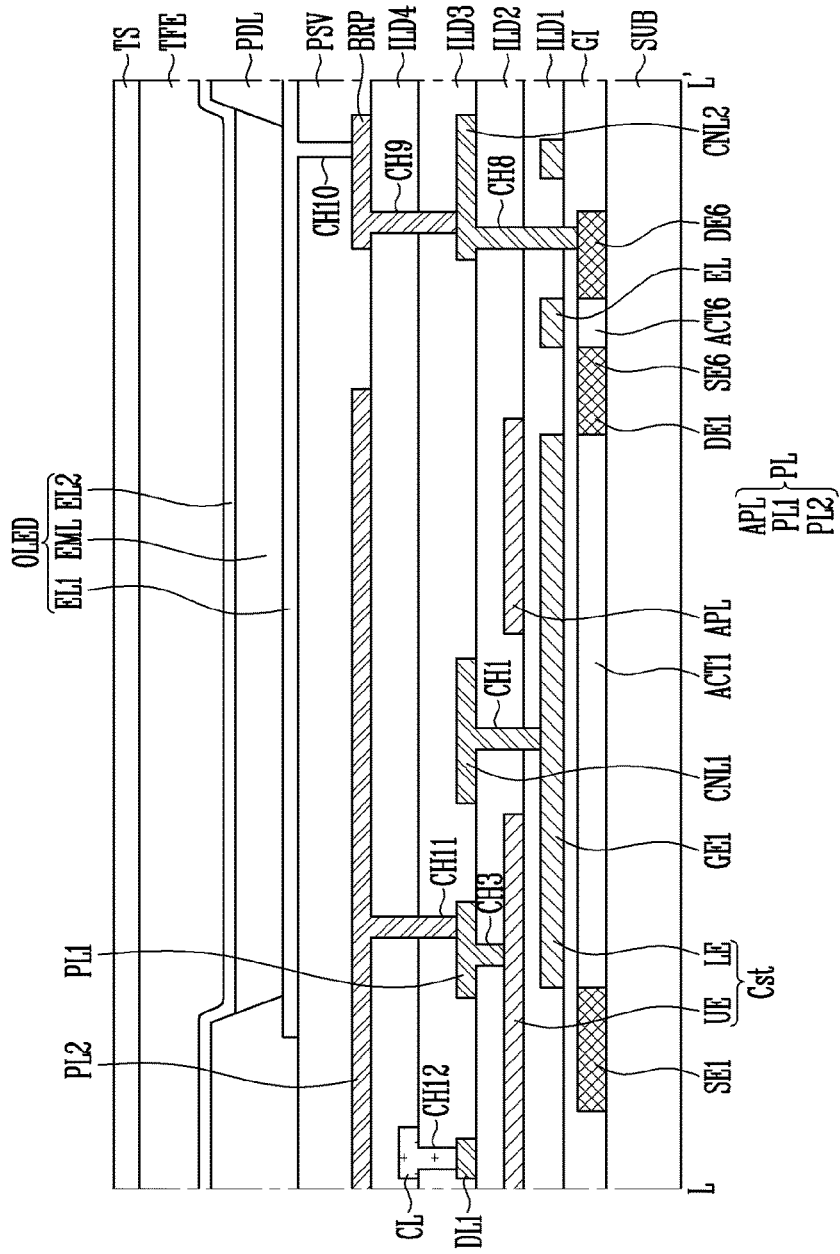
FIG. 13C is a cross-sectional view taken along line L-L' of FIG. 13B.

FIG. 13B is an enlarged plan view of portion EA4 of FIG. 13A, and FIG. 13C is a cross-sectional view taken along line L-L' of FIG. 13B. In FIGS. 13B and 13C, portions different from those of the above-described embodiment will be mainly described to avoid redundancy. Portions not particularly described in the exemplary embodiment of the invention follow those of the above-described embodiment. In addition, identical reference numerals refer to identical components, and similar reference numerals refer to similar components.

For convenience of description, based on four first pixels PXL1_K, PXL1_K+1, PXL1_K+2, and PXL1_K+3 disposed in the (1-2)th display region DA1_2, two scan lines SL1 and SL2, one emission control line EL, four data lines DL1, DL2, DL3, and DL4, and a power line PL, which are connected to the four first pixels PXL1_K, PXL1_K+1, PXL1_K+2, and PXL1_K+3, are illustrated in FIGS. 13B and 13C.

In FIGS. 13B and 13C, for convenience of description, in lines provided to the four first pixels PXL1_K, PXL1_K+1, PXL1_K+2, and PXL1_K+3, among the two scan lines to which a scan signal is applied, a scan line on an (i−1)th row is designated as an "(i−1)th scan line SL2," and a scan line on the ith row is designated as an "ith scan line SL1." In addition, an emission control line on an ith row, to which an emission control signal is applied, is designated as an "emission control line EL," a data line on a jth column, to which a data signal is applied, is designated as a "first data line DL1," a data line on a (j+1)th column, to which a data signal is applied, is designated as a "second data line DL2," a data line on a (j+2)th column, to which a data signal is applied, is designated as a "third data line DL3," a data line on a (j+3)th column, to which a data signal is applied, is designated as a "fourth data line DL4." A power line that is connected to the four first pixels PXL1_K, PXL1_K+1, PXL1_K+2, and PXL1_K+3 and has a first power voltage ELVDD applied thereto is designated as a "power line PL," and an initialization power line to which an initialization power source Vint is applied is designated as an "initialization power line IPL."

Referring to FIGS. 13A, 13B, and 13C, the display device according to the exemplary embodiment of the invention may include a substrate SUB including a first display region DA1, a second display region DA2, a third display region DA3, a fourth display region DA4, a fifth display region DA5 and a non-display region NDA, a line unit, and four first pixels PXL1_K, PXL1_K+1, PXL1_K+2, and PXL1_K+3.

The line unit may include scan lines SL1 and SL2, data lines DL1, DL2, DL3, and DL4, an emission control line EL, a power line PL, and an initialization power line PL, which supply signals to each of the four first pixels PXL1_K, PXL1_K+1, PXL1_K+2, and PXL1_K+3.

The scan lines SL1 and SL2 may extend in a first direction DR1 on the substrate SUB. The scan lines SL1 and SL2 may include an ith scan line SL1 and an (i−1)th scan line SL2, which are sequentially arranged along a second direction DR2 intersecting the first direction DR1. A scan signal may be applied to the scan lines SL1 and SL2.

The emission control line EL may extend in the first direction DR1 and be disposed to be spaced apart from the ith scan line SL1. An emission control signal may be applied to the emission control line EL.

The data lines DL1, DL2, DL3, and DL4 may extend in the second direction DR2 on the substrate SUB. The data lines DL1, DL2, DL3, and DL4 may include first to fourth data lines DL1 to DL4. A data signal may be applied to each of the first to fourth data lines DL1 to DL4.

The power line PL may extend in the first direction DR1 and extend in the second direction DR2. The power line PL may be provided to each of the four first pixels PXL1_K, PXL1_K+1, PXL1_K+2, and PXL1_K+3. The first power voltage (refer to ELVDD of FIG. 3) may be applied to the power line PL. The power line PL may include an additional power line APL, a first power line PL1, and a second power line PL2.

The additional power line APL may extend along the first direction DR1, the first power line PL1 may extend along the second direction DR2, and the second power line PL2 may extend along the first and second directions DR1 and DR2. In a plan view, the additional power line APL, the first power line PL1, and the second power line PL2 may overlap with each other. The additional power line APL and the first and second power lines PL1 and PL2 may be electrically connected to each other. Therefore, the first power voltage ELVDD may be applied to each of the additional power line APL and the first and second power lines PL1 and PL2.

In a plan view, the second power line PL2 may include a first part PL2a that extends along the first direction DR1 and overlaps with the additional power line APL and a second part PL2b that extends along the second direction DR2 and overlaps with the first power line PL1. In addition, the PL2 may include a third part PL2c in which the first part PL2a and the second part PL2b overlap. The first part PL2a, the second part PL2b, and the third part PL2c may be provided integrally. In an exemplary embodiment of the invention, the first part PL2a may be provided in common to four first pixels PXL1_K, PXL1_K+1, PXL1_K+2, and PXL1_K+3. Due to a structural characteristic of the second power line PL2 including the first part PL2a, the second part PL2b, and the third part PL2c, the second power line PL2 may be provided in a mesh form on the substrate SUB. The first power voltage ELVDD is applied to the second power line PL2 disposed in the mesh form on the substrate SUB. Thus, the first power voltage ELVDD may be uniformly applied to the four first pixels PXL1_K, PXL1_K+1, PXL1_K+2, and PXL1_K+3. Accordingly, a uniform luminance may be realized through all of the display regions (refer to DA1 to DA5 of FIG. 5).

The initialization power line IPL may extend along the first direction DR1, and the initialization power source (refer to Vint of FIG. 3) may be applied to the initialization power line IPL.

The four first pixels PXL1_K, PXL1_K+1, PXL1_K+2, and PXL1_K+3 may include a Kth first pixel PXL1_K connected to the ith scan line SL1 and the first data line DL1, a (K+1)th first pixel PXL1_K+1 connected to the ith scan line SL1 and the second data line DL2, a (K+2)th first pixel PXL1_K+2 connected to the ith scan line SL1 and the third data line DL3, and a (K+3)th first pixel PXL1_K+3 connected to the ith scan line SL1 and the fourth data line DL4.

Each of the four first pixels PXL1_K, PXL1_K+1, PXL1_K+2, and PXL1_K+3 may include first to seventh transistors T1 to T7, a storage capacitor Cst, and a light emitting element OLED.

The first transistor T1 may include a first gate electrode GE1, a first active pattern ACT1, a first source electrode SE1, a first drain electrode DE1, and a first contact part CNL1.

The second transistor T2 may include a second gate electrode GE2, a second active pattern ACT2, a second source electrode SE2, and a second drain electrode DE2.

The third transistor T3 may include a third gate electrode GE3, a third active pattern ACT3, a third source electrode SE3, and a third drain electrode DE3. The third transistor T3 may be provided in a double gate structure so as to prevent a leakage current.

The fourth transistor T4 may include a fourth gate electrode GE4, a fourth active pattern ACT4, a fourth source electrode SE4, and a fourth drain electrode DE4. The fourth transistor T4 may be provided in a double gate structure so as to prevent a leakage current.

The fifth transistor T5 may include a fifth gate electrode GE5, a fifth active pattern ACT5, a fifth source electrode SE5, and a fifth drain electrode DE5.

The sixth transistor T6 may include a sixth gate electrode GE6, a sixth active pattern ACT6, a sixth source electrode SE6, and a sixth drain electrode DE6.

The seventh transistor T7 may include a seventh gate electrode GE7, a seventh active pattern ACT7, a seventh source electrode SE7, and a seventh drain electrode DE7.

The storage capacitor Cst may include a lower electrode LE and an upper electrode UE. The lower electrode LE may be configured with the first gate electrode GE1 of the first transistor T1. In an exemplary embodiment of the invention, the upper electrode UE may be unitary with the additional power line APL of the power line PL. That is, the upper electrode UE may be the additional power line APL.

The light emitting element OLED may include a first electrode EL1 a second electrode EL2, and an emitting layer EML provided between the two electrodes EL1 and EL2.

In an exemplary embodiment of the invention, a contact line CL may be provided in the (K+3)th first pixel PXL1_K+3. The contact line CL may overlap with the second power line PL2 provided in the (K+3)th first pixel PXL1_K+3. In particular, the contact line CL may extend along the second direction DR2 in the (K+3)th first pixel PXL1_K+3 and be bent in the first direction DR1. In a plan view, the contact line CL may overlap with the second part PL2b of the second power line PL2 provided in the (K+3)th first pixel PXL1_K+3.

The contact line CL may extend from the non-display region NDA to the third display region DA3 along the second direction DR2. Also, the contact line CL may extend from the third display region DA3 to the (1-2)th display region DA1_2 and the (1-1)th display region DA1_1 along the second direction DR2. The contact line CL extending to the (1-2)th display region DA1_2 may be bent along the first direction DR1 to the first region DA1_2a of the (1-2)th display region DA1_2. Also, the contact line CL extending to the (1-1)th display region DA1_1 may be bent along the first direction DR1 to extend to the fourth display region DA4.

The contact line CL may be a fan-out line connected to a data driver (refer to DDV of FIG. 1) to supply a data signal from the data driver DDV to pixels PXL disposed in each of the first region DA1_2a of the (1-2)th display region DA1_2 and the fourth display region DA4. The contact line CL, as shown in FIG. 13B, may be bent toward the Kth first pixel PXL1_K in the (K+3)th first pixel PXL1_K+3, and be connected to the first data line DL through a twelfth contact hole CH12. Therefore, a data signal from the data driver DDV may be applied to the first data line DL1 of the first pixel PXL through the contact line CL.

Hereinafter, a structure of the display device according to the exemplary embodiment of the invention will be described along a stacking order with reference to FIG. 13C.

The first to seventh active patterns ACT1 to ACT7 may be disposed on the substrate SUB. The first to seventh active patterns ACT1 to ACT7 may include a semiconductor material.

A gate insulating layer GI may be disposed on the substrate SUB on which the first to seventh active patterns ACT1 to ACT7 are provided.

The ith scan line SL1, the (i–1)th scan line SL2, the emission control line EL, the first to seventh gate electrodes GE1 to GE7, and the lower electrode LE may be disposed on the gate insulating layer GI. The first gate electrode GE1 and the lower electrode LE may be unitary.

A first inter-insulating layer ILD1 may be disposed on the substrate SUB on which the scan lines SL1 and SL2 and the like are disposed.

The upper electrode UE, the initialization power line IPL, and the additional power line APL may be disposed on the first inter-insulating layer ILD1. The upper electrode UE and the additional power line APL may be unitary.

A second inter-insulating layer ILD2 may be disposed on the substrate SUB on which the additional power line APL and the like are disposed.

The first to fourth data lines DL1, DL2, DL3, and DL4, the first power line PL1, the first contact part CNL1, and second and third contact parts CNL2 and CNL3 may be disposed on the second inter-insulating layer ILD2.

The first power line PL1 may be connected to the additional power line APL through a third contact hole CH3 passing through the second inter-insulating layer ILD2. Also, the first power line PL1 may be connected to the fifth source electrode SE5 through a fourth contact hole CH4 sequentially passing through the gate insulating layer GI and the first and second inter-insulating layers ILD1 and ILD2.

A third inter-insulating layer ILD3 may be disposed on the substrate SUB on which the data line DL1 and the like are disposed. The third inter-insulating layer ILD3 may be provided in a single layer as shown in the drawing, but the invention is not limited thereto. In an exemplary embodiment, the third inter-insulating layer ILD3 may be provided in a multi-layer in which a plurality of organic insulating layers and a plurality of inorganic insulating layers are stacked, for example.

The contact line CL may be disposed on the third inter-insulating layer ILD3. The contact line CL may be connected to the first data line DL1 of the Kth first pixel PXL1_K through the twelfth contact hole CH12 passing through the third inter-insulating layer ILD3.

A fourth inter-insulating layer ILD4 may be disposed on the substrate SUB on which the contact line CL is disposed.

A bridge pattern BRP and the second power line PL2 may be disposed on the fourth inter-insulating layer ILD4.

The bridge pattern BRP may be connected to the second contact part CNL2 through a ninth contact hole CH9 sequentially passing through the third and fourth inter-insulating layers ILD3 and ILD4.

The second power line PL2 may be connected to the first power line PL1 through an eleventh contact hole CH11 sequentially passing through the third and fourth inter-insulating layers ILD3 and ILD4.

A protective layer PSV may be disposed on the substrate SUB on which the bridge pattern BRP and the like are disposed.

The first electrode EL1 may be disposed on the protective layer PSV. The first electrode EL1 may be connected to the bridge pattern BRP through a tenth contact hole CH10 passing through the protective layer PSV.

A pixel defining layer PDL that defines a light emitting region to correspond to each of the first to fourth pixels PXL1, PXL2, PXL3, and PXL4 may be disposed on the substrate SUB on which the first electrode EL1 is disposed.

The emitting layer EML may be disposed on the first electrode EL1 surrounded by the pixel defining layer PDL, and the second electrode EL2 may be disposed on the emitting layer EML.

A thin film encapsulation layer TFE that covers the second electrode EL2 may be provided over the second electrode EL2.

A touch sensor TS that recognizes a touch event input to the display device through a finger of a user or a separate input means may be disposed on the thin film encapsulation layer TFE.

Figure 14A:
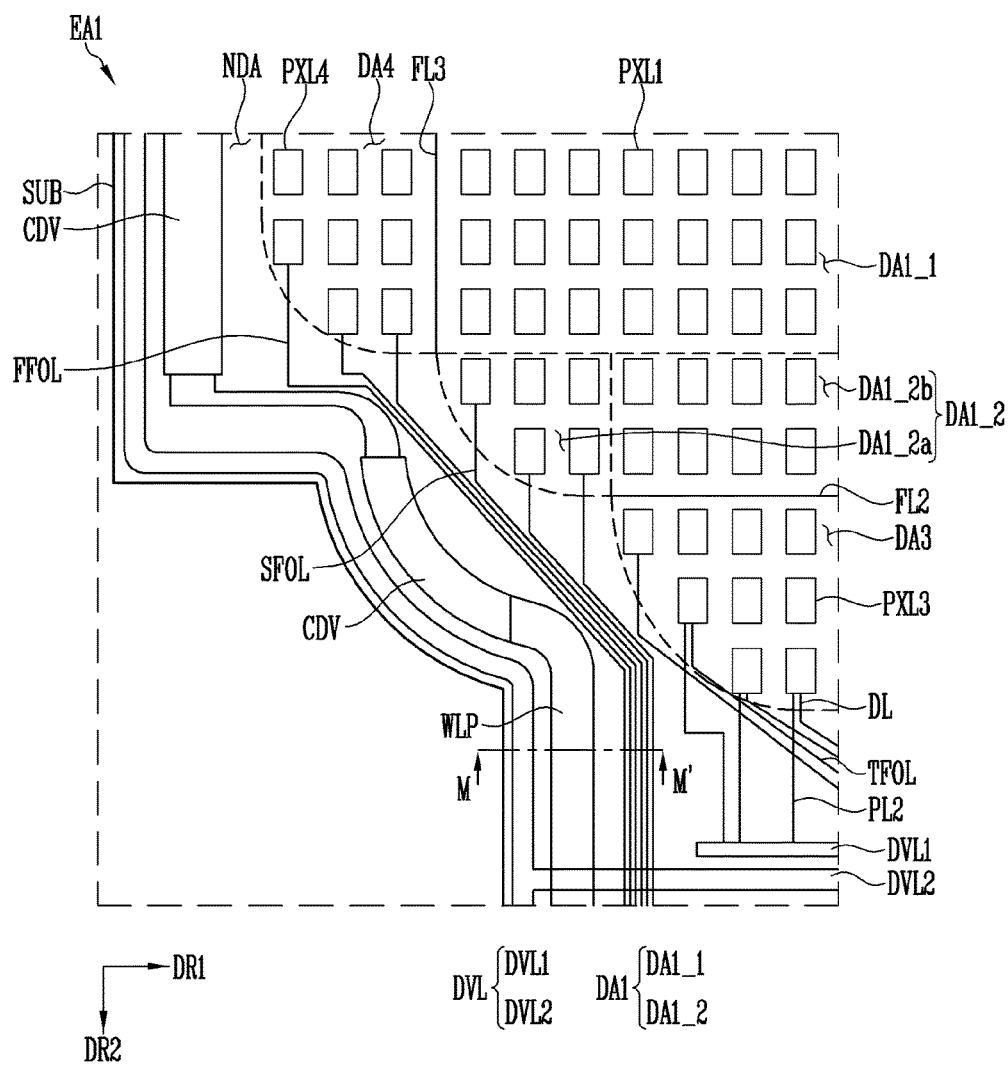
FIG. 14A illustrates an exemplary embodiment of a portion of a display device according to the invention, which is a plan view corresponding to the portion EA1 of FIG. 1.
Figure 14B:
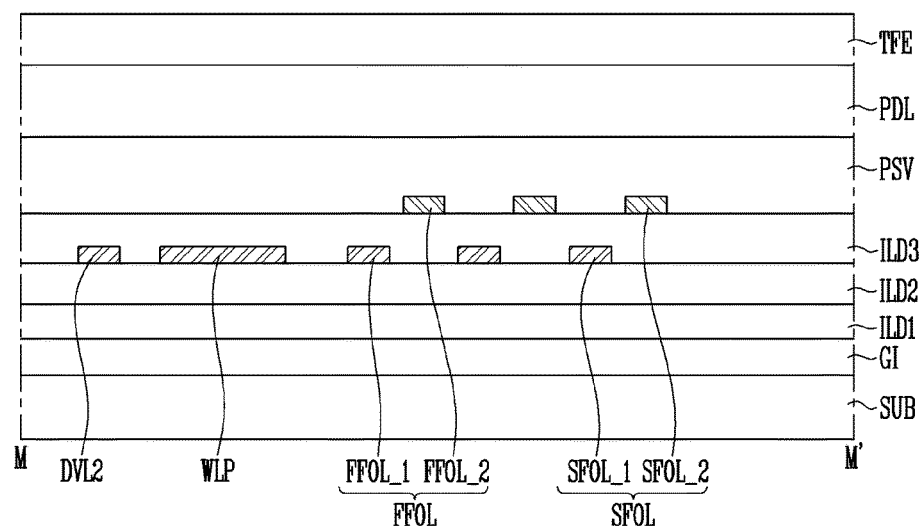
FIG. 14B is a cross-sectional view taken along line M-M' of FIG. 14A.

FIG. 14A illustrates a portion of a display device according to an exemplary embodiment of the invention, which is a plan view corresponding to the portion EA1 of FIG. 1, and FIG. 14B is a cross-sectional view taken along line M-M' of FIG. 14A. In FIGS. 14A and 14B, portions different from those of the above-described embodiment will be mainly described to avoid redundancy. Portions not particularly described in the exemplary embodiment of the invention follow those of the above-described embodiment. In addition, identical reference numerals refer to identical components, and similar reference numerals refer to similar components.

Referring to FIGS. 1 to 5, 14A, and 14B, the display device according to the exemplary embodiment of the invention may include a substrate SUB including a first display region DA1, a second display region DA2, a third display region DA3, a fourth display region DA4, a fifth display region DA5 and a non-display region NDA, a plurality of pixels PXL disposed on the substrate SUB, and a line unit connected to the pixels PXL.

The pixels PXL may include first pixels PXL1 arranged in the first display region DA1, second pixels PXL2 arranged in the second display region DA2, third pixels PXL3 arranged in the third display region DA3, fourth pixels PXL4 arranged in the fourth display region DA4, and fifth pixels PXL5 arranged in the fifth display region DA5.

The first display region DA1 may include a (1-1)th display region DA1_1 and a (1-2)th display region DA1_2. The (1-2)th display region DA1_2 may include a first region DA1_2a including a curved line connecting two adjacent linear sides and a second region DA1_2b except the first region DA1_2a. The first region DA1_2a may be a corner portion of the (1-2)th display region DA1_2. The first region DA1_2a of the (1-2)th display region DA1_2 may have a round shape of which a width decreases as it becomes farther from the (1-1)th display region DA1_1 in a second direction DR2. Accordingly, in the (1-2)th display region DA1_2, the number of first pixels PXL1 provided on each pixel row may decrease as they become farther from the (1-1)th display region DA1_1.

Therefore, the number of first pixels PXL1 provided on each pixel row in the (1-2)th display region DA1_2 may decrease as they become farther from the (1-1)th display region DA1_1. Here, it is unnecessary that the length of the pixel rows of the (1-2)th display region DA1_2 decrease at the same rate (or the numbers of first pixels PXL1 arranged on the pixel rows decrease at the same rate) as they become farther from the (1-1)th display region DA1_1. The number of first pixels PXL1 arranged on each pixel row of the (1-2)th display region DA1_2 may be variously changed.

The third display region DA3 is a display region that is foldable toward the outside of the first display region DA1 along a second folding line FL2, and may have a corner portion including a round shape of a which width decreases as it becomes farther from the first display region DA1. Therefore, the number of third pixels PXL3 provided on each pixel row in the third display region DA3 may decrease as they become farther from the first display region DA1. Here, the number of third pixels PXL3 arranged on each pixel row in the third display region DA3 may be variously changed.

The fourth display region DA4 is a display region that is foldable toward the outside of the first display region DA1 along a third folding line FL3, and may have a corner portion including a round shape of a which width decreases as it becomes farther from the first display region DA1. Therefore, the number of fourth pixels PXL4 provided on each pixel row in the fourth display region DA4 may decrease as they become farther from the first display region DA1. Here, the number of fourth pixels PXL4 arranged on each pixel row in the fourth display region DA4 may be variously changed.

For convenience of description, only one side portion of the substrate SUB is illustrated in FIG. 14A, but the other side portion may be provided in the substantially same manner such that the shape of the substrate SUB is bilaterally symmetrical. Therefore, the second display region DA2 may also have a corner portion including a round shape of which a width decreases as it becomes farther from the first display region DA1, and the fifth display region DA5 may also have a corner portion including a round shape of which a width decreases as it becomes farther from the first display region DA1.

As described above, when each of the first display region DA1, the second display region DA2, the third display region DA3, the fourth display region DA4, and the fifth display region DA5 have the corner portion including the round shape, differences between loads generated in the respective display regions may be minimized. Accordingly, the display device according to the exemplary embodiment of the invention may realize a uniform luminance throughout all of the display regions.

First and second driving voltage lines DVL1 and DVL2, a driving unit including a circuit driver CDV and a signal line unit WLP, and a fan-out line unit may be disposed in the non-display region NDA.

The first driving voltage line DVL1 may apply a first power voltage ELVDD to each pixel PXL, and the second driving voltage line DVL2 may apply a second power voltage ELVSS to each pixel PXL.

The first driving voltage line DVL1 is disposed to correspond to an outside of the third display region DA3, and may be electrically connected to the third pixels PXL3 through a second power line PL2. Therefore, the first power voltage ELVDD from the first driving voltage line DVL1 may be applied to the third pixels PXL3 through the second power line PL2.

In a plan view, the second driving voltage line DVL2 may be disposed to surround the first display region DA1, the second display region DA2, the third display region DA3, the fourth display region DA4, and the fifth display region DA5 at the outermost portion of the non-display region NDA.

The fan-out line unit may include first to third fan-out lines FFOL, SFOL, and TFOL. The first fan-out line FFOL, the second fan-out line SFOL, and the third fan-out line TFOL may be disposed on the substrate SUB to be spaced apart from each other at a certain distance.

In an exemplary embodiment of the invention, the first fan-out line FFOL may include a (1-1)th fan-out line FFOL_1 and a (1-2)th fan-out line FFOL_2, which are alternately disposed on the substrate SUB. The second fan-out line SFOL may include a (2-1)th fan-out line SFOL_1 and a (2-2)th fan-out line SFOL_2, which are alternately disposed on the substrate SUB.

The (1-1)th fan-out line FFOL_1 and the (2-1)th fan-out line SFOL_1 may be provided in the same layer. The (1-2)th fan-out line FFOL_2 and the (2-2)th fan-out line SFOL_2 may be provided in the same layer. That is, the first and second fan-out lines FFOL and SFOL may be provided in the same layer.

Hereinafter, a structure of the non-display region NDA in the display device according to the exemplary embodiment of the invention will be described along a stacking order with reference to FIGS. 14A and 14B.

A gate insulating layer GI may be disposed on the substrate SUB.

First and second inter-insulating layers ILD1 and ILD2 may be sequentially disposed on the gate insulating layer GI.

The second driving voltage line DVL2, the signal line unit WLP, the (1-1)th fan-out line FFOL_1, and the (2-1)th fan-out line SFOL_1 may be disposed on the second inter-insulating layer ILD2. The (1-1)th fan-out line FFOL_1 and the (2-1)th fan-out line SFOL_1 may be disposed on the second inter-insulating layer ILD2 to be spaced apart from each other at a certain distance.

A third inter-insulating layer ILD3 may be disposed on the substrate SUB on which the (1-1)th fan-out line FFOL_1 and the like are disposed. As shown in the drawings, the third inter-insulating layer ILD3 may be provided in a single layer. However, the invention is not limited thereto, and the third inter-insulating layer ILD3 may be provided in a multi-layer.

The (1-2)th fan-out line FFOL_2 and the (2-2)th fan-out line SFOL_2 may be disposed on the third inter-insulating layer ILD3. The (1-2)th fan-out line FFOL_2 and the (2-2)th fan-out line SFOL_2 may be disposed on the third inter-insulating layer ILD3 to be spaced apart from each other at a certain distance.

A protective layer PSV, a pixel defining layer PDL, and a thin film encapsulation layer TFE may be sequentially disposed on the substrate SUB on which the (1-2)th fan-out line FFOL_2 and the (2-2)th fan-out line SFOL_2 are disposed.

Figure 14C:
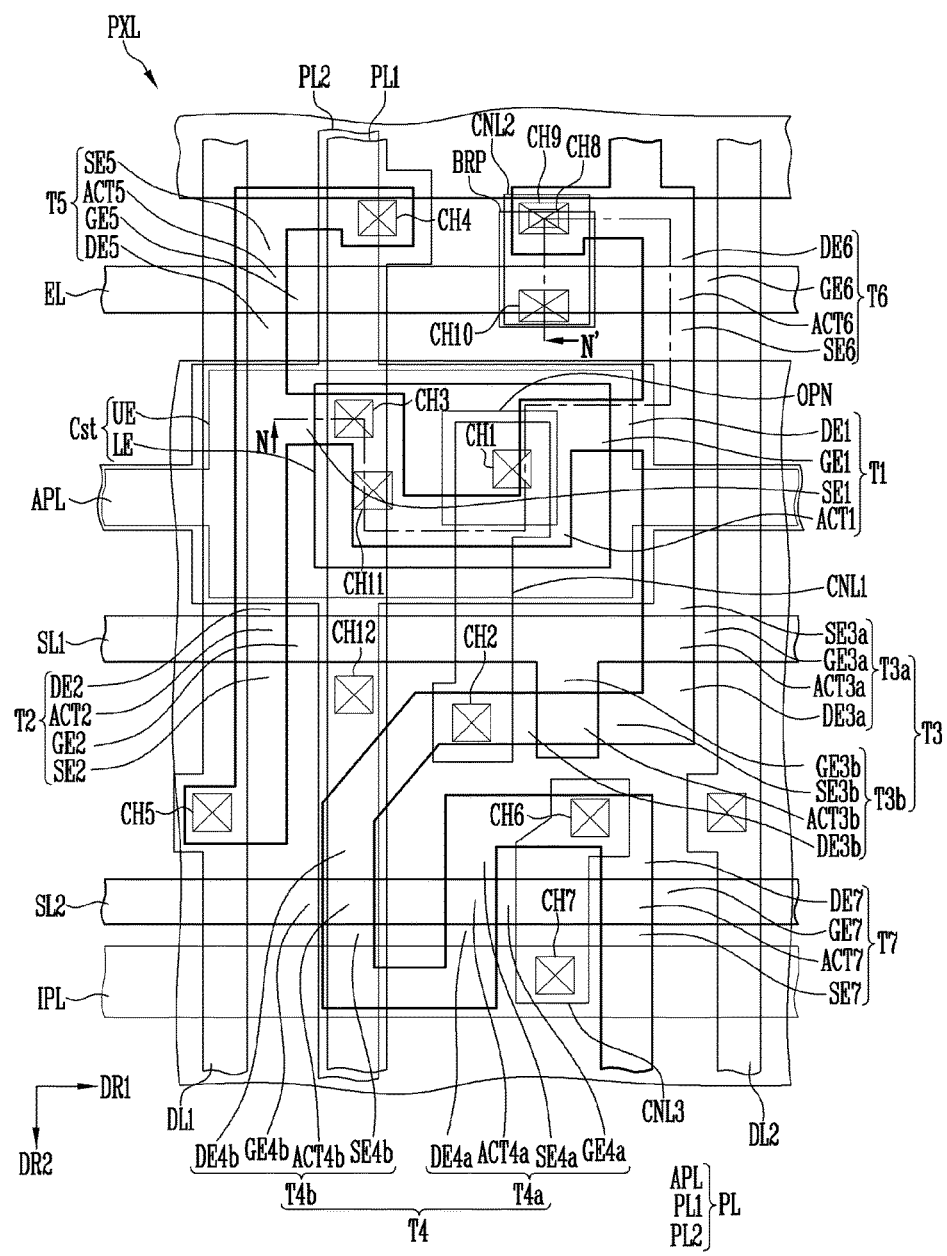
FIG. 14C is a plan view illustrating one pixel of FIG. 14A.
Figure 14D:
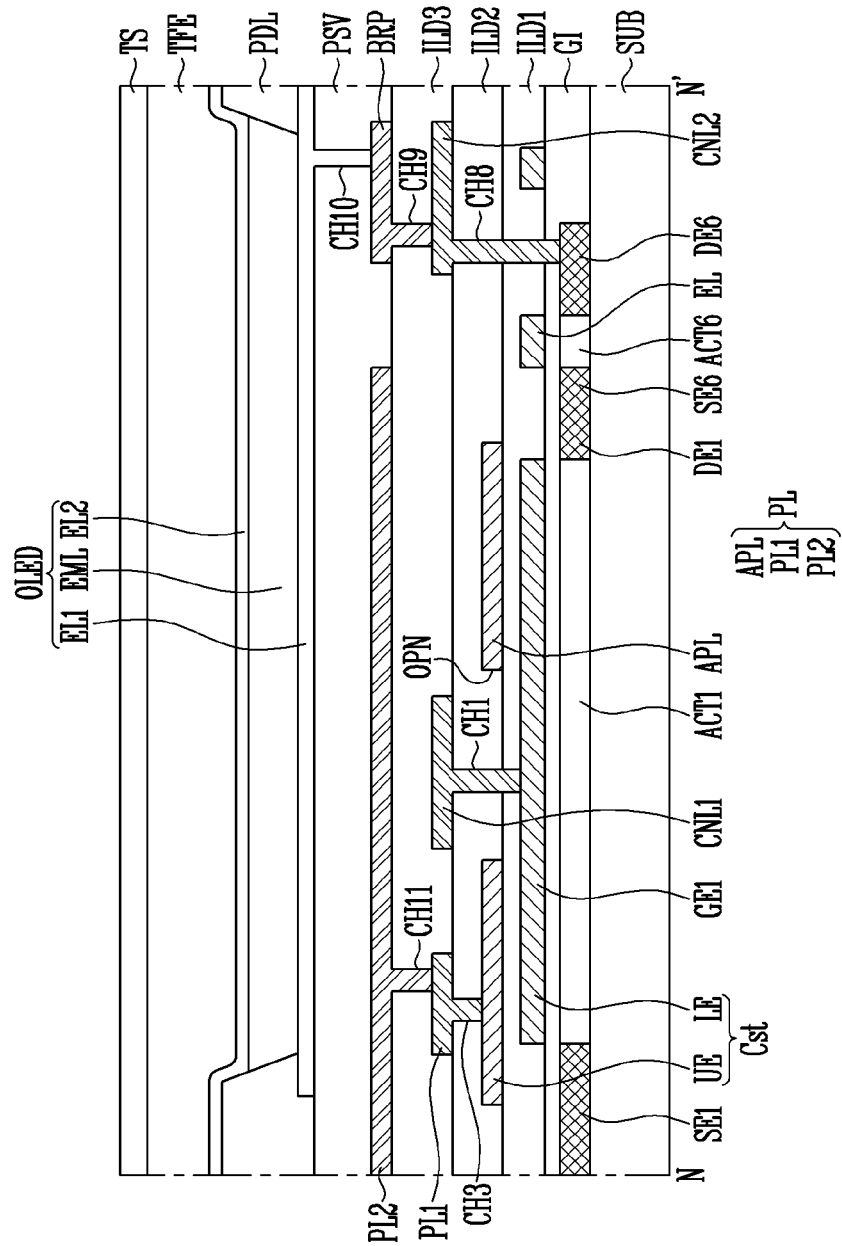
FIG. 14D is a cross-sectional view taken along line N-N' of FIG. 14C.

FIG. 14C is a plan view illustrating one pixel of FIG. 14A, and FIG. 14D is a cross-sectional view taken along line N-N' of FIG. 14C. In FIGS. 14C and 14D, portions different from those of the above-described embodiment will be mainly described to avoid redundancy. Portions not particularly described in the exemplary embodiment of the invention follow those of the above-described embodiment. In addition, identical reference numerals refer to identical components, and similar reference numerals refer to similar components.

Referring to FIGS. 14A, 14C, and 14D, the display device according to the exemplary embodiment of the invention may include a substrate SUB including a first display region DA1, a second display region DA2, a third display region DA3, a fourth display region DA4, a fifth display region DA5 and a non-display region NDA, a line unit, and one pixel PXL.

The pixel PXL may include first to seventh transistors T1 to T7, a storage capacitor Cst, and a light emitting element OLED.

The line unit may include an ith scan line SL1, an (i−1)th scan line SL2, a data line DL1, an emission control line EL, a power line PL, and an initialization power line IPL, which supply signals to the pixel PXL.

A first power voltage (refer to ELVDD of FIG. 3) may be applied to the power line PL. The power line PL may include an additional power line APL, a first power line PL1, and a second power line PL2.

In a plan view, the additional power line APL, the first power line PL1, and the second power line PL2 may overlap with each other. Also, the additional power line APL and the first and second power lines PL1 and PL2 may be provided in layers different from one another. In an exemplary embodiment, the second power line PL2 may be disposed on the first power line PL1 with a third inter-insulating layer ILD3 interposed therebetween, and the first power line PL1 may be disposed on the additional power line APL with a second inter-insulating layer ILD2 interposed therebetween.

The additional power line APL and the first power line PL1 may be connected to each other through a third contact hole CH3 passing through the second inter-insulating layer ILD2, and the first power line PL1 and the second power line PL2 may be connected to each other through an eleventh contact hole CH11 passing through the third inter-insulating layer ILD3. Consequently, the additional power line APL and the first and second power lines PL1 and PL2 may be connected to each other. As the first power voltage ELVDD is applied to the first power line PL1, the first power voltage ELVDD may also be applied to the additional power line APL and the second power line PL2.

The additional power line APL may extend along the first direction DR1, and the first power line PL1 may extend along the second direction DR2. The additional power line APL may be provided in common to pixels (not shown) adjacent to the pixel PXL along the first direction DR1. The first power line PL1 may provided in common to pixels (not shown) adjacent to the pixel PXL along the second direction DR2. The additional power line APL commonly provided to the plurality of pixels arranged in the first direction DR1 and the first power line PL1 commonly provided to the plurality of pixel arranged in the second direction DR2 may intersect on the substrate SUB. Therefore, the additional power line APL and the first power line PL1 may be provided in a mesh form on the substrate SUB. The second power line PL2 may be provided in a plate shape, and cover the additional power line APL and the first power line PL1.

Consequently, the first power voltage ELVDD may be uniformly applied to the first display region DA1, the second display region DA2, the third display region DA3, the fourth display region DA4, and the fifth display region DA5 due to a structural characteristic of the power line PL including the additional power line APL, the first power line PL1, and the second power line PL2. Accordingly, the display device according to the exemplary embodiment of the invention may realize a uniform luminance throughout all of the display regions.

In an exemplary embodiment of the invention, it is illustrated that the second power line PL2 is provided in the plate shape that partially covers each pixel PXL except a bridge pattern BRP, but the invention is not limited thereto. In an exemplary embodiment, the second power line PL2 may be provided in various shapes within a range where the second power line PL2 is electrically insulated from the bridge pattern BRP, for example.

In an exemplary embodiment of the invention, the second power line PL2 may be used as a shielding means for shielding parasitic capacitance generated between two lines disposed adjacent to each other, to which different voltages are applied. In an exemplary embodiment, the second power line PL2 may shield parasitic capacitance generated between the first electrode EL1 of the light emitting element OLED and components to which a data signal is applied. In particular, as the area of the second power line PL2 increase due to the plate shape of the second power line PL2, the parasitic capacitance may be completely shielded. Consequently, the display device is not influenced by the parasitic capacitance, so that improved image quality may be realized.

The display device according to the exemplary embodiment of the invention may be employed in various electronic devices. In an exemplary embodiment, the display device is applicable to televisions, notebook computers, cellular phones, smart phones, smart pads, portable media players ("PMPs"), personal digital assistants ("PDAs"), navigations, various wearable devices such as smart watches, and the like.

As described above, according to the invention, the display device may minimize the area of the non-display region and improve image quality.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other exemplary embodiments unless otherwise specifically indicated. Accordingly, it will be understood by those of skill in the art that various changes in form and details may be made without departing from the spirit and scope of the invention as set forth in the following claims.

What is claimed is:
1. A display device comprising:
 a substrate including:
  a first display region;
  a second display region extended from a first side of the first display region, the second display region having an area smaller than that of the first display region;
  a third display region extended from a second side of the first display region, the third display region having an area smaller than that of the first display region; and
  a non-display region;
 a plurality of pixels provided in the first to third display regions;
 a power line which is connected to each of the plurality of pixels and applies a first power voltage to the plurality of pixels; and
 a fan-out line which is provided in the non-display region and applies a data signal to the plurality of pixels,
 wherein the power line includes an additional power line extending in a first direction, a first power line extending in a second direction intersecting the first direction, the first power line being disposed on the additional power line with a first insulating layer interposed therebetween, and a second power line disposed on the first power line with a second insulating layer interposed therebetween.

2. The display device of claim 1, wherein the additional power line and the first and second power lines are electrically connected to each other.

3. The display device of claim 2, wherein, in a plan view, the second power line includes a first part overlapping with the additional power line and a second part overlapping with the first power line.

4. The display device of claim 3, wherein the second power line further includes a third part in which the first part and the second part overlap.

5. The display device of claim 1, wherein the first display region includes:
a (1-1)th display region; and
a (1-2)th display region which is disposed between the (1-1)th display region and the third display region, and including:
a first region provided with pixels of the plurality of pixels arranged on the same pixel column as pixels of the (1-1)th display region; and
a second region provided with pixels of the plurality of pixels arranged on the same pixel column as the pixels of the plurality of pixels in the (1-1)th display region and the third display region, except the first region.

6. The display device of claim 5, wherein the first region of the (1-2)th display region is a corner portion having a round shape of which a width decreases as farther from the (1-1)th display region along the second direction.

7. The display device of claim 6, wherein the fan-out line includes:
a first fan-out line which applies the data signal to the pixels provided in the second display region;
a second fan-out line which applies the data signal to the pixels provided in the first region of the (1-2)th display region; and
a third fan-out line applying the data signal to the pixels provided in the third display region,
wherein the third fan-out line also applies the data signal to pixels of the first display region, which are disposed on the same pixel column as pixels provided in the third display region.

8. The display device of claim 7, wherein the first fan-out line includes a (1-1)th fan-out line and a (1-2)th fan-out line, which are provided in layers different from each other on the substrate,
wherein the (1-1)th fan-out line and the (1-2)th fan-out line are alternately disposed.

9. The display device of claim 7, wherein, in a plan view, the first to third fan-out lines are spaced apart from each other on the substrate.

10. The display device of claim 7, wherein the first to third fan-out lines are disposed in layers different from one another.

11. The display device of claim 10, wherein the second fan-out line is disposed on the first fan-out line with the first and second insulating layers interposed therebetween.

12. The display device of claim 11, wherein, in a plan view, the first fan-out line and the second fan-out line overlap with each other.

13. The display device of claim 12, further comprising:
a first driving voltage line which is provided in the non-display region and applies the first power source to the power line; and
a second driving voltage line which is provided in the non-display region and applies a second power voltage to each of the plurality of pixels.

14. The display device of claim 13, wherein the first driving voltage line is disposed in the non-display region surrounding one side of the third display region.

15. The display device of claim 13, wherein the first driving voltage line is disposed in the non-display region to surround one side of the second display region, one side of the third display region, and one side of the (1-2)th display region.

16. The display device of claim 15, wherein, in the plan view, the first driving voltage line overlaps with the first fan-out line.

17. The display device of claim 13, wherein the second driving voltage line is provided in a double-layered structure including a first metal layer and a second metal layer disposed on the first metal layer with the second insulating layer interposed therebetween,
wherein, in the plan view, the first metal layer and the second metal layer completely overlap with each other.

18. The display device of claim 13, further comprising a driving unit which is provided between the second driving voltage line and the first fan-out line in the non-display region in the plan view, and provides a driving signal for driving the plurality of pixels,
wherein the driving unit includes a circuit driver and a signal line unit connected to the circuit driver.

19. The display device of claim 18, wherein, in the plan view, a first portion of the first fan-out line overlaps with the second fan-out line, a second portion of the first fan-out line overlaps with the second driving voltage line, and a third portion of the first fan-out line overlaps with the signal line unit.

20. The display device of claim 13, wherein, in the plan view, a first portion of the first fan-out line overlaps with the second fan-out line, and a second portion of the first fan-out line overlaps with the second driving voltage line.

21. The display device of claim 20, wherein the second driving voltage line is disposed on the first fan-out line with the first insulating layer interposed therebetween, and
the second fan-out line is disposed on the second driving voltage line with the second insulating layer interposed therebetween.

22. The display device of claim 21, wherein the second driving voltage line is provided in a single-layered structure.

23. The display device of claim 7, further comprising:
a scan line extending in the first direction and connected to each of the plurality of pixels;
data lines extending in the second direction and connected to each of the plurality pixels; and
a contact line which extends from the non-display region to the first display region and the second region of the (1-2)th display region along the second direction, and is disposed between the first power line and the second power line.

24. The display device of claim 23, wherein the contact line extending to the second region of the (1-2)th display region is bent in the first direction to be electrically connected to a data line of the data lines which corresponds to a pixel of the pixels provided in the first region, and
the contact line extending to the first display region is bent in the first direction to be electrically connected to a data line of the data lines which corresponds to a pixel of the pixels provided in the second display region.

25. The display device of claim 23, wherein the data lines are disposed in the same layer as the third fan-out line.

26. The display device of claim 25, wherein the data lines and the third fan-out line are unitary with and are electrically connected to each other.

27. The display device of claim 7, wherein each of the second and third display regions has a shape of which a width decreases as farther from the first display region along the second direction.

28. The display device of claim 27, wherein the first to third fan-out lines are provided in the same layer.

29. The display device of claim 1, wherein each of the plurality of pixels includes:
   at least one transistor disposed on the substrate; and
   a light emitting element connected to the at least one transistor to emit light.

30. The display device of claim 29, wherein the transistor includes:
   an active pattern disposed on the substrate;
   a gate electrode disposed on the active pattern with a gate insulating layer interposed therebetween; and
   a source electrode and a drain electrode, each connected to the active pattern.

31. The display device of claim 30, wherein the light emitting element includes:
   a first electrode connected to the at least one transistor;
   an emitting layer disposed on the first electrode; and
   a second electrode disposed on the emitting layer.

32. The display device of claim 31, further comprising a bridge pattern disposed between the at least one transistor and the first electrode, the bridge pattern electrically connecting the at least one transistor to the light emitting element,
   wherein the bridge pattern is disposed in the same layer as the second power line.

33. The display device of claim 32, wherein, in a plan view, the second power line does not overlap with the bridge pattern.

34. The display device of claim 33, wherein the second power line has a plate shape.

35. The display device of claim 1, wherein each of the second and third regions is foldable toward the outside of the first display region along a folding line on the substrate.

* * * * *